(12) United States Patent
Ishii et al.

(10) Patent No.: US 7,847,718 B2
(45) Date of Patent: Dec. 7, 2010

(54) DIGITAL-TO-ANALOG CONVERTER, DATA DRIVER AND DISPLAY DEVICE USING SAME

(75) Inventors: Junichiro Ishii, Tokyo (JP); Hiroshi Tsuchi, Tokyo (JP)

(73) Assignee: NEC Corporation, Tokyo (JP)

( * ) Notice: Subject to any disclaimer, the term of this patent is extended or adjusted under 35 U.S.C. 154(b) by 1036 days.

(21) Appl. No.: 11/633,518

(22) Filed: Dec. 5, 2006

(65) Prior Publication Data

US 2007/0126689 A1    Jun. 7, 2007

(30) Foreign Application Priority Data

Dec. 6, 2005    (JP)    ............... 2005-352213

(51) Int. Cl.
   *H03M 1/66*    (2006.01)
(52) U.S. Cl. ............... 341/145; 341/144; 341/154; 341/153
(58) Field of Classification Search ......... 341/144, 341/145, 138, 139, 122, 153, 154
   See application file for complete search history.

(56) References Cited

U.S. PATENT DOCUMENTS

| 6,266,040 | B1 * | 7/2001 | Nagatomo | 345/98 |
| 6,441,763 | B1 | 8/2002 | Nakao | |
| 6,535,189 | B1 * | 3/2003 | Akiyama et al. | 345/87 |
| 6,970,122 | B1 * | 11/2005 | Yilmaz et al. | 341/145 |
| 7,126,518 | B2 | 10/2006 | Tsuchi | |
| 2007/0091052 | A1 | 4/2007 | Tsuchi | |

FOREIGN PATENT DOCUMENTS

| CN | 1612002 (A) | 5/2005 |
| JP | 2002-043944 A | 2/2002 |

OTHER PUBLICATIONS

T. Takeishi, Edited by Hisashi Hara, "Foundations of MOS Integrated Circuits," Ultra LSA Introduction Series 5, p. 164, Figs. 5-39, Kindai Kagakusha, May 30, 2002.

* cited by examiner

*Primary Examiner*—Jean B Jeanglaude
(74) *Attorney, Agent, or Firm*—Foley & Lardner LLP

(57) ABSTRACT

A digital-to-analog converter including includes a decoder which receives m (where m>=4 holds) reference voltages having voltage values that differ from one another, and selects and outputs n (where n>=3 holds) identical or different voltages from among the m reference voltages based upon a digital signal; and an amplifying circuit that outputs a voltage, which is obtained by taking the weighted mean of the selected n voltages at a ratio of $2^{n-1}:2^{n-2}:\ldots:2^0$, from an output terminal.

36 Claims, 46 Drawing Sheets

<TIMING CHART>

<TIMING CHART>

FIG.31

EXAMPLE IN CASE OF n=3, m=4

AMPLIFYING CIRCUIT 13 OUTPUTS $$V_{out} = \frac{4V(T1) + 2V(T2) + V(T3)}{7}$$

WITH REGARD TO VOLTAGES V(T1) TO V(T3) AT $T_1$ TO $T_3$

| level | V(T1) | V(T2) | V(T3) |
|---|---|---|---|
| Vout63 | D | D | D |
| Vout62 | D | D | C |
| Vout61 | D | C | D |
| Vout60 | D | C | C |
| Vout59 | C | D | D |
| Vout58 | C | D | C |
| Vout57 | C | C | D |
| Vout56 | C | C | C |
| Vout55 | D | D | B |
| Vout54 | D | D | A |
| Vout53 | D | C | B |
| Vout52 | D | C | A |
| ⋮ | ⋮ | ⋮ | ⋮ |
| Vout11 | A | B | D |
| Vout10 | A | A | C |
| Vout09 | A | A | D |
| Vout08 | A | B | C |
| Vout07 | B | B | B |
| Vout06 | B | A | A |
| Vout05 | B | A | B |
| Vout04 | B | A | A |
| Vout03 | A | B | B |
| Vout02 | A | B | A |
| Vout01 | A | A | B |
| Vout00 | A | A | A |

REFERENCE VOLTAGES: D, C, B, A

OUTPUT VOLTAGES

FIG.32

EXAMPLE IN CASE OF n=4, m=4

AMPLIFYING CIRCUIT 13 OUTPUTS $$V_{out} = \frac{8V(T1) + 4V(T2) + 2V(T3) + V(T4)}{15}$$

WITH REGARD TO VOLTAGES V(T1) TO V(T4) AT $T_1$ TO $T_4$

| level | V(T1) | V(T2) | V(T3) | V(T4) |
|---|---|---|---|---|
| Vout255 | D | D | D | D |
| Vout254 | D | D | D | C |
| Vout253 | D | D | C | D |
| Vout252 | D | D | C | C |
| Vout251 | D | C | D | D |
| Vout250 | D | C | D | C |
| Vout249 | D | C | C | D |
| Vout248 | D | C | C | C |
| Vout247 | C | D | D | D |
| Vout246 | C | D | D | C |
| Vout245 | C | D | C | D |
| Vout244 | C | D | C | C |
| Vout243 | C | C | D | D |
| Vout242 | C | C | D | C |
| Vout241 | C | C | C | D |
| Vout240 | C | C | C | C |
| Vout239 | D | D | D | B |
| Vout238 | D | D | D | A |
| Vout237 | D | D | C | B |
| Vout236 | D | D | C | A |
| ⋮ | ⋮ | ⋮ | ⋮ | ⋮ |
| Vout019 | A | A | B | D |
| Vout018 | A | A | B | C |
| Vout017 | A | A | A | D |
| Vout016 | A | A | A | C |
| Vout015 | B | B | B | B |
| Vout014 | B | B | B | A |
| Vout013 | B | B | A | B |
| Vout012 | B | B | A | A |
| Vout011 | B | A | B | B |
| Vout010 | B | A | B | A |
| Vout009 | B | A | A | B |
| Vout008 | B | A | A | A |
| Vout007 | A | B | B | B |
| Vout006 | A | B | B | A |
| Vout005 | A | B | A | B |
| Vout004 | A | B | A | A |
| Vout003 | A | A | B | B |
| Vout002 | A | A | B | A |
| Vout001 | A | A | A | B |
| Vout000 | A | A | A | A |

FIG.36

| BIT GROUP (1) |
| $D_{n-1}$   $D_{2n-1}$   $D_{3n-1}$   · · · ·   $D_{kn-1}$ |
| BIT GROUP (2) |
| $D_{n-2}$   $D_{2n-2}$   $D_{3n-2}$   · · · ·   $D_{kn-2}$ |
| BIT GROUP (3) |
| $D_{n-3}$   $D_{2n-3}$   $D_{3n-3}$   · · · ·   $D_{kn-3}$ |
| ⋮ |
| BIT GROUP (n) |
| $D_0$   $D_n$   $D_{2n}$   · · · ·   $D_{(k-1)n}$ |

DIGITAL-TO-ANALOG CONVERTER, DATA DRIVER AND DISPLAY DEVICE USING SAME

FIELD OF THE INVENTION

This invention relates to a digital-to-analog converter and to a data driver and display device that employ this converter.

BACKGROUND OF THE INVENTION

Liquid crystal display devices (LCDs) characterized by their thin design, light weight and low power consumption have come into widespread use in recent years and are utilized in the display units of mobile devices such as portable telephones (mobile telephones or cellular telephones), PDAs (Personal Digital Assistants) and laptop personal computers. Recently, however, liquid crystal display devices have come to be provided with large-size screens and techniques for dealing with moving pictures have become more advanced, thus making it possible to realize not only mobile applications but also stay-at-home large-screen display devices and large-screen liquid crystal televisions. Liquid crystal display devices that rely upon active matrix drive and are capable of presenting a high-definition display are being utilized as these liquid crystal display devices. The typical structure of an active-matrix liquid crystal display device will be described with reference to FIG. 37. The principal components connected to one pixel of a liquid crystal display unit are illustrated schematically by equivalent circuits in FIG. 37.

In general, a display unit 960 of an active-matrix liquid crystal display device comprises a semiconductor substrate on which transparent pixel electrodes 964 and thin-film transistors (TFTs) 963 are laid out in the form of a matrix (e.g., 1280×3 pixel columns×1024 pixels rows in the case of a color SXGA panel); an opposing substrate on the entire surface of which a single transparent electrode 966 is formed; and a liquid crystal material sealed between these two substrates arranged to oppose each other.

The TFT 963, which has a switching function, is turned on and off under the control of a scan signal. When the TFT 963 turns on, a grayscale voltage that corresponds to a video signal is applied to the pixel electrode 964, and the transmittance of the liquid crystal changes owing to a potential difference between each pixel electrode 964 and opposing-substrate electrode 966. This potential difference is held by capacitance 965 of the liquid crystal, as a result of which an image is displayed.

A data line 962 that sends a plurality of level voltages (grayscale voltages) applied to each pixel electrode 964 and a scan line 961 that sends the scan signal are wired on the semiconductor substrate in the form of a grid (the data lines are 1280×3 in number and the scan lines are 1024 in number in the case of the above-mentioned color SXGA panel). The scan line 961 and data line 962 constitute a large capacitive load owing to the capacitance produced at the intersection of these lines and capacitance, etc., of the liquid crystal sandwiched between the opposing-substrate electrodes.

It should be noted that the scan signal is supplied to the scan line 961 by a gate driver 970, and that the supply of grayscale voltage to each pixel electrode 964 is performed by a data driver 980 via the data line 962.

Rewriting of one screen of data is carried out over one frame (1/60 of a second), data is selected successively every pixel row (every line) by each scan line, and a grayscale voltage is supplied from each data line within the selection interval.

Although the gate driver 970 need only supply at least a bi-level scan signal, it is required that the data driver 980 drive the data lines by grayscale voltages of multiple levels that conform to the number of gray levels. To this end, a buffer in the data driver 980 employs a differential amplifier that is capable of outputting highly precise voltages.

With the progress that has been made in raising image quality (increasing the number of colors) in liquid crystal display devices, there is now growing demand for at least 260,000 colors (video data of six bits per each of the colors R, G, B) and preferably 16,770,000 colors (video data of six bits per each of the colors R, G, B) or more.

For this reason, a data driver that outputs a grayscale voltage corresponding to multiple-bit video data requires an output voltage of very high precision. Moreover, there is an increase in the number of elements in the circuitry that processes the video data and an increase in the chip area of the data-driver LSI chip. These invite an increase in cost. This problem will be elaborated below.

FIG. 38 is a diagram illustrating an example of the configuration of the data driver 980 shown in FIG. 37. Here the main portions of the data driver 980 are depicted as blocks. As shown in FIG. 38, the data driver 980 includes a latch address selector 981, a latch 982, a grayscale voltage generating circuit 983, decoders 984 and buffer circuits 985.

The latch address selector 981 decides data latch timing based upon a clock signal CLK. The latch 982 latches video digital data based upon the data latch timing and outputs data to each of the decoders 984 all at once in response to an STB (strobe) signal. The grayscale voltage generating circuit 983 generates grayscale voltages the number of levels whereof corresponds to the video data. The decoders 984 each select and output one grayscale voltage that corresponds to the data input thereto, and the buffer circuits 985, to which the grayscale voltages output from the decoders 984 are applied, subject these voltages to current amplification and output the results as output voltage $V_{out}$.

By way of example, if 6-bit video data is input, the number of levels is 64 and the grayscale voltage generating circuit 983 generates grayscale voltages having 64 levels. The decoders 984 select one grayscale voltage from these grayscale voltages of 64 levels.

If 8-bit video data is input, on the other hand, then the number of levels is 256, the grayscale voltage generating circuit 983 generates grayscale voltages having 256 levels and the decoders select one grayscale voltage from these grayscale voltages of 256 levels.

Thus, an increase in the number of bits of video data is accompanied by an increase in the scale of the circuitry of the grayscale voltage generating circuit 983 and decoders 984. For example, if the number of bits is increased from six to eight, the scale of the circuitry increases by four times or more. Accordingly, an increase in the number of bits of video data increases the chip area of the data driver LSI chip and raises cost.

A charge redistribution DAC (digital-analog converter) of the kind shown in FIG. 39 (see Yoshiyuki Takeishi, Edited by Hisashi Hara, "Foundations of MOS Integrated Circuits", Ultra LSI Introduction Series 5, p. 164, FIG. 5-39, *Kindai Kagakusha*, May 30, 2002) Non-Patent Document 1) is known as an example of technology for suppressing an increase in the chip area of a data driver LSI chip even if the number of bits is increased. As shown in FIG. 39, the DAC (which is a DAC of the type having a capacitor array and a resistor string) comprises a resistor string; switches $S_{01a}$ to $S_{16a}$ and $S_{01b}$ to $S_{16b}$ that select voltages, which have been extracted from the taps of the resistor string, by higher-order bits (D4 to D7) and supplying the selected voltages to terminals Na and Nb; a switch $S_{init}$ that initializes the voltage at a non-inverting input (+) of a voltage follower; and a switch $S_{LSB}$ that selects any one of the voltages that have been supplied to the terminals Na and Nb by lower-order bits (D0 to D3) and supplies selected voltages to four capacitors C/8, C/4, C/2 and C.

In terms of operation of the DAC, two mutually adjacent voltages are selected from among voltages $V_{000}$, $V_{016}$, ..., and $V_{256}$ of the resistor string by the higher-order bits (D4 to D7) and are supplied to the terminals Na and Nb. By turning on the switch $S_{init}$ and connecting switches $S_{se10}$ to $S_{se13}$ to the Na side, the voltage at a node (Nc) of the non-inverting input side of the voltage follower is initialized to the voltage at terminal Na and the respective terminal voltages across the four capacitors C/8, C/4, C/2 and C are reset.

Next, when the voltages at the terminals Na and Nb are selectively supplied to the four capacitors C/8, C/4, C/2 and C by the lower-order bits (D0 to D3), redistribution of electric charge occurs, a voltage that is the result of the voltage between the voltage at terminal Na and the voltage at terminal Nb being divided by 16 is supplied to the node Nc and a voltage that is the same as that at node Nc is output by the voltage follower. Accordingly, owing to the selection of two mutually adjacent voltages by the higher-order bits and division by 16 by means of the lower-order bits, outputs having 16×16=256 levels can be obtained.

In accordance with the conventional art, the number of reference voltages from the resistor string can be reduced in comparison with the number of output voltage levels. More specifically, if we let m represent the number of reference voltages and n the number of capacitors, then $(m-1) \times 2^n$ outputs can be obtained.

By applying this technique to the grayscale voltage generating circuit 983, decoders 984 and amplifiers 985, therefore, the area of the data driver can be reduced and a reduction in cost achieved.

[Non-Patent Document 1]

Yoshiyuki Takeishi, Edited by Hisashi Hara, "Foundations of MOS Integrated Circuits", Ultra LSI Introduction Series 5, p. 164, FIG. 5-39, *Kindai Kagakusha*, May 30, 2002

SUMMARY OF THE DISCLOSURE

In accordance with the conventional art described above with reference to FIG. 39, the more the value of n, i.e., the number of capacitors, is increased, the larger the number of outputs that can be obtained with respect to a small number of reference voltages. In this example of the conventional art, however, the capacitors for performing charge redistribution require twice the capacitance value as the order of the bits rises. For example, if n=4, holds, an eight-fold ($2^3$=8) capacitance value is required for C/8, C/4, C/2 and C. If n is increased, therefore, the area occupied by the capacitors becomes very large and the effect of reducing area diminishes.

Accordingly, an object of the present invention is to provide a digital-to-analog converter that is equipped with an amplifier that outputs $m^n$ multivalued voltage levels with respect to m input voltages, thereby reducing the number of input voltages required while keeping the area occupied by an amplifier small, and reducing the number of transistors.

Another object of the present invention is to provide a small-area, low-cost data driver and a display device that includes this data driver by using the digital-to-analog converter described above.

According to one aspect of the present invention, the foregoing objects are attained by providing a digital-to-analog converter comprising: a reference voltage generating circuit for outputting m (m>=4) reference voltages having voltage values that differ from one another; a decoder, which receives a digital signal and the m reference voltages, and selects and outputs n (n>=3) identical or different reference voltages from among the m reference voltages on the basis of the digital signal; and an amplifying circuit, which receives the selected n voltages, and outputs to an output terminal a voltage obtained by taking the weighted mean of the input n voltages at a ratio of $2^{n-1}:2^{n-2}: \ldots :2^0$; wherein a maximum of $m^n$ voltage levels that differ from one another can be output to the output terminal in accordance with the input digital signal.

In a digital-to-analog converter according to another aspect of the present invention, the m ($m=2^K$, where K is an integer and K>=2 holds) reference voltages may be set to a $\{1+(2^n-1)\times\Sigma_{j=1}^{K}[\alpha_j \times 2^{(j-1)n}]\}$th level (where $\alpha_1, \alpha_2, \ldots,$ and $\alpha_K$ are 0 or 1) from among equally spaced $m^n$ voltage levels.

In a digital-to-analog converter according to another aspect of the present invention, the decoder receives an n×k-bit (where k is an integer and k>=2 holds) digital signal and the m ($=2^k$) reference voltages as inputs and includes n selected-voltage output terminals and n sub-decoders; the sub-decoders each receiving the m reference voltages as inputs and outputting one voltage from among the m reference voltages based upon one group of digital signals from among bit groups obtained by dividing the digital signal into n groups of k digital signals each; n outputs of the sub-decoders being connected to respective ones of the n selected-voltage output terminals; the decoder selecting, and outputting to the n selected-voltage output terminals, the n (n>=3) identical or different voltages from among the m reference voltages based upon the digital signal; the amplifying circuit receiving as inputs the n voltages selected at the n selected-voltage output terminals and outputting, from the output terminal, the voltage obtained by taking the weighted mean of the input n voltages at the ratio of $2^{n-1}:2^{n-2}: \ldots :2^0$.

In a digital-to-analog converter according to another aspect of the present invention, the amplifying circuit includes: a differential amplifying circuit having a non-inverting input terminal to which a reference voltage is supplied and an output end connected to the output terminal; first to nth switches (a first switch group) each having a first end connected to a respective one of the n selected-voltage output terminals; n−1 switches (a second switch group) each connected between a second end of an xth switch of the first switch group and a second end of an (x+1)th switch of the first switch group (where 1<=x<=n−1 holds); a switch connected between an nth switch of the first switch group and the output end of the differential amplifying circuit; a switch connected between the output end of the differential amplifying circuit and an inverting input terminal of the differential amplifying circuit; and n capacitors connected between second ends of respective ones of the first to nth switches of the first switch group and the inverting input terminal of the differential amplifying circuit.

In a digital-to-analog converter according to another aspect of the present invention, the decoder receives an (n×k)-bit (where k is an integer and k>=2 holds) digital signal and the m ($=2^k$) reference voltages as inputs and includes one selected-voltage output terminal, a bit-group selecting circuit and a sub-decoder; the bit-group selecting circuit successively selecting and outputting a total of n bit groups one group at a time from bit groups obtained by dividing the digital signal into n groups of k bits each; the sub-decoder receiving the m reference voltages as inputs and outputting one voltage from among the m reference voltages based upon the digital signal of the bit group selected by the bit-group selecting circuit; the single output of the sub-decoder being connected to the single selected-voltage output terminal; the decoder selecting, on a time-division basis, the n (n>=3) identical or different voltages from among the m reference voltages based upon the digital signal and successively supplying these voltages to the single selected-voltage output terminal; the amplifying circuit receiving as inputs the n voltages successively supplied to the single selected-voltage output terminal and outputting, from the output terminal, the voltage obtained by taking the weighted mean of the input n voltages at the ratio of $2^{n-1}:2^{n-2}:\ldots:2^0$.

In a digital-to-analog converter according to another aspect of the present invention, the amplifying circuit includes: a differential amplifying circuit having a non-inverting input terminal to which a reference voltage is supplied and an output end connected to the output terminal; first to nth switches (a first switch group) each having a first end connected to the single selected-voltage output terminal; n−1 switches (a second switch group) each connected between a second end of an xth switch of the first switch group and a second end of an (x+1)th switch of the first switch group (where $1<=x<=n-1$ holds); a switch connected between an nth switch of the first switch group and the output end of the differential amplifying circuit; a switch connected between the output end of the differential amplifying circuit and an inverting input terminal of the differential amplifying circuit; and n capacitors connected between second ends of respective ones of the first to nth switches of the first switch group and the inverting input terminal of the differential amplifying circuit.

In a digital-to-analog converter according to another aspect of the present invention, the decoder receives an (n×k)-bit (where k is an integer and k>=2 holds) digital signal and the m ($=2^k$) reference voltages as inputs and includes r ($1<r<n$) selected-voltage output terminals, r bit-group selecting circuits and r sub-decoders; the bit-group selecting circuits each successively selecting and outputting bit groups one group at a time from (n/r) bit groups among bit groups obtained by dividing the digital signal into n groups of k bits each; the sub-decoders each receiving the m reference voltages as inputs and outputting one voltage from among the m reference voltages based upon the digital signal of the bit group selected by the bit-group selecting circuit; r outputs of the sub-decoders being connected to respective ones of the r selected-voltage output terminals; the decoder selecting, on a time-division basis, the n (n>=3) identical or different voltages from among the m reference voltages based upon the digital signal and successively supplying these voltages to the r selected-voltage output terminals; the amplifying circuit receiving as inputs the n voltages successively supplied to the r selected-voltage output terminals and outputting, from the output terminal, the voltage obtained by taking the weighted mean of the input n voltages at the ratio of $2^{n-1}:2^{n-2}:\ldots:2^0$.

In a digital-to-analog converter according to another aspect of the present invention, the amplifying circuit includes: a differential amplifying circuit having a non-inverting input terminal to which a reference voltage is supplied and an output end connected to the output terminal; a total of n switches (a first switch group) in which first ends of n/r switches each are connected to a respective one of the r selected-voltage output terminals; n−1 switches (a second switch group) each connected between a second end of an xth switch of the first switch group and a second end of an (x+1)th switch of the first switch group (where $1<=x<=n-1$ holds); a switch connected between an nth switch of the first switch group and the output end of the differential amplifying circuit; a switch connected between the output end of the differential amplifying circuit and an inverting input terminal of the differential amplifying circuit; and n capacitors connected between second ends of the first to nth switches of the first switch group and the inverting input terminal of the differential amplifying circuit.

In a digital-to-analog converter according to another aspect of the present invention, the sub-decoder receives the m reference voltages and a bit group comprising k digital signals as inputs thereto; wherein digital signals of the bit group are represented by B0, B1, . . . , and B(k−1), complementary signals of the digital signals of the bit group are represented by B0B, B1B, . . . , and B(k−1)B, and SigN(D,p,q) is a function that returns DB (the complementary signal of D) when the remainder of p−1 divided by $2^{(q+1)}$ is less than $2^q$, and returns D otherwise; w, y are integers (where $1<=w<=m$, $0<=y<=k-1$ hold); with regard to m paths connecting the m reference voltages and a single output terminal of the sub-decoder, a wth reference voltage and the single output terminal are connected via k switches controlled by respective ones of k control signals sigN[B(0),w,0], sigN[B(1),w,1], . . . , sigN[B(y),w,y], . . . , sigN[B(k−1),w,k−1]; and one of the m reference voltages is selected and output by a k-bit digital signal of the bit group.

In a digital-to-analog converter according to another aspect of the present invention, the sub-decoder receives the m reference voltages and a bit group comprising k digital signals as inputs thereto and includes a single output terminal; a switch circuit for selecting one of the m reference voltages; and a switch control circuit for outputting a control signal that controls the switch circuit, which selects one of the m reference voltages, by a k-bit digital signal of the bit group; one of the m reference voltages being selected and output by the k-bit digital signal of the bit group.

In a digital-to-analog converter according to another aspect of the present invention, the switch control circuit receives a k-bit digital signal of the bit group and includes $2^k$ logic circuits that differ from one another in terms of the logic of input signals applied thereto, each logic circuit receiving a digital signal or a complementary signal thereof per bit of the bit group and turning a switch ON only in a case where the input k signals are all "1"s or all "0"s. The switch circuit is such that m paths connecting the m reference voltages and the output of the sub-decoder are connected via switches that change over ON/OFF of the connection of the reference voltages to the output, and the switches are controlled by respective ones of switch control signals that have been output by the switch control circuit.

A display device according to another aspect of the present invention has the above-described digital-to-analog converter as a driver for driving data lines.

The meritorious effects of the present invention are summarized as follows.

The present invention is such that in a DAC using a differential amplifier having n input voltages and capable of outputting a voltage obtained by taking the weighted mean of these voltages at a ratio of $2^{n-1}:2^{n-2}:\ldots:2^0$, an advantage is that a maximum of $m^n$ voltage levels can be output with respect to the number m of voltages received by the DAC.

In accordance with the present invention, the effect of reducing area is significant and cost can be reduced in fields where there is a very large number of bits, as in the data driver of a liquid crystal display device, etc.

BRIEF DESCRIPTION OF THE DRAWINGS

FIG. 31 is a diagram illustrating the relationship between reference voltages and output voltages in a case where m=4, n=3 holds in the present invention;

FIG. 32 is a diagram illustrating the relationship between reference voltages and output voltages in a case where m=4, n=3 holds in the present invention;

FIG. 36 is a diagram illustrating an example of division of a bit group according to the present invention;

DETAILED DESCRIPTION OF THE INVENTION

The present invention will now be described with reference to the accompanying drawings.

Figure 1:
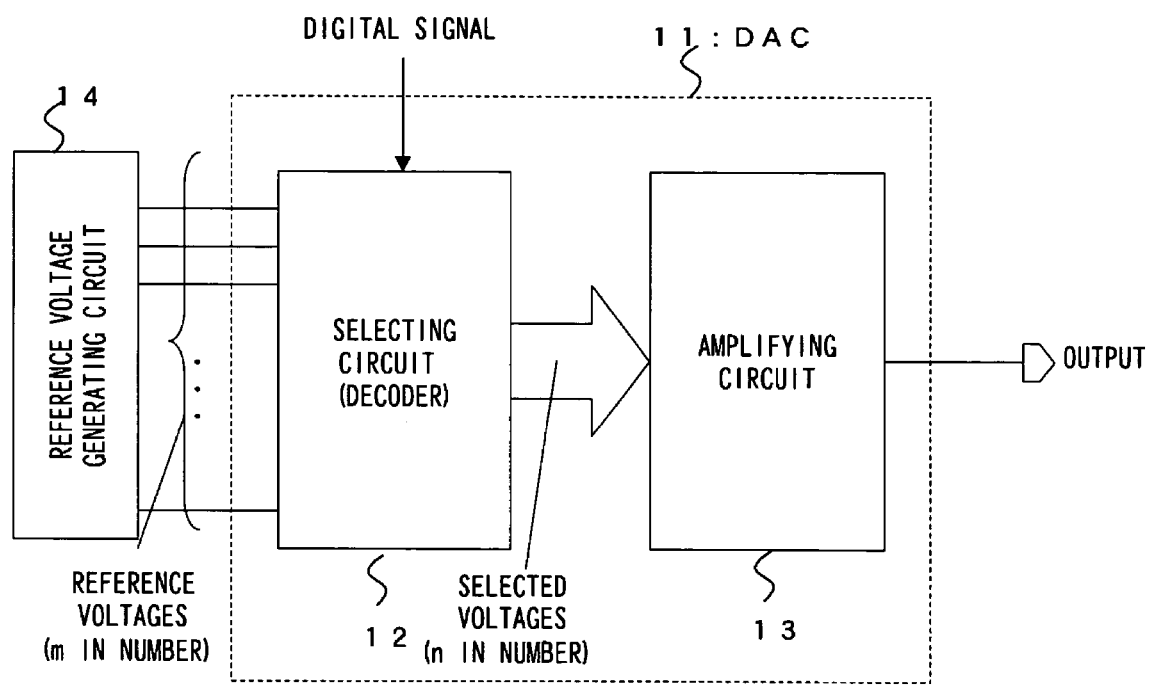
FIG. 1 is a diagram illustrating the structure of a digital-to-analog converter according to a first embodiment of the present invention.

Referring to FIG. 1, an output circuit (DAC) 11 according to an exemplary embodiment of the present invention includes a decoder (selecting circuit) 12, which receives a plurality (m) of reference voltages from a reference voltage generating circuit that generates m (m>=4) reference voltages having voltage values that differ from one another, and selects and outputs n identical or different reference voltages based upon a selecting signal; and an amplifying circuit 13, which receives n reference voltages that are output from the decoder 12, and outputs a voltage, that is obtained by taking the weighted mean of the input n voltages at a ratio of $2^{n-1}:2^{n-2}: \ldots :2^0$, from an output terminal. This circuit is used as a digital-to-analog converter in which a digital data signal is employed as the selecting signal, and which outputs a voltage the level whereof conforms to the digital data signal.

Figure 39:
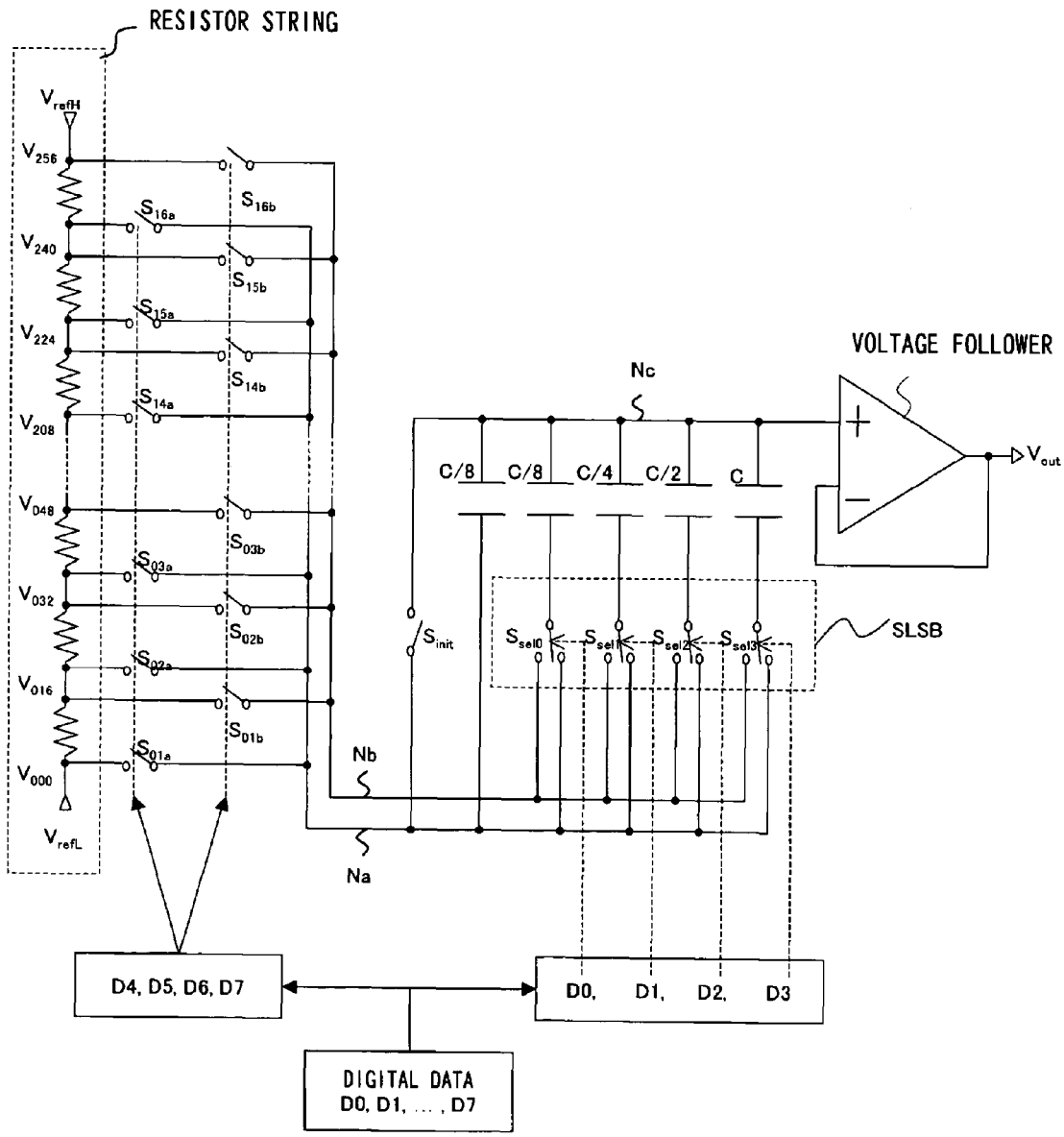
FIG. 39 is a diagram illustrating the configuration of a DAC having a capacitor array and a resistor string described in Non-Patent Document 1.

In the case of the arrangement shown in FIG. 39, doubling the number of reference voltages without changing the configuration of the amplifier results in only a two-fold increase in the number of output voltage levels. By contrast, in the present invention, doubling the number of reference voltages without changing the configuration of the amplifier results in $(2m)^n = 2^n \times m^n$ output voltage levels. In other words, it will be understood that the number of output voltage levels is increased by a factor of $2^n$.

Conversely, this can be interpreted to mean that an increase in the number of reference voltages when the number of bits is increased can be kept small and an increase in the size of the circuitry can be reduced in comparison with the arrangement of FIG. 39. In particular, if the present invention is applied to fields where there is a very large number of bits, as in the data driver of a liquid crystal display device, the effect of reducing area is significant and cost can be reduced.

In accordance with the present invention, the amplifying circuit 13 can take on any form so long as it outputs a voltage obtained by taking the weighted mean of the input n voltages at a ratio of $2^{n-1}:2^{n-2}: \ldots :2^0$.

For the sake of simplicity, assume that the decoder 12 has n selected-voltage output terminals $T_1, T_2, \ldots,$ and $T_n$, and that the n voltages that are output from the decoder 12 are output to respective ones of the output terminals $T_1$ to $T_n$. In one example of the amplifying circuit 13, the latter can be implemented by an arrangement that includes a differential amplifying circuit having an output end and an inverting input terminal (−) connected to the output of the decoder 12; n switches (a first switch group) having first ends connected to respective ones of the n selected-voltage output terminals $T_1, T_2, \ldots,$ and $T_n$; n switches (a second switch group) connected between second ends of respective ones of the n switches and a non-inverting input terminal (+) of the differential amplifying circuit; and n capacitors connected between respective ones of nodes of the first and second switch groups and a power supply.

In accordance with an embodiment, the decoder 12 receives m reference voltages of mutually different voltage values as inputs thereto, supplies the n output terminals $T_1$ to $T_n$ with a group of n voltages, inclusive of voltages that may be identical, from among the m reference voltages, i.e., supplies the n output terminals $T_1$ to $T_n$ with any one group of n voltages, based upon a selecting signal, from among $m^n$ voltage groups, and is capable of outputting a maximum of $m^n$ voltage levels that differ from one another.

When the input m ($m=2^k$, where k is an integer and k>=2 holds) reference voltages are set to a $\{1+(2^n-1)\times \Sigma_{j=1}^{K}[\alpha_j \times 2^{(j-1)n}]\}^{th}$ level (where $\alpha_1, \alpha_2, \ldots,$ and $\alpha_k$ are 0 or 1) from among equally spaced $m^n$ voltage levels, the voltage levels that are output from the amplifying circuit 13 are all equally spaced.

Figure 6:
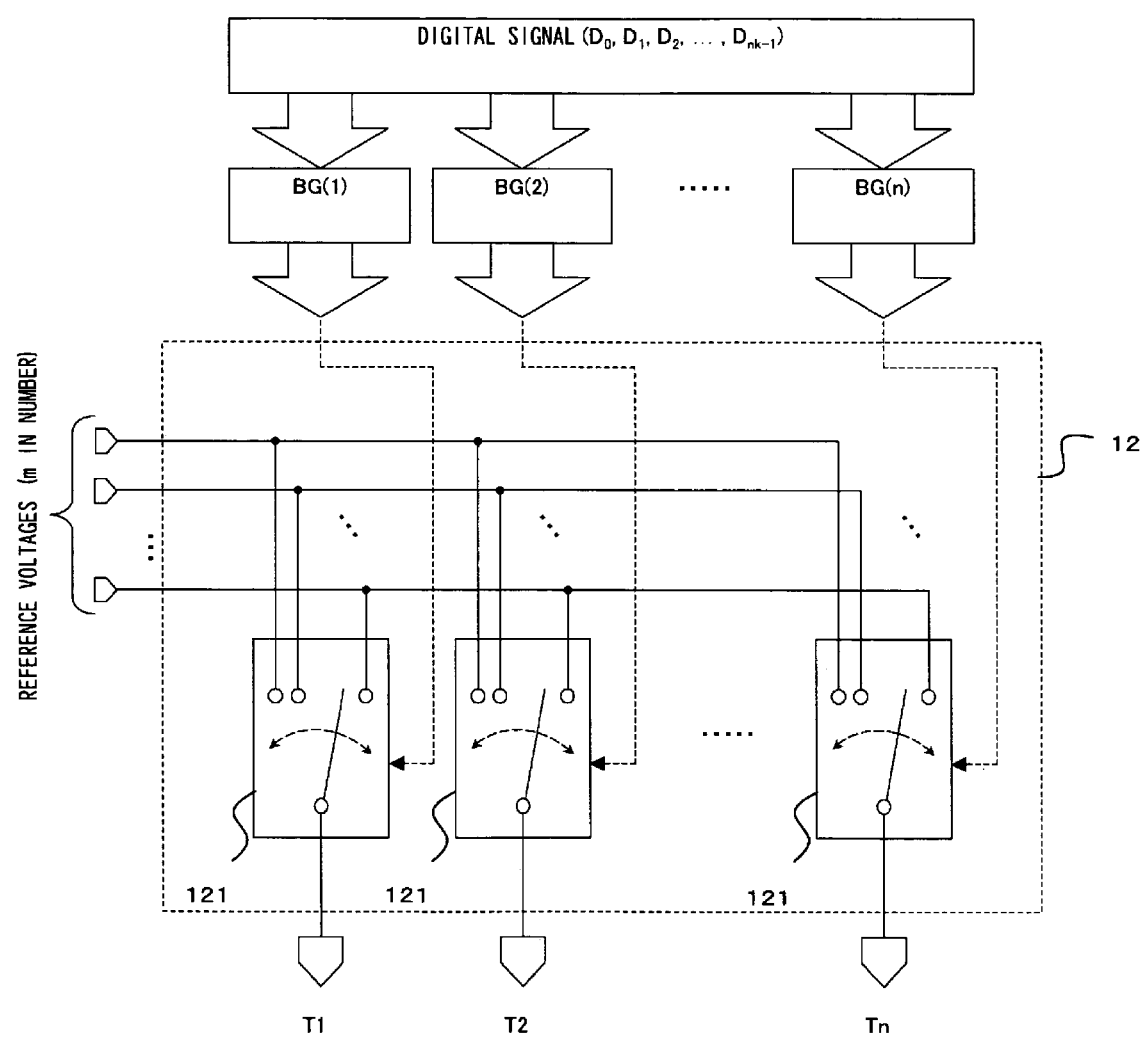
FIG. 6 is a diagram illustrating an example of the structure of a decoder according to the second embodiment.

The decoder 12 receives an (n×k)-bit (where k is an integer and k>=2 holds) digital signal and the m ($=2^k$) reference voltages as inputs and includes n selected-voltage output terminals and n sub-decoders 121 (see FIG. 6). The sub-decoders each receive the m reference voltages as inputs and output one voltage from among the m reference voltages based upon one group of digital signals from among bit groups obtained by dividing the digital signal into n groups of k digital signals each. The n outputs of the sub-decoders are connected to respective ones of the n-number of selected-voltage terminals $T_1$ to $T_n$. On the basis of the digital signal, the decoder selects, and outputs to the n selected-voltage output terminals $T_1$ to $T_n$, the n (n>=3) identical or different voltages from among the m reference voltages. The amplifying circuit 13 receives as inputs the n voltages selected at the n selected-voltage output terminals $T_1$ to $T_n$ and outputs, from the output terminal, the voltage obtained by taking the weighted mean of the input n voltages at the ratio of $2^{n-1}:2^{n-2}: \ldots :2^0$. A maximum of $m^n$ mutually different voltage levels can be output to the output terminal in accordance with the input digital signal.

The sub-decoder 121 may be constructed as follows: The sub-decoder 121 receives m reference voltages and a bit group comprising k digital signals as inputs thereto. Let the digital signals of the bit group be represented by B0, B1, ..., and B(k−1), and let the complementary signals of the digital signals of the bit group be represented by B0B, B1B, ..., and B(k−1)B.

SigN(D,p,q) is a function that returns DB (a signal obtained by inverting D) when the remainder of p−1 divided by $2^{(q+1)}$ is less than $2^q$ and returns D otherwise.

Let w, y represent integers (where 1<=w<=m, 0<=y<=k−1 hold). With regard to m paths connecting the m reference voltages and a single output terminal of the sub-decoder 121, a wth reference voltage and the output terminal are connected via k switches controlled by respective ones of k control signals sigN[B(0),w,0], sigN[B(1),w,1], ..., sigN[B(y),w, y], ..., and sigN[B(k−1),w,k−1]. One of the m reference voltages is selected and output by a k-bit digital signal of the bit group.

NMOS transistors can be used as the switches. Each NMOS transistor has a gate to which the digital signal is input, and a drain and source one of which forms a input end of the switch and the other of which forms an output end of the switch.

Alternatively, the sub-decoder 121 may be constructed as follows: The sub-decoder 121 receives m reference voltages and a bit group comprising k digital signals as inputs thereto. Let the digital signals of the bit group be represented by B0, B1, . . . , and B(k-1), and let the complementary (inverted) signals of the digital signals of the bit group be represented by B0B, B1B, . . . , and B(k-1)B.

SigP(D,p,q) is a function that returns D when the remainder of p-1 divided by $2^{(q+1)}$ is less than $2^q$ and returns DB (a signal obtained by inverting D) otherwise.

Let w, y represent integers (where 1<=w<=m, 0<=y<=k-1 hold). With regard to m paths connecting the m reference voltages and a single output terminal of the sub-decoder 121, a wth reference voltage and the output terminal are connected via k switches controlled by respective ones of k control signals sigP[B(0),w,0], sigP[B(1),w,1], . . . , sigP[B(y),w, y], . . . , and sigP[B(k-1),w,k-1]. One of the m reference voltages is selected and output by a k-bit digital signal of the bit group.

PMOS transistors can be used as the switches. Each PMOS transistor has a gate to which the digital signal is input, and a drain and source one of which forms an input end of the switch and the other of which forms an output end of the switch.

Figure 9:
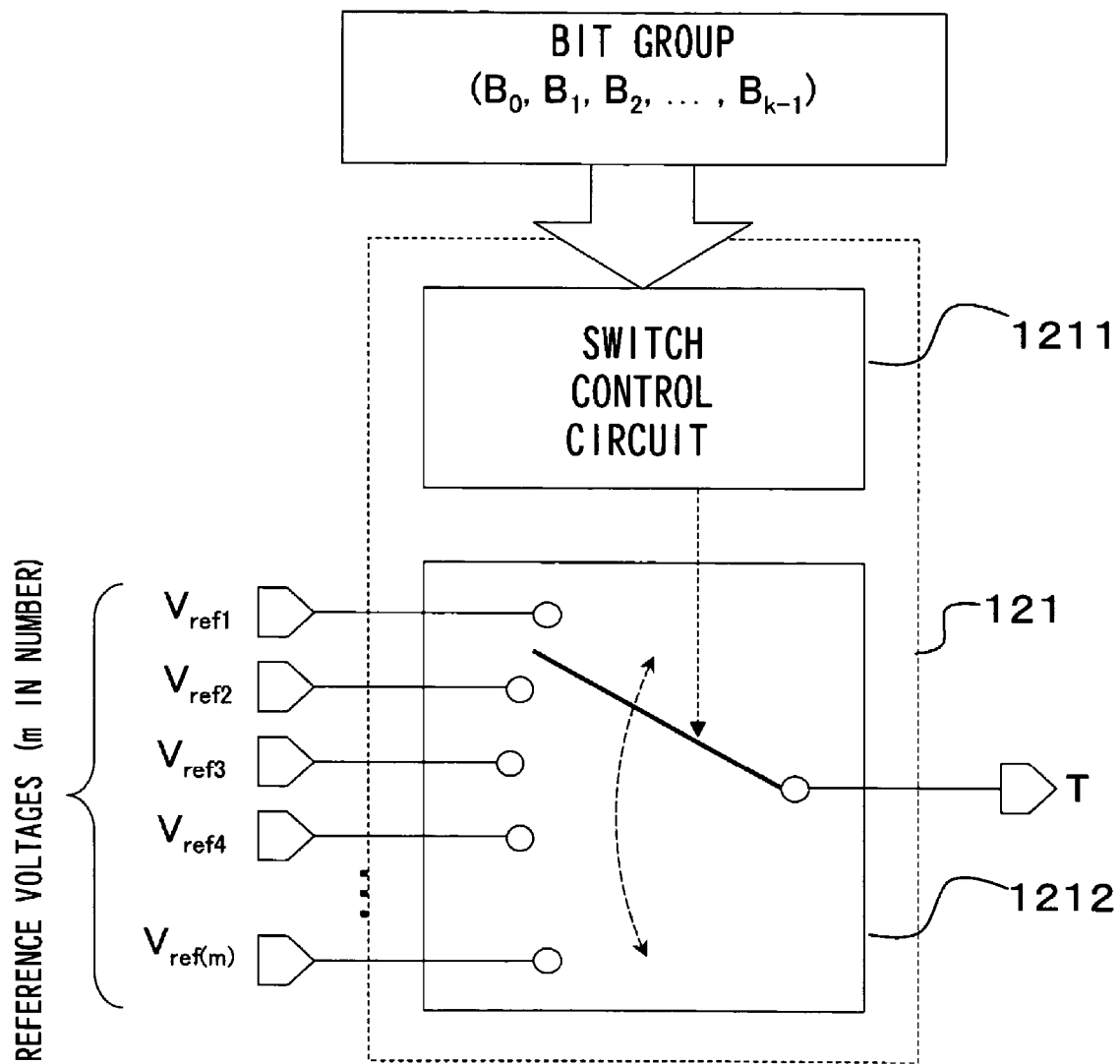
FIG. 9 is a diagram illustrating a further example of the structure of a sub-decoder according to the present invention.

Referring to FIG. 9, in another exemplary embodiment of the present invention, the sub-decoder 121 receives m reference voltages and a bit group comprising k digital signals as inputs thereto. The sub-decoder 121 includes a single output terminal; a switch circuit 1212 for selecting one of the m reference voltages; and a switch control circuit 1211 for outputting a signal that controls the switch circuit 1212, which selects one of the m reference voltages, by the k-bit digital signal of the bit group. One of the m reference voltages is selected and output by the k-bit digital signal of the bit group.

In this embodiment of the invention, the switch control circuit 1211 receives a k-bit digital signal of the bit group and includes $2^k$ logic circuits that differ from one another in terms of the logic of input signals applied thereto, each logic circuit receiving a digital signal or a complementary signal thereof per bit of the bit group and turning a switch ON only in a case where the input k signals are all "1"s or all "0"s. The switch circuit 1212 is such that m paths connecting the m reference voltages and the output of the sub-decoder 121 are connected via switches that change over ON/OFF of the connection of the reference voltages to the output. The switches are controlled by respective ones of switch control signals that have been output by the switch control circuit 1211.

In this embodiment of the invention, the input k digital signals are divided into U sub-bit groups each of which includes two or more digital signals. Each logic circuit of the switch control circuit 1211 can be replaced by U logic circuits each of which receives a respective one of the sub-bit groups as an input and outputs a signal that turns a switch ON only in a case where the input signals of the sub-bit group are all "1"s or all "0"s. Further, each of the switches in the switch circuit that change over ON/OFF of the connection of the reference voltages to the output can be replaced by a group of U switches serially arrayed. The U switches are controlled by respective ones of switch control signals that have been output by the U logic circuits.

Further, in an embodiment of a display device according to the present invention, the decoder 12 receives a plurality of voltage levels from a grayscale voltage generating circuit for generating a plurality of voltage levels as the plurality of reference voltages, and received digital video data as the selecting signals, and the amplifying circuit 13 constructs a driving circuit for receiving the outputs of the decoder 12 and driving the data lines.

The embodiments of the invention will be described in greater detail.

FIG. 1 is a diagram useful in describing the configuration of a digital-to-analog converter (DAC) 11 according to an embodiment of the present invention. As shown in FIG. 1, the DAC 11 receives as inputs m mutually different reference voltages generated by a reference voltage generating circuit 14, makes it possible to output a maximum of $m^n$ voltage levels based upon a digital signal and outputs voltages selected from among these voltage levels.

The DAC 11 has a decoder 12 and an amplifying circuit 13. The decoder 12 receives m mutually different reference voltages as inputs and is capable of outputting a maximum of $m^n$-number of voltages. The amplifying circuit 13 outputs a voltage obtained by taking the weighted mean of the input n voltages, which have been output by the decoder 12, at a ratio of $2^{n-1}:2^{n-2}: \ldots :2^0$.

Figure 2:
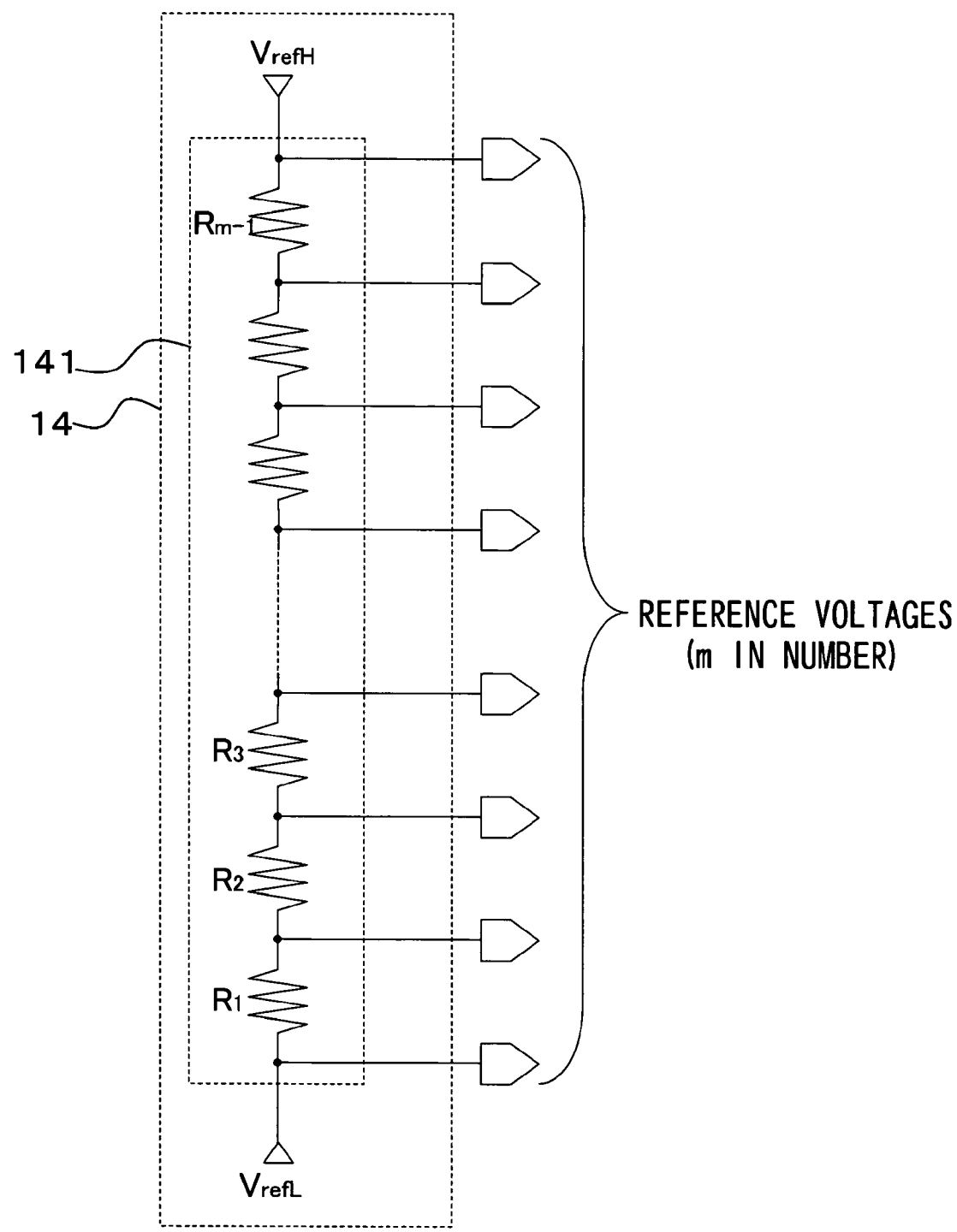
FIG. 2 is a diagram illustrating an example of the structure of a reference voltage generating circuit.
Figure 3:
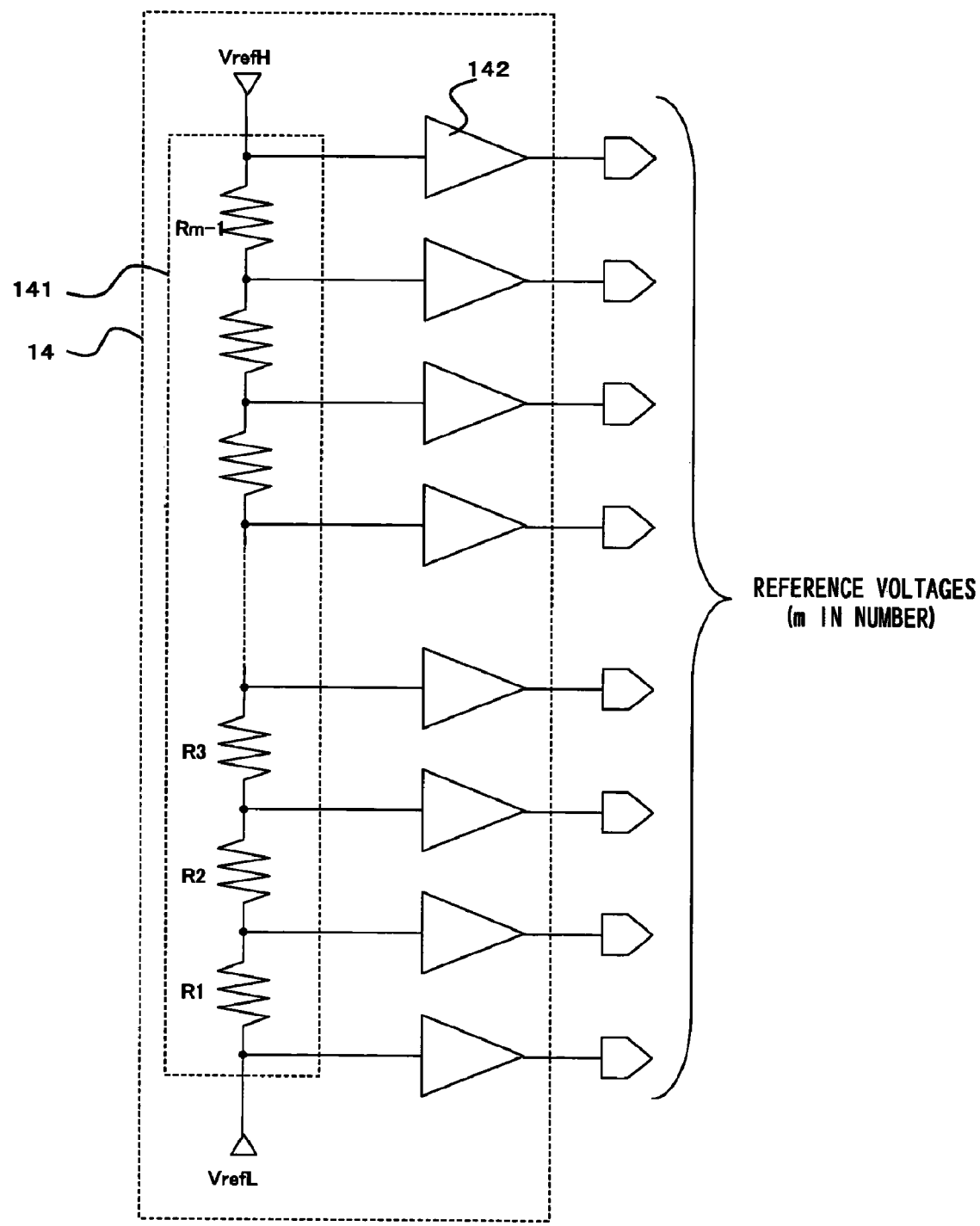
FIG. 3 is a diagram illustrating another example of the structure of a reference voltage generating circuit.

The reference voltage generating circuit 14 is capable of using a resistor string, etc., shown in FIG. 2 or 3. As shown in FIG. 2, voltages VrefH and VrefL are supplied to respective ends of a resistor string 141, and reference voltages are output from taps between resistors. In the arrangement of FIG. 3, a buffer (voltage follower) 142 is added to each tap in such a manner that reference voltages can be extracted at a high driving capability.

If the m ($m=2^k$, where k is an integer and k>=2 holds) reference voltages are set to a $\{1+(2^n-1) \times \Sigma_{j=1}^{K}[\alpha_j \times 2^{(j-1)n}]\}$th level (where $\alpha_1, \alpha_2, \ldots,$ and $\alpha_k$ are 0 or 1) from among equally spaced $m^n$ voltage levels, then the $m^n$ voltage levels that are output from the amplifying circuit 13 will all be equally spaced.

First, if we let v represent the spacing of $m^n$ ($=2^{kn}$) mutually adjacent equal voltages having an equal spacing, then a reference voltage $V_{ref}$ will be expressed by the Equation (1) below.

$$v_{ref}(\alpha_1, \alpha_2, \alpha_3, \ldots, \alpha_k) = \left\{1 + (2^n - 1)\sum_{j=1}^{k} \alpha_j \cdot 2^{(j-1)n}\right\} v \quad (1)$$

where $\alpha_1, \alpha_2, \alpha_3, \ldots,$ and $\alpha_k$ take on a value of 0 or 1.

In order to indicate that the outputs will all be equally spaced, it will suffice if an output voltage $V_{out}(i)$ of the amplifying circuit 13 at any gray level i ($1<=i<=2^{kn}$) is expressed by a linear relationship with respect to the gray level i, i.e., by Equation (2) below.

$$V_{out}(i) = i \cdot v \quad (2)$$

In a case where a voltage at the gray level i is output, voltages $V_{sel1}(i)$ to $V_{sel(n)}(i)$ selected by the decoder 12 are expressed by Equation (3) below using Equation (1) and digital signals $D_0$ to $D_{(kn-1)}$.

$$\begin{cases} V_{sel1}(i) = V_{ref}(D_{n-1}, D_{2n-1}, D_{3n-1}, \ldots, D_{kn-1}) \\ V_{sel2}(i) = V_{ref}(D_{n-2}, D_{2n-2}, D_{3n-2}, \ldots, D_{kn-2}) \\ \vdots \quad \vdots \quad \vdots \quad \vdots \quad \vdots \quad \ddots \quad \vdots \\ V_{sel(n-1)}(i) = V_{ref}(D_1, D_{n+1}, D_{2n+1}, \ldots, D_{(k-1)n+1}) \\ V_{sel(n)}(i) = V_{ref}(D_0, D_n, D_{2n}, \ldots D_{(k-1)n}) \end{cases} \quad (3)$$

Further, the gray level i is expressed by Equation (4) below similarly using the digital signals $D_0$ to $D_{(kn-1)}$.

$$i = 1 + \sum_{j=0}^{kn-1} D_j \cdot 2^j \quad (4)$$

Since the amplifying circuit 13 outputs a voltage obtained by taking the weighted mean of the voltages $V_{sel1}(i)$ to $V_{sel(n)}(i)$, the output voltage $V_{out}(i)$ of the amplifying circuit 13 is expressed by Equation (5) below.

$$V_{out}(i) = \frac{2^{n-1}V_{sel1}(i) + 2^{n-2}V_{sel2}(i) + \ldots + 2^1 V_{sel(n-1)}(i) + 2^0 V_{sel(n)}(i)}{2^n - 1} \quad (5)$$

If Equation (3) is substituted into $V_{sel1}(i)$ to $V_{sel(n)}(i)$ of Equation (5), then the numerator of Equation (5) becomes as follows:

$$\begin{aligned}
\text{Numerator of Equation (5)} &= 2^0 v + (2^n - 1) \cdot 2^0 (D_0 \cdot 2^0 + D_n \cdot 2^n + D_{2n} \cdot 2^{2n} + \ldots + D_{(k-1)n} \cdot 2^{(k-1)n})v + \\
&\quad 2^1 v + (2^n - 1) \cdot 2^1 (D_1 \cdot 2^0 + D_{n+1} \cdot 2^n + D_{2n+1} \cdot 2^{2n} + \ldots + D_{(k-1)n+1} \cdot 2^{(k-1)n})v + \\
&\quad \cdots \qquad \vdots \qquad \vdots \qquad \vdots \qquad \ddots \qquad \vdots + \\
&\quad 2^{n-2} v + (2^n - 1) \cdot 2^{n-2} (D_{n-2} \cdot 2^0 + D_{2n-2} \cdot 2^n + D_{3n-2} \cdot 2^{2n} + \ldots + D_{kn-2} \cdot 2^{(k-1)n})v + \\
&\quad 2^{n-1} v + (2^n - 1) \cdot 2^{n-1} (D_{n-1} \cdot 2^0 + D_{2n-1} \cdot 2^n + D_{3n-1} \cdot 2^{2n} + \ldots + D_{kn-1} \cdot 2^{(k-1)n})v \\
&= (2^0 + 2^1 + \ldots + 2^{n-1})v + (2^n - 1)v \cdot \sum_{j=0}^{kn-1} D_j \cdot 2^j \\
&= (2^n - 1)\left(1 + \sum_{j=0}^{kn-1} D_j \cdot 2^j\right)v
\end{aligned}$$

Accordingly, output voltage $V_{out}(i)$ of amplifying circuit 13 is expressed by Equation (6) below.

$$V_{out}(i) = \frac{(2^n - 1)\left(1 + \sum_{j=0}^{kn-1} D_j \cdot 2^j\right)v}{2^n - 1} = \left(1 + \sum_{j=0}^{kn-1} D_j \cdot 2^j\right)v \quad (6)$$

Substituting Equation (4) into Equation (6) gives the following:

$$V_{out}(i) = iv$$

This indicates Equation (2).

Thus, it is indicated that by setting the reference voltages to a $\{1+(2^n-1)\times\sum_{j=1}^{K}[\alpha_j \times 2^{(j-1)n}]\}$th level (where $\alpha_1, \alpha_2, \ldots,$ and $\alpha_k$ are 0 or 1) from among equally spaced $m^n$ voltage levels, $m^n$ output voltages of the amplifying circuit 13 are all equally spaced.

Next, a case where the decoder 12 of FIG. 1 has n output terminals (i.e., where the amplifying circuit 13 has n input terminals) will be described as a second embodiment of the present invention. That is, the decoder 12 receives m reference voltages that differ from one another, selects n voltages, inclusive of voltages that may be identical, from among the m reference voltages based upon a selecting signal, and supplies the selected voltages to n output terminals $T_1, T_2, \ldots, T_n$.

Further, the amplifying circuit 13 outputs a voltage obtained by taking the weighted mean of the n voltages, which have been supplied to the terminals $T_1$ to $T_n$, at a ratio of $2^{n-1}:2^{n-2}:\ldots:2^0$. Let $V_{Q1}, V_{Q2}, \ldots,$ and $V_{Qn}$ represent the n voltages supplied to the terminals $T_1$ to $T_n$.

A case where there are four reference voltages and three output terminals $T_1$, $T_2$ and $T_3$ of the decoder 12, namely a case where m=4, n=3 holds, will now be described as an example. FIG. 31 is a diagram illustrating the relationship among reference voltages, selected voltages of the decoder 12 and output voltages of the amplifying circuit 13. In the example depicted in FIG. 31, $4^3=64$ equally spaced voltages can be output with respect to four reference voltages. With reference to Equation (1), the four reference voltages (A, B, C, D) are the $1^{st}$, $8^{th}$, $57^{th}$ and $64^{th}$ voltages, respectively.

The amplifying circuit 13 outputs a voltage obtained by taking the weighted mean of the voltages $V_{Q1}$, $V_{Q2}$ and $V_{Q3}$, which are supplied respectively to the terminals $T_1$, $T_2$ and $T_3$, at the ratio 4:2:1. That is, the amplifying circuit 13 outputs the following:

$$V_{out}=(4V_{Q1}+2V_{Q2}+1V_{Q3})/7$$

Accordingly, by setting voltages $V(T_1)$, $V(T_2)$ and $V(T_3)$ at terminals $T_1$, $T_2$ and $T_3$ in the manner illustrated in FIG. 31, 64 equally spaced voltages are obtained.

A case where there are four reference voltages and four output terminals $T_1$, $T_2$, $T_3$ and $T_4$ of the decoder 12, namely a case where m=4, n=4 holds, will now be described as another example.

FIG. 32 is a diagram illustrating the relationship among reference voltages, selected voltages of the decoder 12 and output voltages of the amplifying circuit 13. In the example depicted in FIG. 32, $4^4=256$ equally spaced voltages can be output with respect to the four reference voltages. With reference to Equation (1), the four reference voltages (A, B, C, D) are the $1^{st}$, $16^{th}$, $241^{st}$ and $256^{th}$ voltages, respectively.

The amplifying circuit 13 outputs a voltage obtained by taking the weighted mean of the voltages $V_{Q1}$, $V_{Q2}$, $V_{Q3}$ and $V_{Q4}$ which are supplied respectively to the terminals $T_1$, $T_2$, $T_3$ and $T_4$ at the ratio 8:4:2:1. That is, the amplifying circuit 13 outputs the following:

$$V_{out}=(8V_{Q1}+4V_{Q1}+2V_{Q2}+1V_{Q3})/15$$

Accordingly, by setting voltages $V(T_1)$, $V(T_2)$, $V(T_3)$ and $V(T_4)$ at terminals $T_1$, $T_2$, $T_3$ and $T_4$ in the manner illustrated in FIG. 32, 256 equally spaced voltages are obtained.

Figure 4A:
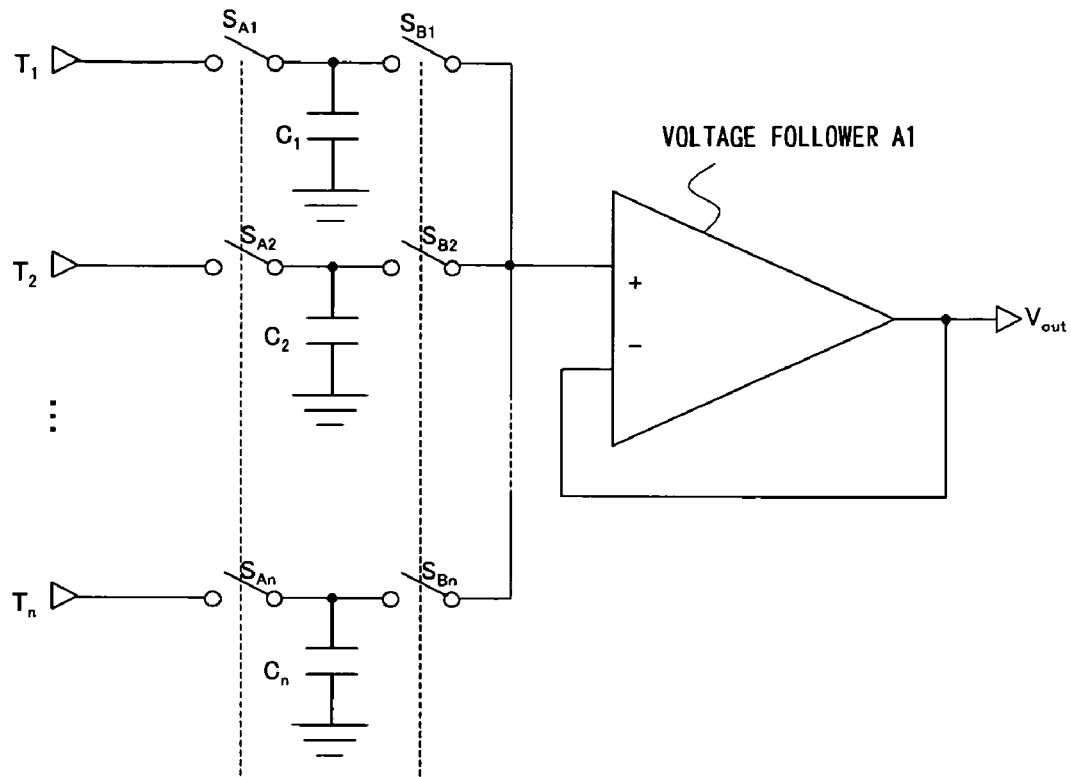
FIG. 4A is a diagram illustrating an example of the structure of an amplifying circuit according to a second embodiment of the present invention.
Figure 4B:
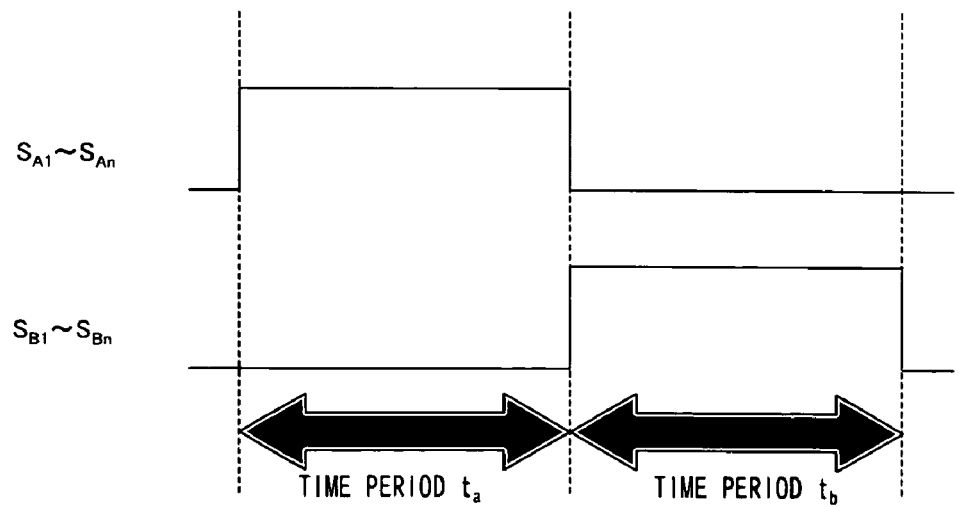
FIG. 4B is a timing chart illustrating ON/OFF control of switches in FIG. 4A.

A specific example of the amplifying circuit 13 will be described next. FIG. 4A is a diagram illustrating an example of the configuration of the amplifying circuit 13 in this embodiment, and FIG. 4B is a timing chart illustrating switching control of the amplifying circuit 13 shown in FIG. 4A. As shown in FIG. 4A, the amplifying circuit 13 includes a voltage-follower differential amplifying circuit A1 having its output end and its inverting input terminal (−) connected to the output terminal of the circuit; a first switch group comprising n switches $S_{A1}$ to $S_{An}$ having first ends thereof connected to n selected-voltage terminals $T_1$ to $T_n$, respectively; a second switch group comprising n switches $S_{B1}$ to $S_{Bn}$ connected between respective ones of second ends of the first switch group and the non-inverting input terminal (+) of the differential amplifying circuit A1; and n capacitors $C_1$ to $C_n$ connected between respective ones of nodes of the first and second switch groups and ground.

As shown in FIGS. 4A and 4B, first, in time period $t_a$, if switches $S_{B1}$ to $S_{Bn}$ are turned OFF and switches $S_{A1}$ to $S_{An}$ are turned ON, voltages $V_{Q1}$ to $V_{Qn}$ supplied to input terminals $T_1$ to $T_n$ are stored in capacitors $C_1$ to $C_n$, respectively, via the ON switches $S_{A1}$ to $S_{An}$. If switches $S_{A1}$ to $S_{An}$ are turned OFF and switches $S_{B1}$ to $S_{Bn}$ are turned ON in the next time period $t_b$, then charge is redistributed among the capacitors $C_1$ to $C_n$. By setting the capacitance ratio of the capacitors $C_1$ to $C_n$ to the ratio $2^{n-1}:2^{n-2}:\ldots:2^0$ beforehand, the non-inverting input voltage of the voltage follower A1 becomes as follows:

$$(2^{n-1} \times V_{Q1} + 2^{n-2} \times V_{Q2} + \ldots + 2^0 \times V_{Qn})/(2^{n-1} + 2^{n-2} + \ldots + 2^0)$$

That is, the voltage is the result of taking the weighted mean of $V_{Q1}$ to $V_{Qn}$ at the ratio $2^{n-1}:2^{n-2}:\ldots:2^0$. Accordingly, the output voltage of the voltage follower A1 also becomes a voltage that is the result of taking the weighted mean of the voltages $V_{Q1}$ to $V_{Qn}$ at the ratio $2^{n-1}:2^{n-2}:\ldots:2^0$.

Figure 5A:
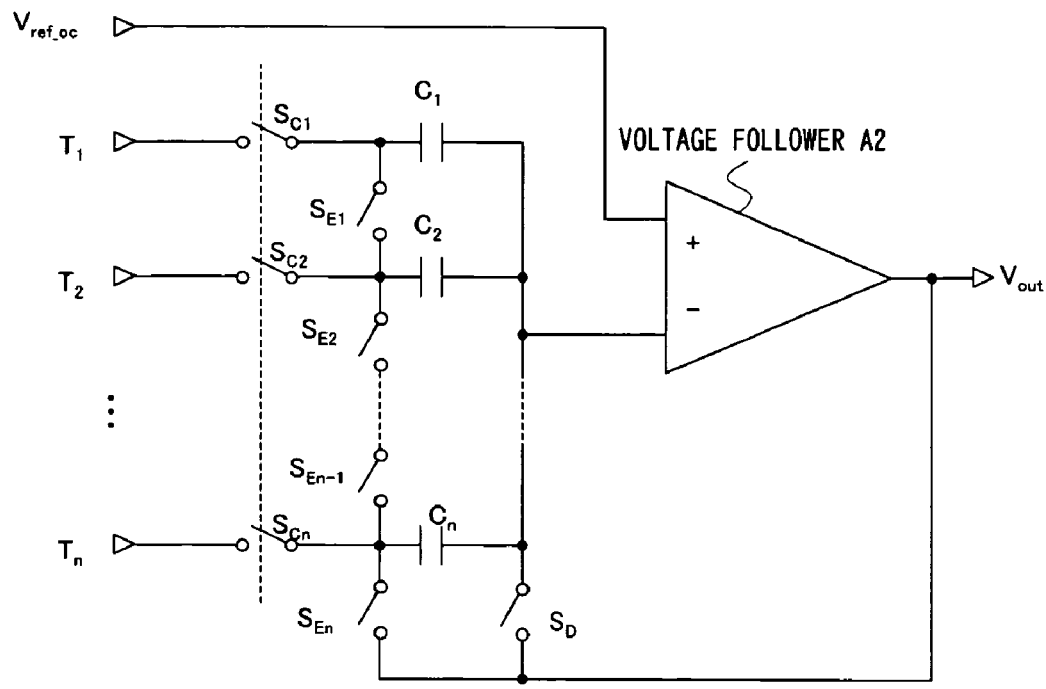
FIG. 5A is a diagram illustrating another example of the structure of an amplifying circuit according to the second embodiment of the present invention.
Figure 5B:
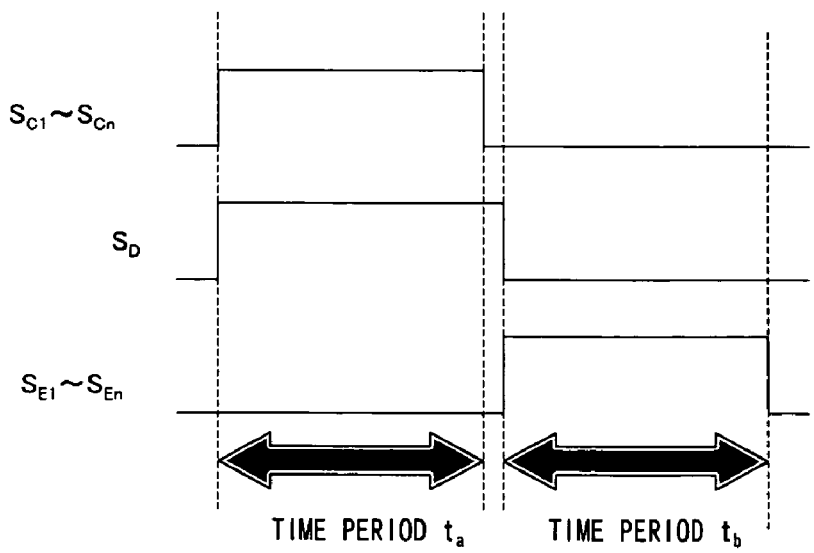
FIG. 5B is a timing chart illustrating ON/OFF control of switches in FIG. 4A.

FIG. 5A is a diagram illustrating another example of the configuration of the amplifying circuit 13 in this embodiment, and FIG. 5B is a timing chart illustrating switching control of the amplifying circuit 13 shown in FIG. 5A. The arrangement shown in FIG. 5A is capable of canceling any offset that might be produced by a voltage follower A2 due to element variance, etc. As shown in FIG. 5A, the amplifying circuit 13 includes a voltage-follower differential amplifying circuit A2 having a non-inverting input terminal (+) that receives a reference voltage $V_{ref\_oc}$ as an input, and an output end connected to output terminal $V_{out}$; a first switch group comprising first to nth switches $S_{C1}$ to $S_{Cn}$ having first ends thereof connected to n selected-voltage terminals $T_1$ to $T_n$, respectively; a second switch group comprising n−1 switches $S_{E1}$ to $S_{En-1}$ each connected between a second end of an xth switch $S_{cx}$ of the first switch group and a second end of an (x+1)th switch $S_{cx+1}$ of the first switch group (where $1<=x<=n-1$ holds); a switch $S_{En}$ connected between a second end of the nth switch $S_{Cn}$ of the first switch group and the output end of the differential amplifying circuit; a switch $S_D$ connected between the output end of the differential amplifying circuit and the inverting input terminal (−) of the differential amplifying circuit; and n capacitors $C_1$ to $C_n$ capacitors connected between second ends of the switches of the first switch group and the inverting input terminal of the differential amplifying circuit.

As shown in FIGS. 5A and 5B, first, in time period $t_a$, if switches $S_{E1}$ to $S_{En}$ are turned OFF and switches $S_{C1}$ to $S_{Cn}$ and switch $S_D$ are turned ON, voltages $V_{Q1}$ to $V_{Qn}$ supplied to input terminals $T_1$ to $T_n$ are supplied to first ends of capacitors $C_1$ to $C_n$, respectively, via the switches $S_{C1}$ to $S_{Cn}$.

On the other hand, if we let dV represent offset of the voltage follower A2, then the output of the voltage follower will be $V_{ref\_oc}+dV$ and this is supplied to the second ends of the capacitors $C_1$ to $C_n$ via the switch $S_D$. Consequently, voltages $[V_{Q1}-(V_{ref}+dV)], \ldots [V_{Qn}-(V_{ref}+dV)]$ are stored in the capacitors $C_1$ to $C_n$, respectively.

If switches $S_{C1}$ to $S_{Cn}$ and switch $S_D$ are turned OFF and switches $S_{E1}$ to $S_{En}$ are turned ON in the next time period $t_b$, then charge is redistributed among the capacitors $C_1$ to $C_n$. At the same time, the output of the voltage follower and the inverting input terminal (−) are connected via the capacitors $C_1$ to $C_n$. As a result, the offset dV is cancelled and the output of the voltage follower A2 becomes as follows:

$$[(C_1 \times V_{Q1} + C_2 \times V_{Q2} + \ldots + C_n \times V_{Qn})/(C_1 + C_2 + \ldots + C_n)]$$

By setting the capacitance ratio of the capacitors $C_1$ to $C_n$ to the ratio $2^{n-1}:2^{n-2}:\ldots:2^0$ beforehand, the output voltage of the voltage follower A2 becomes as follows:

$$(2^{n-1} \times V_{Q1} + 2^{n-2} \times V_{Q2} + \ldots + 2^0 \times V_{Qn})/(2^{n-1} + 2^{n-2} + \ldots + 2^0)$$

That is, the voltage is the result of taking the weighted mean of $V_{Q1}$ to $V_{Qn}$ at the ratio $2^{n-1}:2^{n-2}:\ldots:2^0$.

Figure 40:
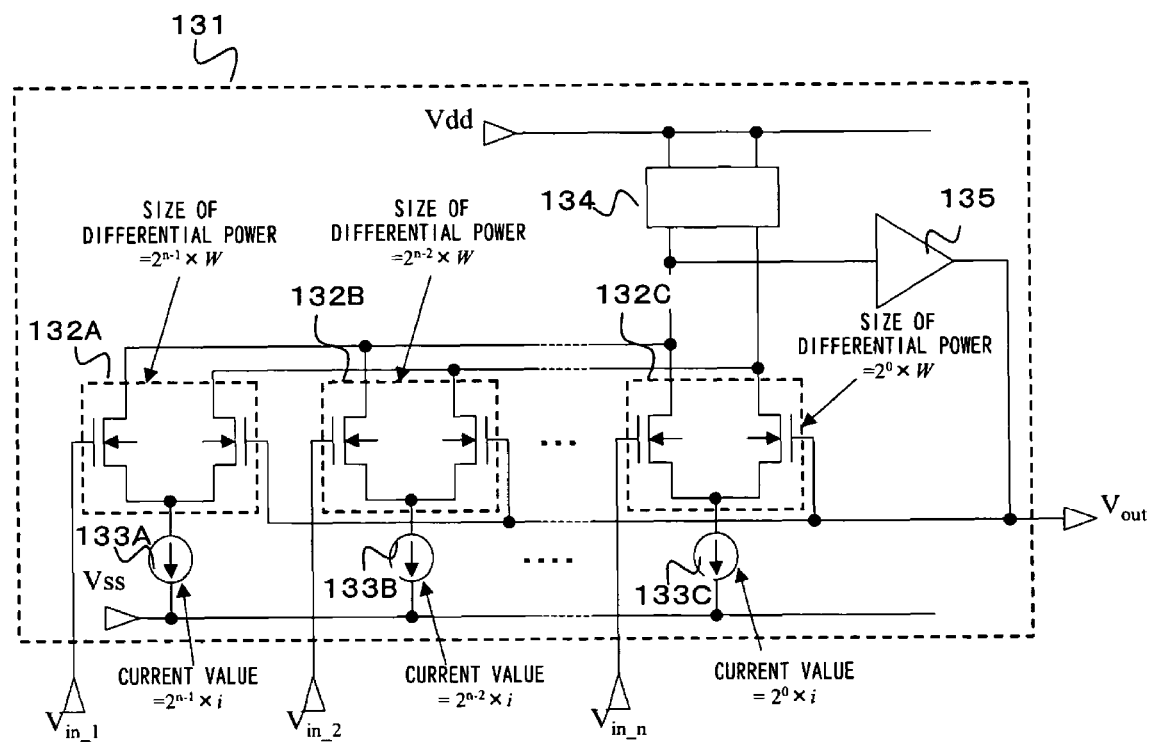
FIG. 40 is a diagram illustrating another example of the configuration of an amplifying circuit according to an embodiment of the present invention.

FIG. 40 is a diagram illustrating another example of the configuration of the amplifying circuit 13. As shown in FIG. 40, the amplifying circuit comprises a differential amplifying circuit 131 that includes at least first to nth input terminals $V_{in\_1}$ to $V_{in\_n}$; an output terminal $V_{out}$; first to nth differential pairs 132A to 132C; ith (where i is an integer and $1<=i<=n$ holds) current sources 133A to 133C that supply ith differential pairs with current; a load circuit 134 connected together in common with output pairs of the first to nth differential pairs. In an ith differential pair (where i is an integer and $1<=I<=n$ holds), one of the input pairs is connected to an ith input terminal and the other is connected to the output terminal. One of output pairs of the first to nth differential pairs are connected together in common, and the other output pairs of the first to nth differential pairs are connected together in common. The differential amplifying circuit further includes an amplifier stage 135 having an input end that is connected to a node at which the one output pairs of the first to nth differential pairs are connected together in common, and an output end connected to the output terminal. The load circuit is connected to a node at which the one output pairs of the first to nth differential pairs are connected together in common, and to a node at which the other output pairs of the first to nth differential pairs are connected together in common. In the example illustrated in FIG. 40, each differential pair is constructed by a pair of NMOS transistors whose sources are connected in common. The amplifier stage 135 may be constructed by a differential amplifier obtained by connecting a differential input pair to nodes at which the load circuit 134 and output pairs of n differential pairs are connected.

In the differential amplifying circuit 131, the sizes of the differential pairs 132A to 132C are set to $2^{n-1}:2^{n-2}:\ldots:2^0$, respectively, and the values of the currents that flow into the current sources 133A to 133C are set to $2^{n-1}:2^{n-2}:\ldots:2^0$, whereby the output $V_{out}$ of the differential amplifying circuit 131 becomes a voltage obtained by taking the weighted mean of n voltages $V_{in\_1} V_{in_{13}n}$, which are supplied to the differential amplifying circuit 131, at the ratio $2^{n-1}:2^{n-2}:\ldots:2^0$.

Figure 41:
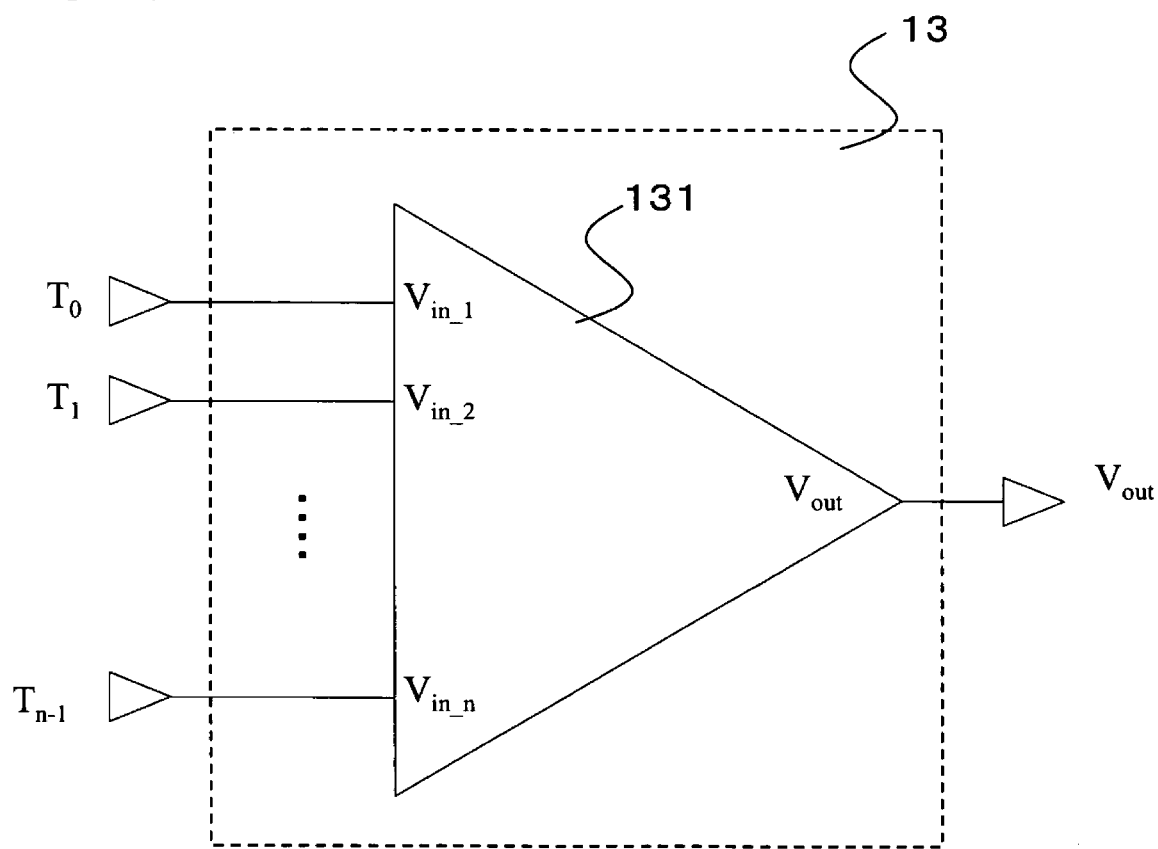
FIG. 41 is a diagram illustrating an example of the configuration of an amplifying circuit according to an embodiment of the present invention.

As illustrated in FIG. 41, the differential amplifying circuit 131 can be used in the amplifying circuit 13 of this embodiment. That is, the differential amplifying circuit 131 is capable of outputting a voltage obtained by taking the weighted mean of the n voltages $V_{Q1}$ to $V_{Qn}$, which have been output from the decoder 12, at the ratio $2^{n-1}:2^{n-2}:\ldots:2^0$.

Figure 42:
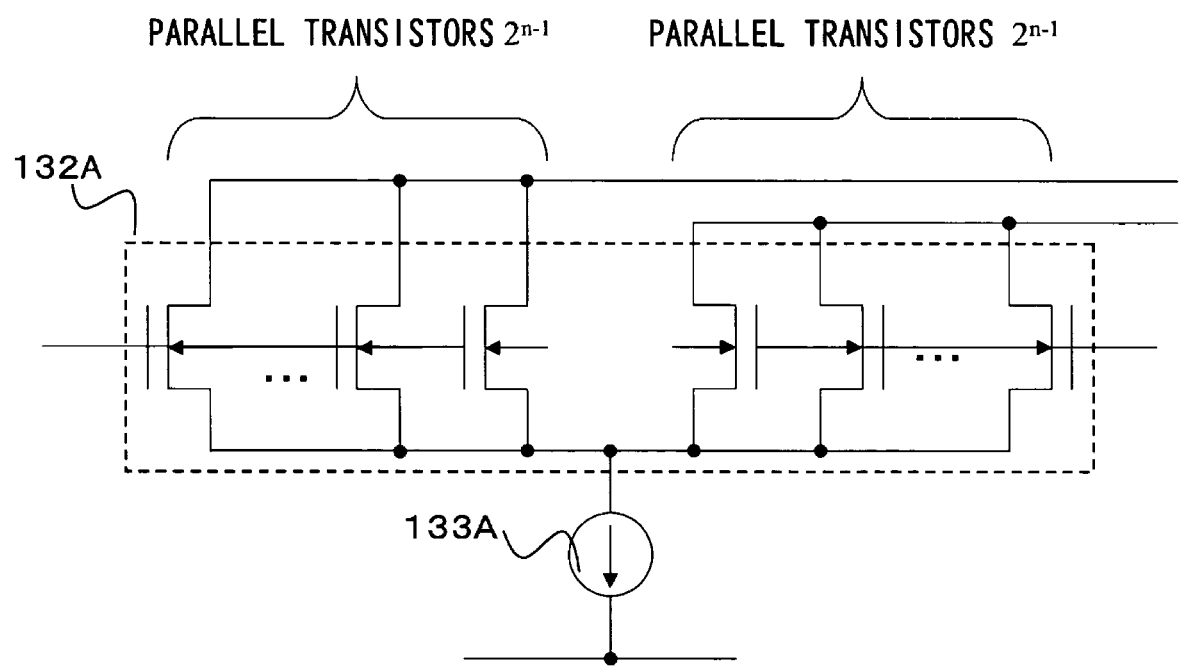
FIG. 42 is a diagram illustrating an example of the configuration of a differential amplifying circuit in FIG. 40.

It should be noted that in addition to the arrangement in which sizes of the differential pairs are set to the ratio $2^{n-1}:2^{n-2}:\ldots:2^0$, the differential pairs 132A to 132C in the differential amplifying circuit 131 may each be constructed by arraying a plurality of transistors of identical size in parallel, as illustrated in FIG. 42. More specifically, as shown in FIG. 42, the differential pair 132A (which corresponds to the differential pair 132A in FIG. 40) includes $2^{n-1}$ NMOS transistors having drains connected in common and connected to a node at which a first end of the load circuit 134 (see FIG. 40) and the input end of the amplifier stage 135 (see FIG. 40) are connected, and gates to which the input voltage $V_{in\_1}$ is input, and $2^{n-1}$ NMOS transistors having drains connected in common and connected to the second end of the load circuit 134 (see FIG. 40), and gates to which the output signal $V_{out}$ is input. The sources of these $2^{n-1}$ pairs of NMOS transistor pairs are connected in common and are connected to the current source 133A (current value=$2^{n-1} \times i$). In the differential pair 132A, the size of the differential pair 132A is essentially $2^{n-1} \times W$, where W represents the channel width of one NMOS transistor. Similarly, the differential pair 132B includes $2^{n-2}$ NMOS transistors having drains connected in common and connected to a node at which the first end of the load circuit 134 (see FIG. 40) and the input end of the amplifier stage 135 (see FIG. 40) are connected, and gates to which the input signal $V_{in\_2}$ is input, and $2^{n-2}$ NMOS transistors having drains connected in common and connected to the second end of the load circuit 134 (see FIG. 40), and gates to which the output signal $V_{out}$ is input. The sources of these $2^{n-2}$ pairs of NMOS transistor pairs are connected in common and are connected to the current source 133B (current value=$2^{n-2} \times i$). The size of the transistor pair 132B is essentially $2^{n-2} \times W$. The differential pair 133C includes one NMOS transistor having a drain connected to the node at which the first end of the load circuit 134 (FIG. 40) and the input end of the amplifier stage 135 (FIG. 40) are connected, and a gate to which the input signal $V_{in\_n}$ is input, and one NMOS transistor having a drain connected to the second end of the load circuit 134 (FIG. 40) and a gate to which the output signal $V_{out}$ is input. The sources of the NMOS transistor pair of this pair (=$2^0$ pair) are connected in common and are connected to current source 133C (current value=$2^0 \times i$. The size of this differential pair 132C is essentially $2^0 \times W$. In this case, the transistors constructing the differential pairs 132A to 132C are all of the same size and therefore the precision of the weighted mean can be somewhat improved.

It should be noted that the amplifying circuit 13 is not limited to the example of structure described above. Any structure will suffice so long as it is possible to output a voltage obtained by taking the weighted mean of the voltages $V_{Q1}$ to $V_{Qn}$ at the ratio $2^{n-1}:2^{n-2}:\ldots:2^0$.

Next, an example of the configuration of the decoder 12 will be described. FIG. 6 is a diagram illustrating a specific example of the configuration of the decoder 12 according to this embodiment. As illustrated in FIG. 6, the decoder 12 receives an (n×k)-bit (where k is an integer and k>=2 holds) digital signal and the m (=$2^k$) reference voltages as inputs and includes n selected-voltage output terminals and n sub-decoders 121. The sub-decoders each receive the m reference voltages as inputs and output one voltage from among the m reference voltages based upon one group of digital signals from among bit groups $BG_1$ to $BG_n$ obtained by dividing the digital signal into n groups of k digital signals each. Further, n outputs of the sub-decoders 121 are connected to respective ones of the n selected-voltage output terminals $T_1$ to $T_n$. The decoder selects, and outputs to the n selected-voltage output terminals $T_1$ to $T_n$, the n (n>=3) identical or different voltages from among the m reference voltages based upon the digital signal.

Division into the bit groups may be performed as illustrated in FIG. 36 by way of example.

Figure 7:
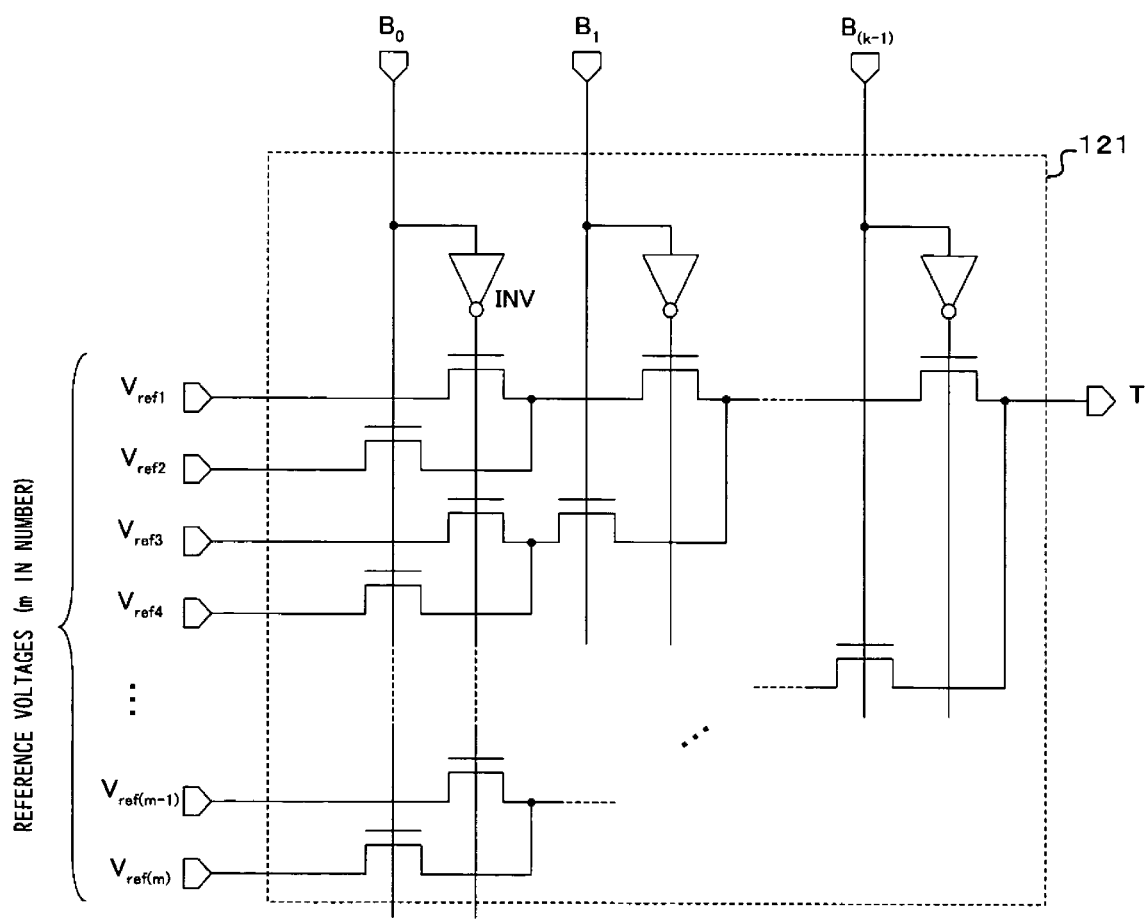
FIG. 7 is a diagram illustrating an example of the structure of a sub-decoder according to the present invention.

The configuration of the sub-decoders 121 will be described next. FIG. 7 is a diagram illustrating a specific example of the sub-decoder 121. As shown in FIG. 7, the sub-decoder 121 receives m reference voltages $V_{ref1}$ to $V_{refm}$ and a bit group comprising k digital signals [$B_0$ to $B_{(k-1)}$] and has one output terminal T. Signals obtained by inverting the digital signals of the bit groups will be expressed by $B_{0B}$, $B_{1B}, \ldots, B_{(k-1)B}$ below.

In order to describe the connection relationship of the decoder 12, the symbols and functions set forth below are introduced. That is, let w, y be integers (where 1<=w<=m, 0<=y<=k-1 hold), and let SigN(D,p,q) be a function that returns DB (the complementary signal of D) when the remainder of p-1 divided by $2^{(q+1)}$ is less than $2^q$, and returns D otherwise.

With regard to m paths connecting the m reference voltages $V_{ref1}$ to $V_{refm}$ input to the sub-decoder 121 and the single output terminal T that outputs the selected voltage, a wth reference voltage $V_{refw}$ and the output terminal T are connected via k switches controlled by respective ones of k control signals sigN[B(0),w,0], sigN[B(1),w,1], ..., sigN[B(y),w,y], ..., sigN[B(k-1),w,k-1].

Figure 33:
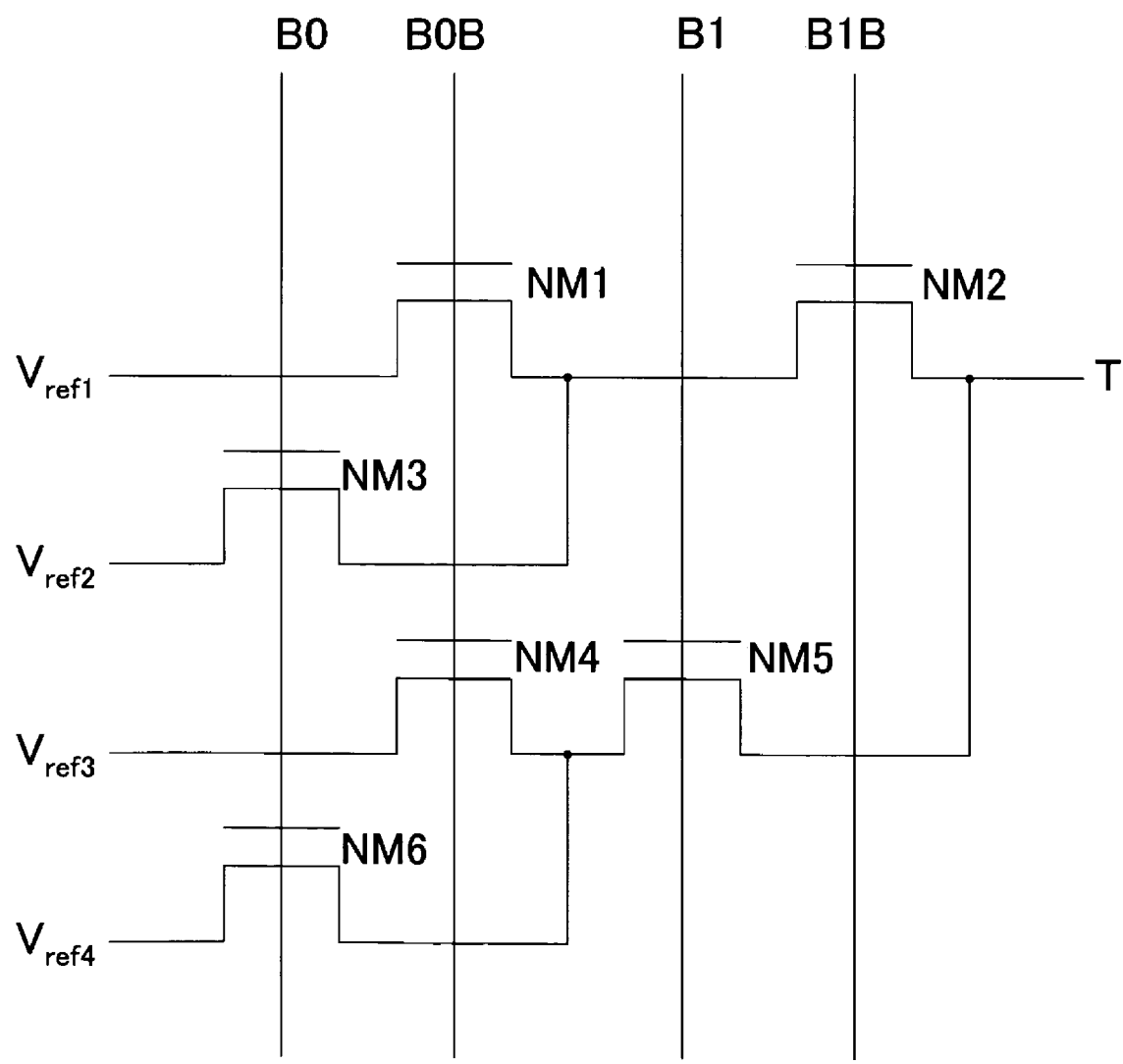
FIG. 33 is a diagram illustrating an example of an arrangement in a case where m=4 holds in a sub-decoder according to the present invention.
Figure 34:
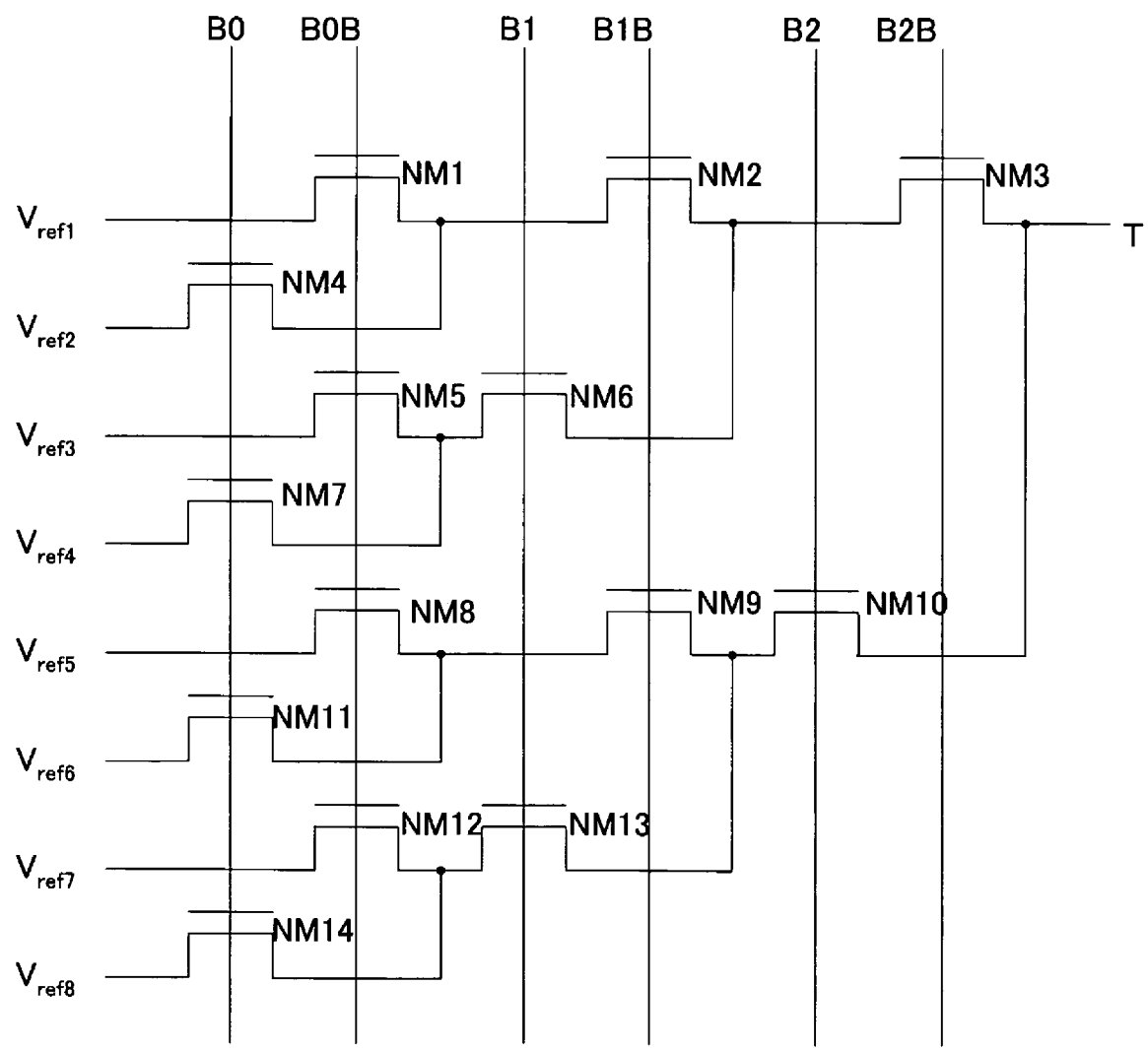
FIG. 34 is a diagram illustrating an example of an arrangement in a case where m=8 holds in a sub-decoder according to the present invention.

FIGS. 33 and 34 illustrate examples of the configuration of the sub-decoder 121 in a case where there are four reference voltages (m=4) and eight reference voltages (m=8), respectively. FIGS. 33 and 34 illustrate decoders of 2-bit and 3-bit tournament types, respectively. In the example shown in FIG. 33, the decoder has two path transistors NM1, NM2 provided between the terminal T and voltage $V_{ref1}$ and turned ON and OFF by B0B and B1B, respectively; a path transistor NM3 provided between the connection node of path transistors NM1, NM2 and $V_{ref2}$ and turned ON and OFF by B0; two path transistors NM4, NM5 provided between the terminal T and $V_{ref3}$ and turned ON and OFF by B0B and B1, respectively; and a path transistor NM6 provided between the connection node of path transistors NM3, NM4 and $V_{ref4}$ and turned ON and OFF by B0.

The path transistors NM1 to NM14 in FIGS. 33 and 34 are all constituted by NMOS transistors.

PMOS transistors may also be used as the path transistors that construct the sub-decoder. In this case, the logic of the input k-bit digital signal would be the opposite of the logic in the case where NMOS transistors are used. For instance, taking FIG. 33 as an example, B0 and B0B would be reversed, and B1 and B1B would be reversed.

Figure 35:
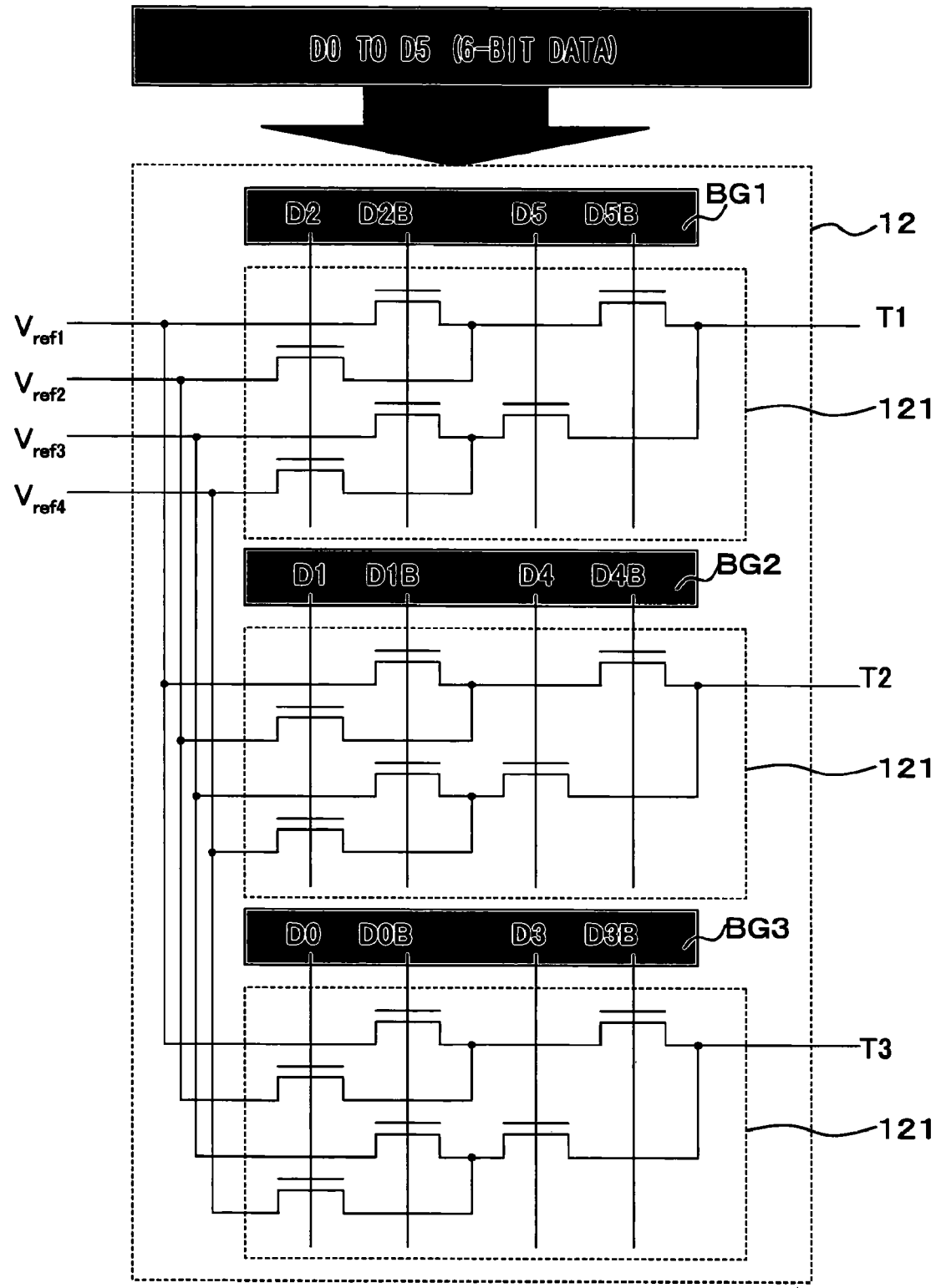
FIG. 35 is a diagram illustrating an example of the structure of a decoder in a case where m=4, n=3 holds in the present invention.
Figure 37:
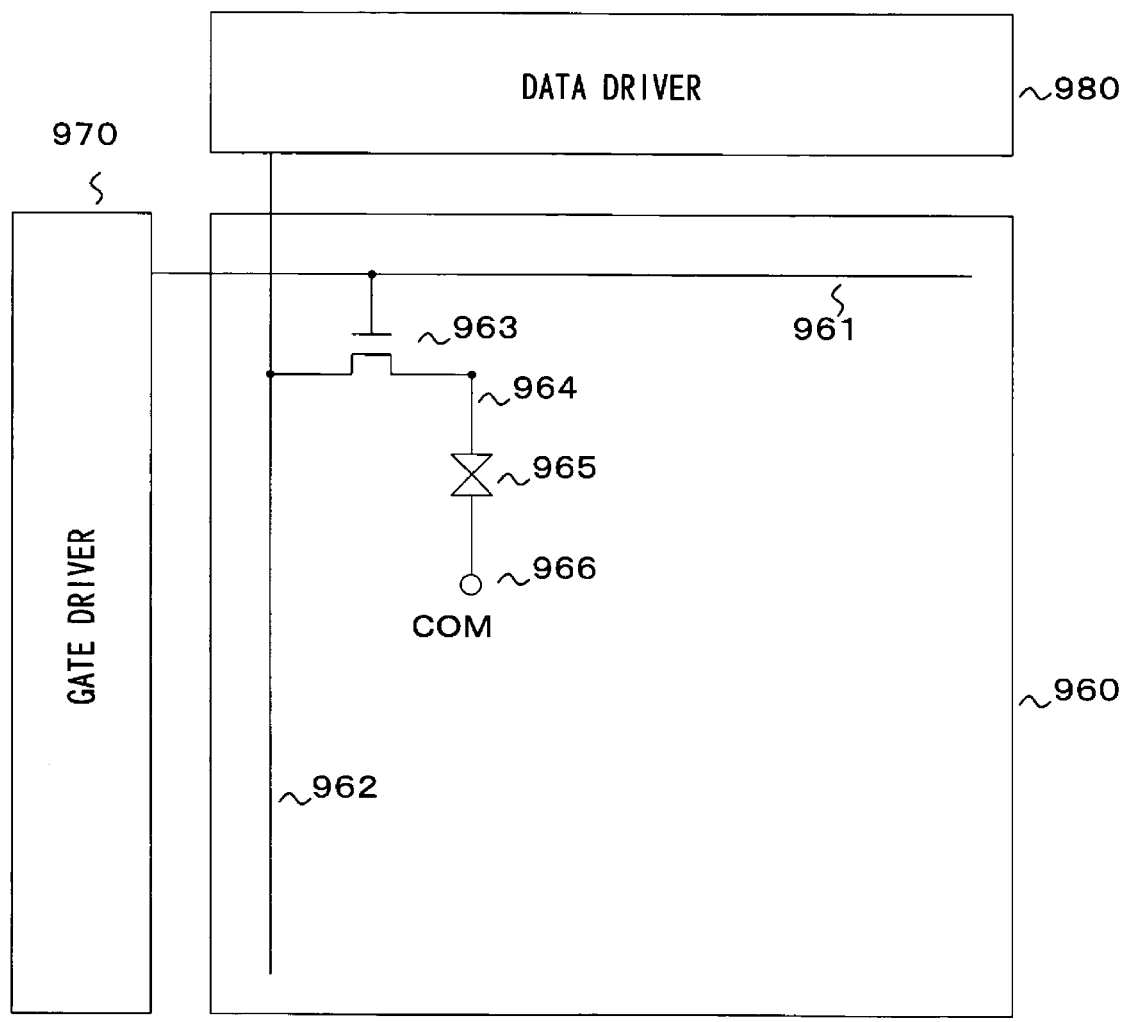
FIG. 37 is a diagram illustrating the configuration of an active-matrix liquid crystal display device.

Further, FIG. 35 illustrates an example of the configuration of decoder 12 in a case where the arrangement of FIG. 33 is applied to the sub-decoder 121 for a case where there are four reference voltages and the decoder 12 has three output terminals $T_1$, $T_2$ and $T_3$, i.e., in a case where m=4, n=3 holds. In this example, 6-bit data (D0 to D5) is input and three sub-decoders 121 are provided in view of the face that n=3 holds.

Further, if the 6-bit data is divided into bit groups in accordance with FIG. 36, then the three groups will be as follows:

$BG_1$=[D2,D5];

$BG_2$=[D1,D4]; and $BG_3$=[D0,D3].

If these bit groups are input to respective ones of the three sub-decoders 121, then 64 voltages, inclusive of voltages that may be identical, are selected from the four reference voltages $V_{ref1}$ to $V_{ref4}$) in accordance with the 6-bit data, and the selected voltages are supplied to the three output terminals $T_1$, $T_2$ and $T_3$.

Figure 8:
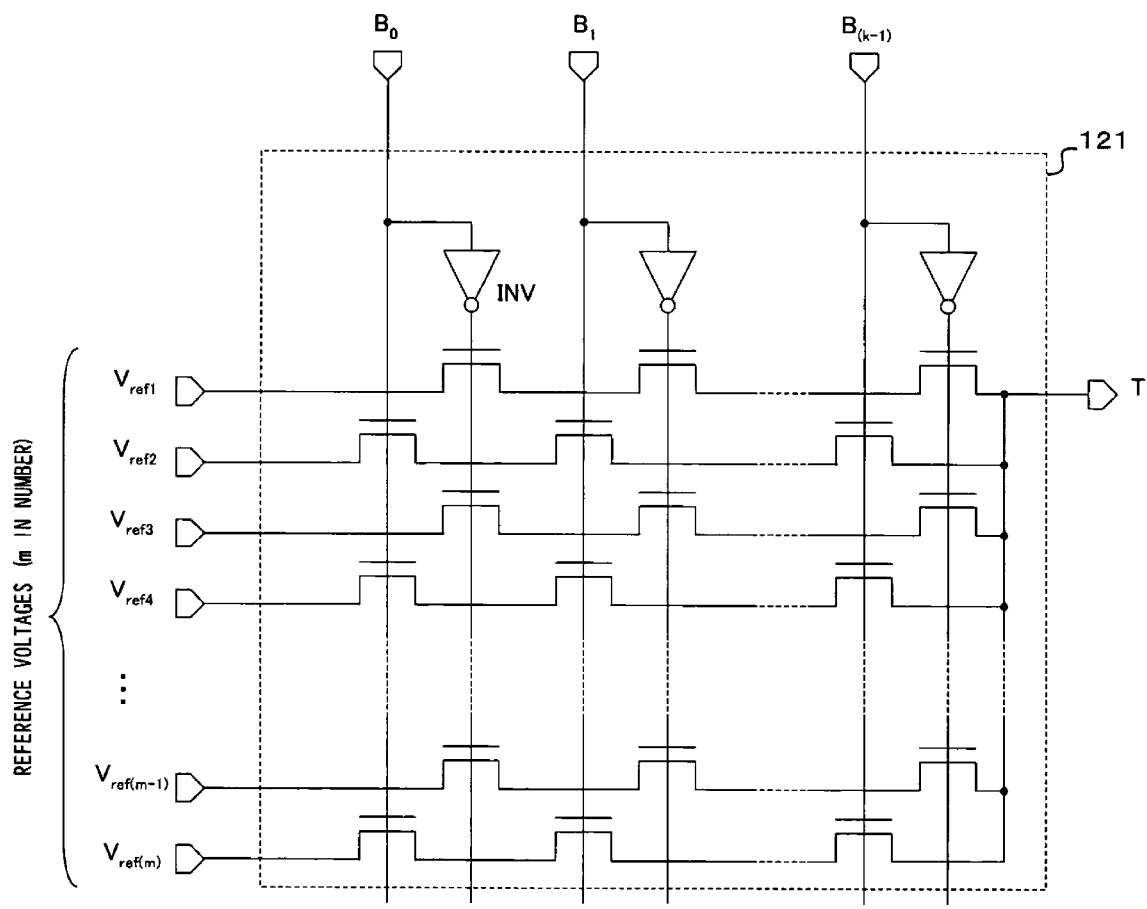
FIG. 8 is a diagram illustrating another example of the structure of a sub-decoder according to the present invention.

The arrangements shown in FIG. 7 and in FIGS. 33 to 35 are examples, and any arrangement may be adopted so long as the connection relationship illustrated above holds. Although tournament-type decoders are illustrated in FIG. 7 and in FIGS. 33 to 35, it is permissible to adopt an arrangement (of ROM type) in which the connections between the m reference voltages and output terminal are all made independent paths. However, the arrangement of FIG. 8 has a greater number of switches than the arrangement shown in FIG. 7.

Another example of the configuration of the sub-decoder 121 will be described. FIG. 9 is a diagram illustrating a specific example of the configuration of the sub-decoders 121 shown in FIG. 6. As shown in FIG. 9, the sub-decoder 121 receives m reference voltages and a bit group comprising a k-bit digital signal as inputs thereto, and has a single output terminal T. The sub-decoder 121 further includes a switch circuit 1212 for selecting one of the m reference voltages, and a switch control circuit 1211 for outputting a signal that controls the switch circuit 1212 in accordance with the k-bit digital signal. One of the m reference voltages is selected and output by the k-bit digital signal of the bit group.

Figure 10:
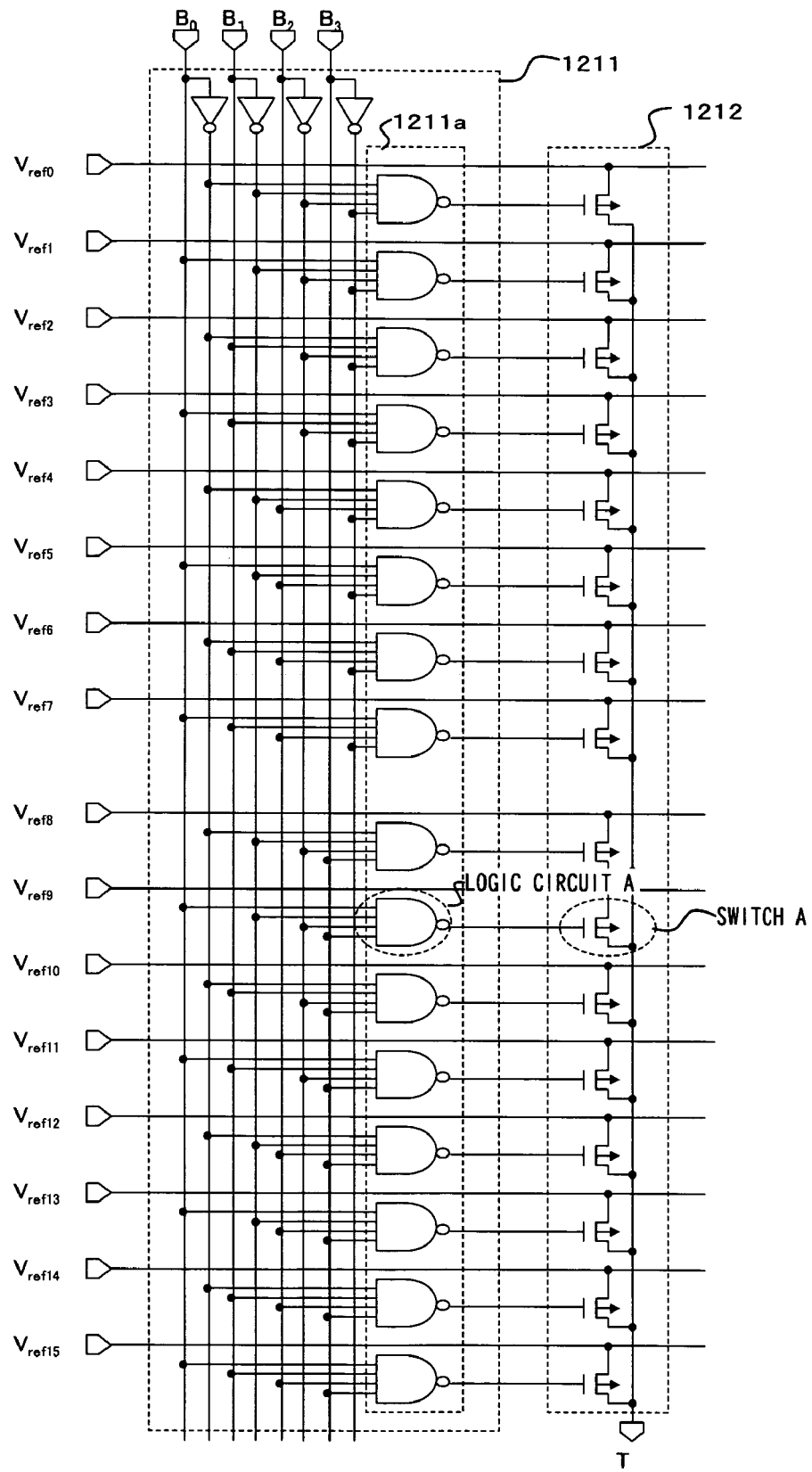
FIG. 10 is a diagram illustrating an example of the structures of a switch control circuit and switch circuit according to the present invention.

The switch control circuit 1211 and switch circuit 1212 of FIG. 9 will be described in greater detail. FIG. 10 is a diagram illustrating a specific example of the structures of the switch control circuit 1211 and switch circuit 1212 shown in FIG. 9. For the sake of simplicity, FIG. 10 illustrates an arrangement in which k=4 holds and the number of input reference voltages is $m=2^k=16$ ($V_{ref0}$ to $V_{ref15}$).

As shown in FIG. 10, the switch control circuit 1211 receives the k-bit digital signal of the bit group as an input and includes $2^k$ (16) logic circuits 1211a. Each logic circuit receives a digital signal Bx or a complementary signal BxB thereof ($0<=x<=k-1$) per bit of the bit group and turns a switch (a PMOS switch) ON only in a case where the input k signals are all HIGH. The $2^k$ logic circuits 1211a differ from one another in terms of the combination of logic of the signals that are input thereto.

In the example of FIG. 4, k=4 holds. Accordingly, a 4-bit digital signal (B0 to B3) is input. With regard to each of the bits of B0 to B3, either Bx or the complementary signal BxB thereof ($0<=x<=3$) is supplied to the $2^4=16$ logic circuits (NAND gates). With regard to B0 to B3, combinations of bit signal Bx or the complementary signal BxB thereof are 16 in total, and the setup is such that the digital signals that are input to each of the logic circuits 1211a will form combinations that differ from one another.

If NAND gates are used as the logic circuits 1211a, as illustrated in FIG. 10, then, with respect to certain input bit data, only one among the $2^k$ NAND gates will deliver an output of LOW level. Accordingly, a signal that selects one of the m ($=2^k$) reference voltages can be output by k-bit data.

Further, as shown in FIG. 10, the switch circuit 1212 is such that m paths connecting the m reference voltages and the output T of the sub-decoder are connected via switches that change over ON/OFF of the connection of the reference voltages to the output, and the switches are controlled by respective ones of switch control signals that have been output by the switch control circuit 1211.

By way of example, if the bit data of the bit group is (B0, B1, B2, B3)=(1, 0, 0, 1) in FIG. 10, then only the output of the logic circuit (logic circuit A in FIG. 10) whose inputs are B0, the complementary signal (B1B) of B1, the complementary signal (B2B) of B2 and B3 will take on the LOW level, and the outputs of the remaining logic circuits will take on the HIGH level.

In the example illustrated in FIG. 10, PMOS transistors are used as the switches of the switch circuit 1212. When the gate voltage of the PMOS transistor is at the LOW level, the switch is ON, and when the gate voltage is at the HIGH level, the switch is OFF. Accordingly, among the 16 switches, only the switch (switch A of FIG. 10) to which $V_{ref9}$ is connected turns ON, and the remaining switches turn OFF. The output of the sub-decoder 121 (the potential at terminal T), therefore, is $V_{ref9}$.

Figure 11:
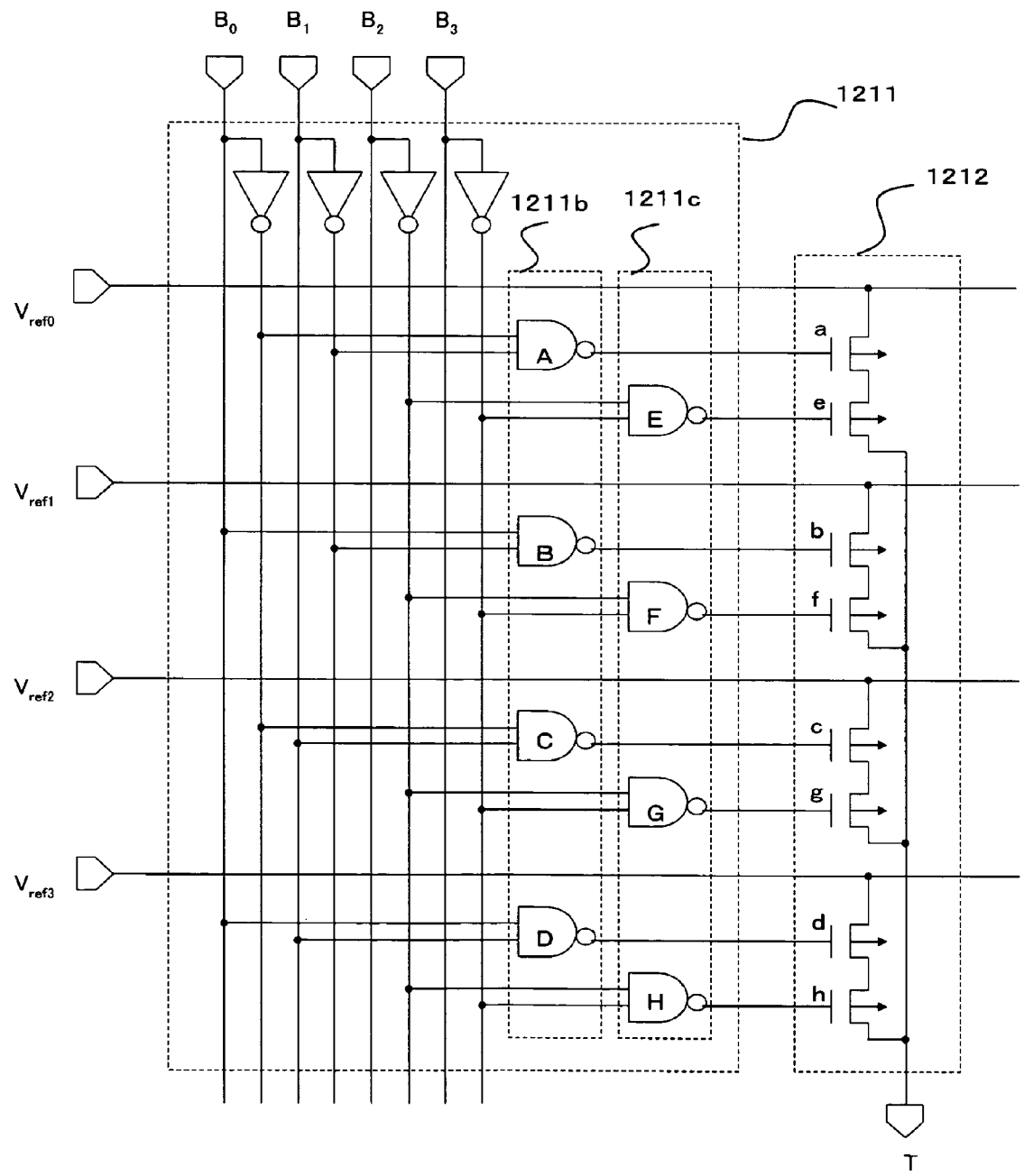
FIG. 11 is a diagram illustrating another example of the structures of a switch control circuit and switch circuit according to the present invention.

Next, another example of the structures of switch control circuit 1211 and switch circuit 1212 will be described. In the example of FIG. 10, NAND gates are employed as the logic circuits. In general, however, if the number of NAND gates increases, driving capability declines. This makes it necessary to enlarge transistor size. Accordingly, it is possible to adopt an arrangement in which the k-bit signal that is supplied to the logic circuits is further divided into U sub-bit groups each containing two or more bits, and a logic circuit is provided for every sub-bit group. In the example depicted in FIG. 10, the four signals B0 to B3 are input to each NAND gate. In FIG. 11, however, the signals B0 to B3 are divided into (B0,B1) and (B2,B3), and each NAND gate is divided into a NAND gate 1211b to which (B0,B1) are input and a NAND gate 1211c to which (B2,B3) are input.

It should be noted that in FIG. 11, only the first three reference voltages $V_{ref0}$ to $V_{ref3}$ of the 16 reference voltages are shown, and the remaining reference voltage are not illustrated. The circuit arrangement is similar with regard to the remaining reference voltages $V_{ref4}$ to $V_{ref15}$.

Further, in the example illustrated in FIG. 10, the outputs of the logic circuits 1211a are connected to respective ones of the single switches. If each of these logic circuits is divided into the two NAND gates, namely the NAND gate 1211b to which B0, B1 are input and the NAND gate 1211c to which B2, B3 are input, as illustrated in FIG. 11, then each switch also is divided into two switches and these are connected in series.

If (B0, B1, B2, B3)=(0, 1, 0, 0), for example, holds in FIG. 11, then the outputs C, E, F, G and H take on the LOW level and the remaining outputs take on the HIGH level among the logic circuits A to H in FIG. 11.

In FIG. 11, therefore, switches c, e, f, g and h among the switches a to h turn ON. A path, in which two serially connected switches turn ON, from a reference voltage to the output terminal T of the sub-decoder is solely the path through switches c and g, namely the path of reference voltage $V_{ref2}$. Accordingly, the output of the sub-decoder 121 is $V_{ref2}$.

With regard to a plurality of logic circuits for which input sub-bit groups, inclusive of logic (B0 and B0B, etc.), are identical within the same sub-decoder, these may be eliminated with the exception of at least one, and the switches connected to the outputs of the deleted logic circuits may be connected to the output of a logic circuit that is not eliminated.

Figure 12:
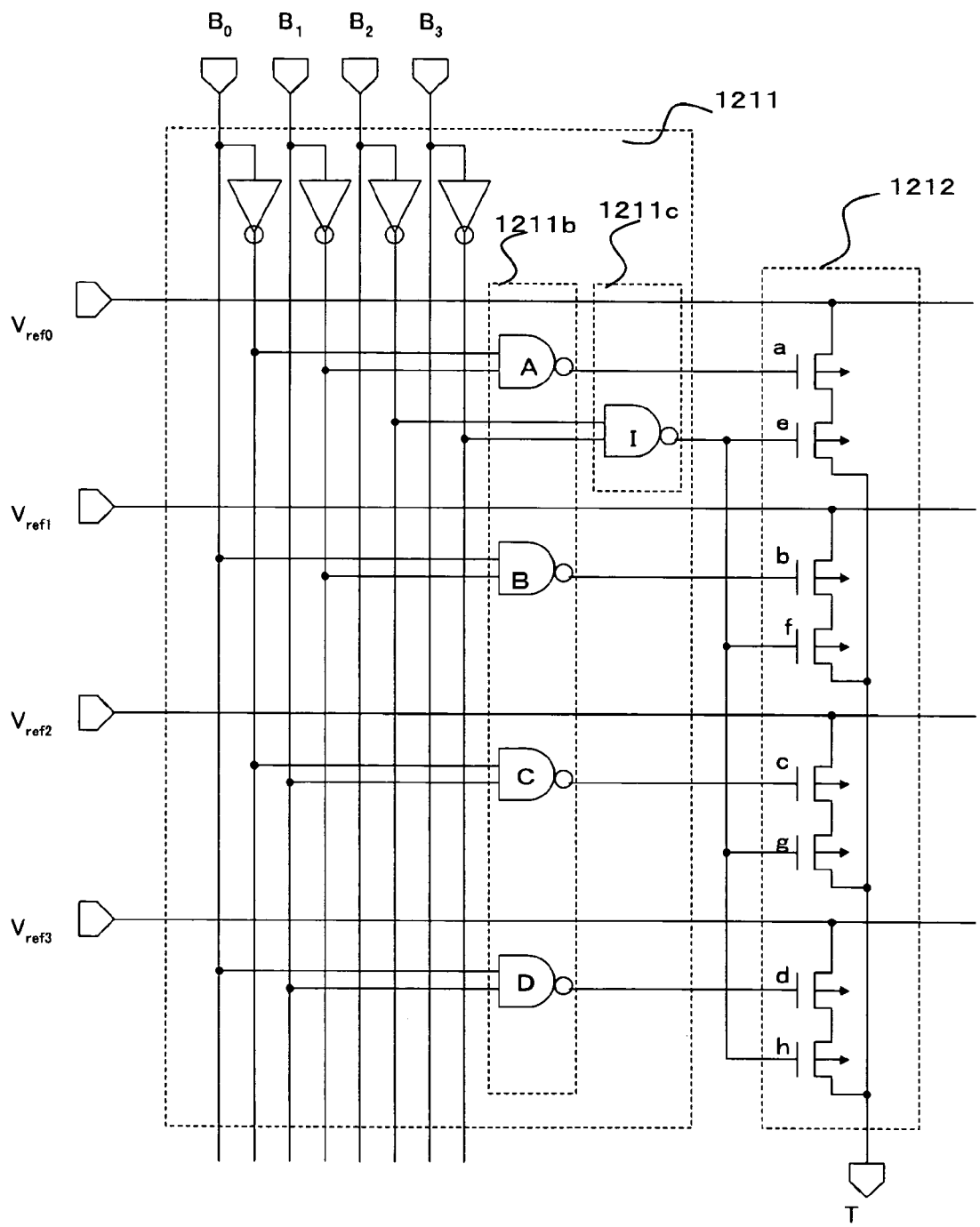
FIG. 12 is a diagram illustrating another example of the structures of a switch control circuit and switch circuit according to the present invention.

For example, in FIG. 11, logic circuits E, F, G, H among the logic circuits A to H all receive B2B and B3B as inputs and their outputs are always the same. This means that these logic circuits can be eliminated with the exception of one, as illustrated in FIG. 12. The output of a logic circuit I in FIG. 12 in such case is connected in common with the switches e, f, g. Adopting this expedient makes it possible to reduce the number of elements in the switch control circuit 1211.

Furthermore, in FIG. 12, the arrangement is such that switches e, f, g and h have either ends thereof, namely either their entrance or exit ports (either their sources or drains) connected in common and have their switch control ends (the gates of the transistors) connected in common. In this case the other ends of the four switches, namely the other of the entrance or exit ports, (the terminals not connected in common) can be made common to thereby form one switch.

Figure 13:
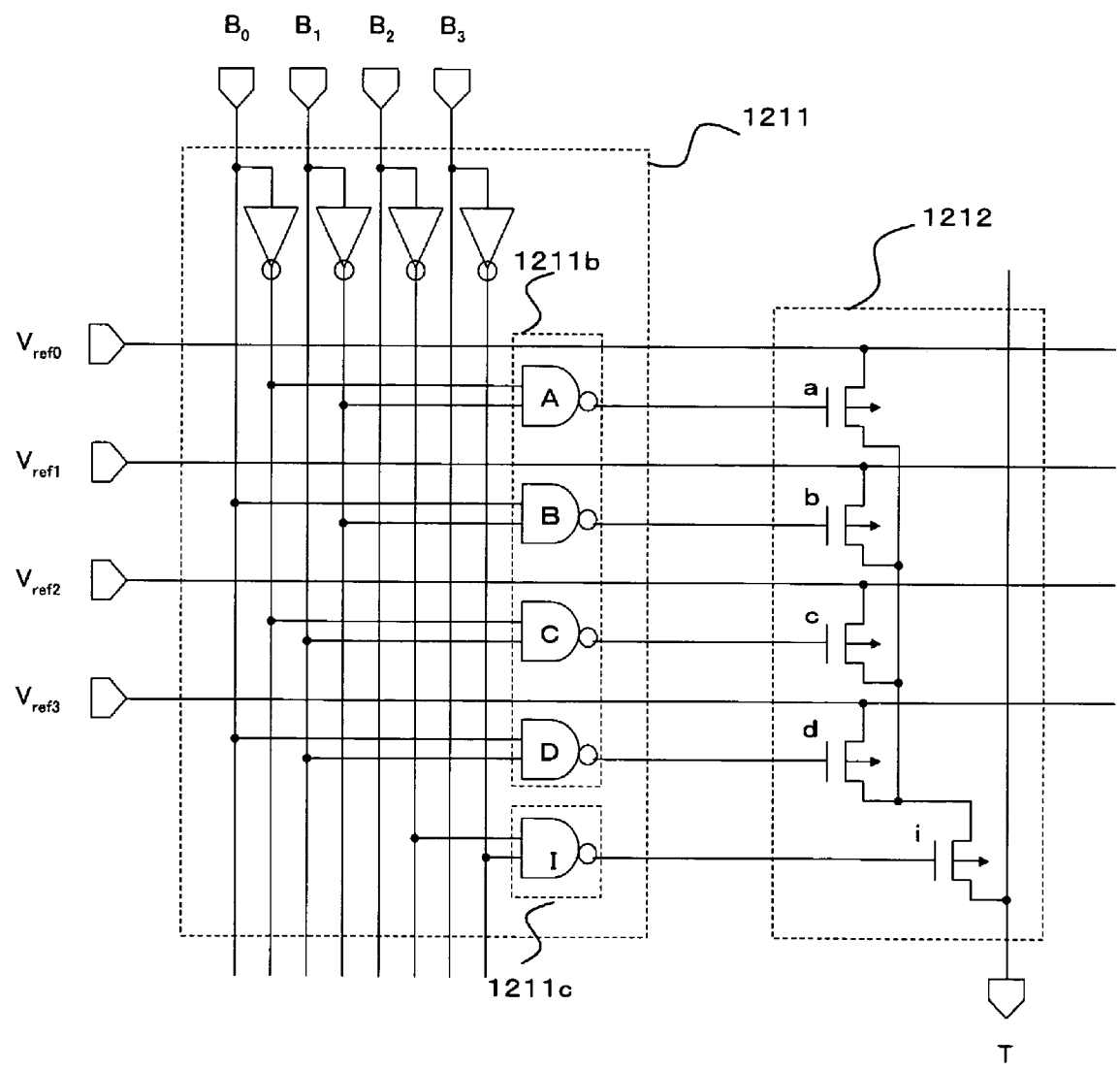
FIG. 13 is a diagram illustrating another example of the structures of a switch control circuit and switch circuit according to the present invention.

FIG. 13 illustrates the structure obtained by making the switches e, f, g and h of FIG. 11 a single switch i by common connection. Adopting this expedient also makes it possible to reduce the number of elements of the switch circuit.

Figure 14:
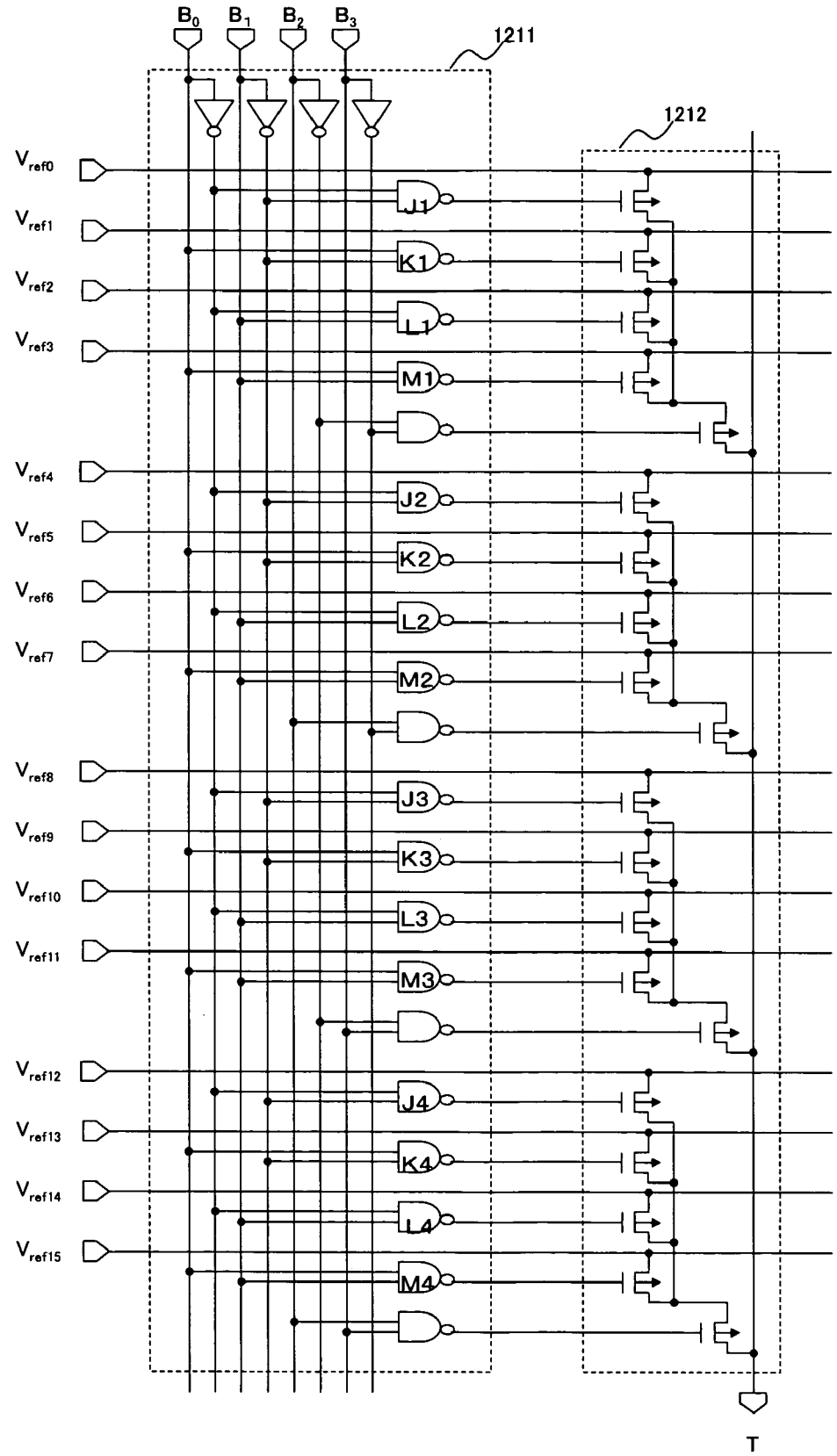
FIG. 14 is a diagram illustrating another example of the structures of a switch control circuit and switch circuit according to the present invention.

FIG. 14 is a diagram in which the operation described earlier in the specification is applied to all of the reference voltages $V_{ref0}$ to $V_{ref15}$.

The following will be understood from FIG. 14:

the inputs of logic circuits J1, K1, L1 and M1 are all B0B and B1B;

the inputs of logic circuits J2, K2, L2 and M2 are all B0 and B1B;

the inputs of logic circuits J3, K3, L3 and M3 are all B0B and B1; and the inputs of logic circuits J4, K4, L4 and M4 are all B0 and B1.

Figure 15:
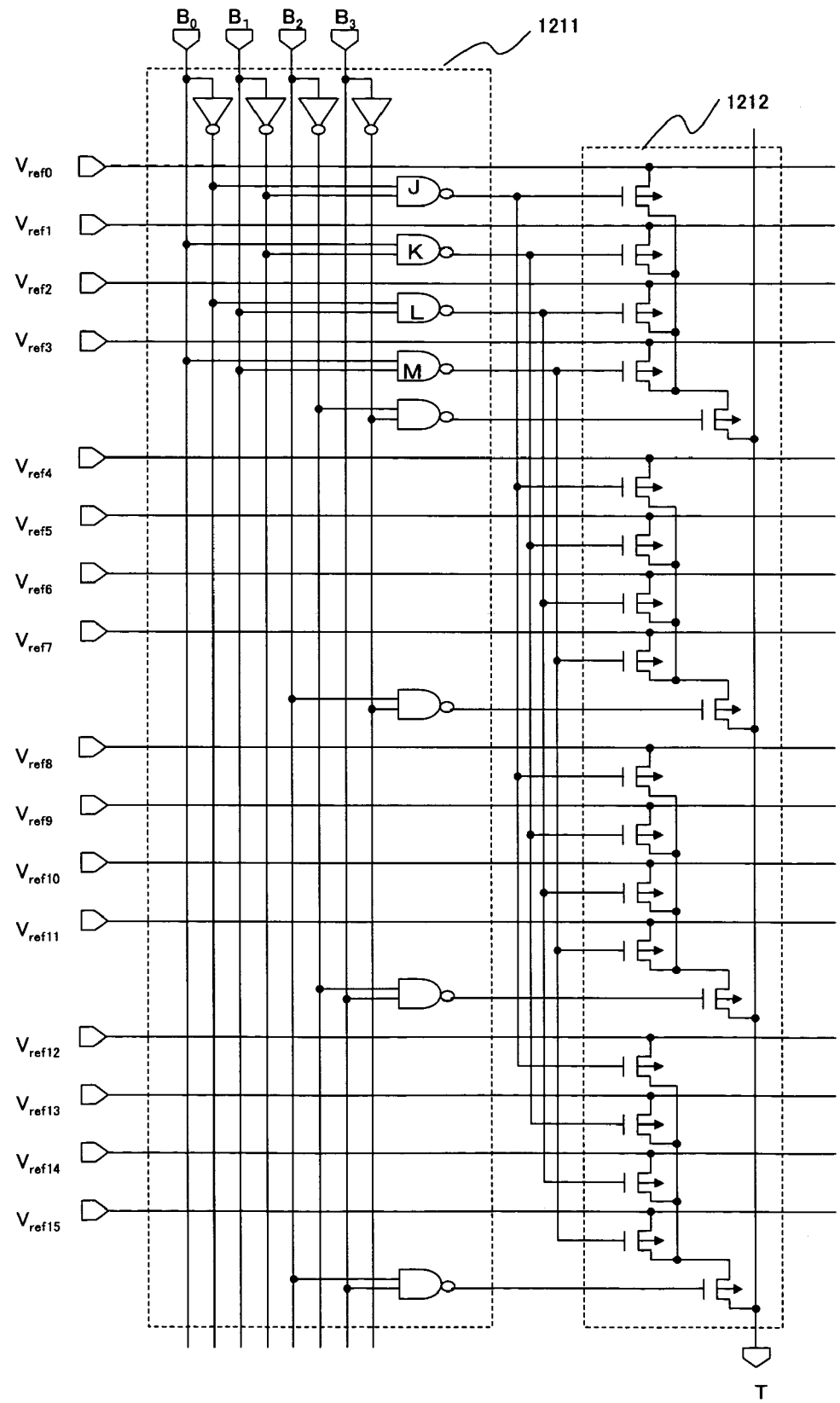
FIG. 15 is a diagram illustrating another example of the structures of a switch control circuit and switch circuit according to the present invention.

Accordingly, as described earlier in the specification, these logic circuits can be eliminated with the exception of one and can be unified to logic circuits J, K, L and M, respectively, in FIG. 15 by common connection. The logic circuit J of FIG. 15 is the result of unifying logic circuits J1, K1, L1 and M1 of FIG. 14 by common connection, the logic circuit K of FIG. 15 is the result of unifying logic circuits J2, K2, L2 and M2 of FIG. 14 by common connection, logic circuit L of FIG. 15 is the result of unifying logic circuits J3, K3, L3 and M3 of FIG. 14 by common connection, and logic circuit M of FIG. 15 is the result of unifying logic circuits J4, K4, L4 and M4 of FIG. 14 by common connection. Adopting this expedient makes it possible to reduce the number of elements in the switch control circuit.

Although FIGS. 10 to 15 illustrate examples in which NAND gates are used as the logic circuits and PMOS transistors as the switches, arrangements other than these may be adopted for the logic circuits and switches.

Figure 16:
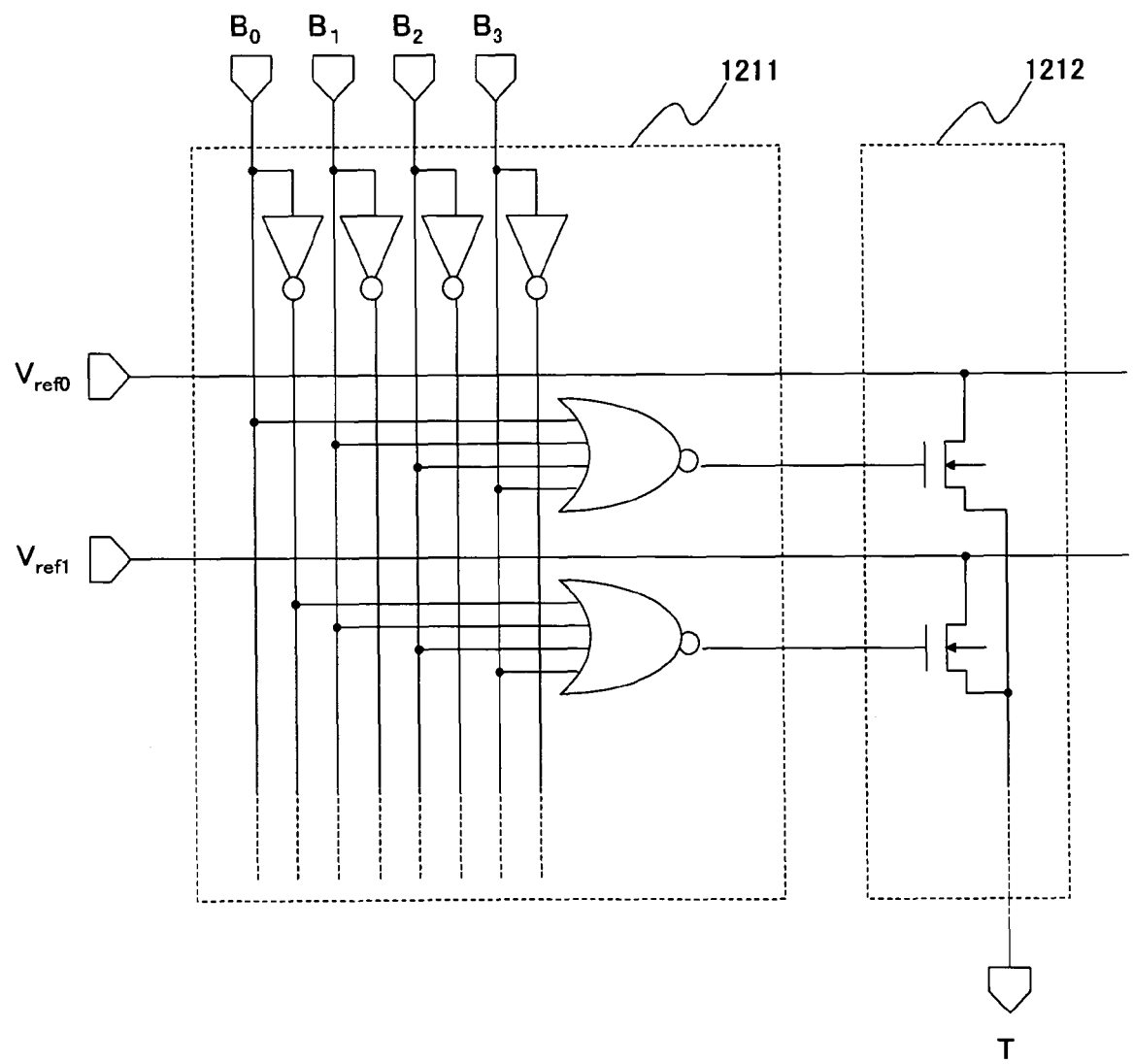
FIG. 16 is a diagram illustrating a specific example of a switch in the switch circuit according to the present invention.

FIG. 16 illustrates an example in which NOR gates are used as logic circuits and NMOS transistors as switches. In a case where NOR gates are used as the logic circuits, the output of the NOR gate is H if the bit signals input to the NOR gate are all L. Accordingly, only one among $k^2$ NOR gates will output the HIGH level with respect to certain input bit data, and therefore only one NMOS transistor of the switch circuit will turn ON.

Figure 17:
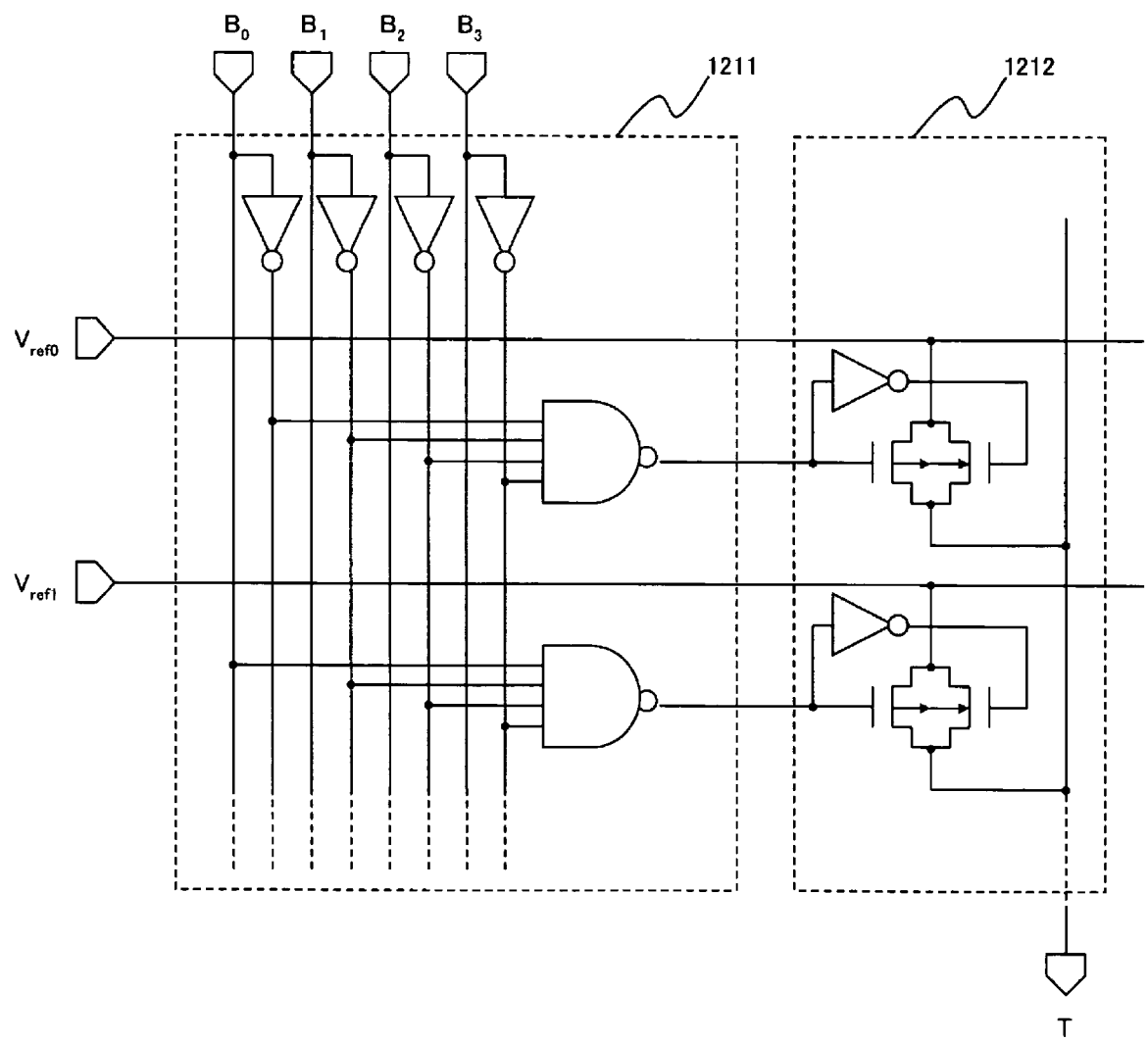
FIG. 17 is a diagram illustrating another specific example of a switch in the switch circuit according to the present invention.

FIG. 17 illustrates an example in which NAND gates are used as logic circuits and CMOS switches, which include a PMOS transistor and an NMOS transistor, are used as switches. Each logic circuit (NAND gate) in the example of FIG. 17 outputs the LOW level if the bit signals input thereto are all at the HIGH level. Accordingly, only one among $k^2$ NAND gates will output the LOW level with respect to certain input bit data.

Accordingly, if the output of the NAND gate is connected to the PMOS transistor of the switch circuit and a signal obtained by inverting the signal from the NAND gate is connected to the NMOS transistor, only one CMOS switch will turn ON.

Figure 18:
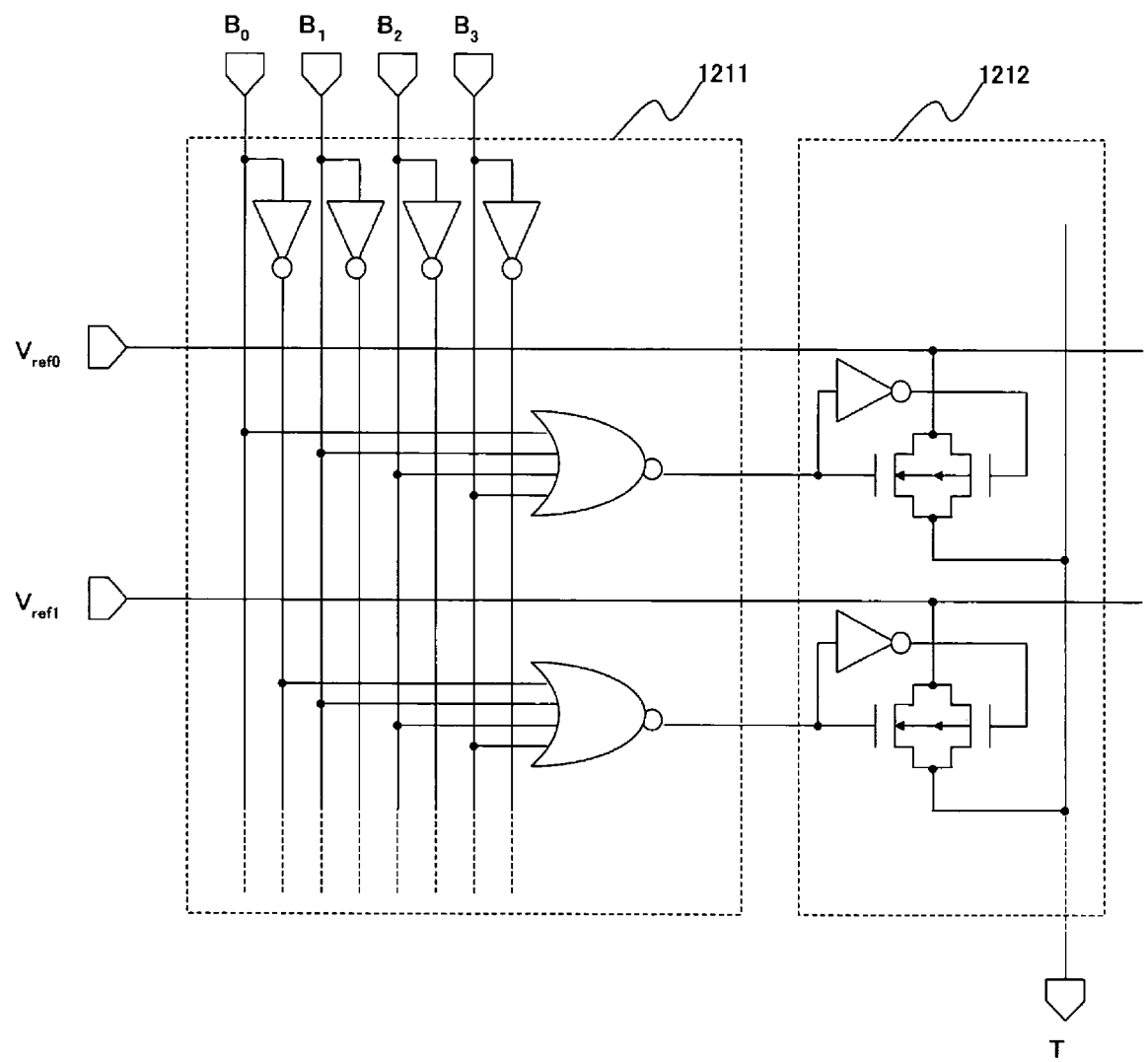
FIG. 18 is a diagram illustrating a further specific example of a switch in the switch circuit according to the present invention.

FIG. 18 illustrates an example in which NOR gates are used as logic circuits and CMOS switches as switches. Each logic circuit (NOR gate) in FIG. 18 outputs the HIGH level if the bit signals input thereto are all at the LOW level. Accordingly, only one among $k^2$ NOR gates will output the HIGH level with respect to certain input bit data. If the output of the NOR gate is connected to the NMOS transistor of the switch circuit and a signal obtained by inverting the signal from the NOR gate is connected to the PMOS transistor, therefore, only one CMOS switch will turn ON.

Next, a case where the decoder 12 in FIG. 1 has a single output terminal (the amplifying circuit 13 has a single input terminal) will be described as a third embodiment of the present invention. That is, the decoder 12 receives as inputs the m reference voltages that differ from one another, selects n voltages, inclusive of voltages that may be identical, from among the m reference voltages based upon a selecting signal, and successively outputs the selected voltages to a single output terminal. Further, the amplifying circuit 13 successively receives as inputs the n voltages selected at the single output terminal and outputs voltages obtained by taking the weighted mean of the entered n voltages at the ratio $2^{n-1}:2^{n-2}:\ldots:2^0$. The single output terminal will be expressed by $T_0$ below, and the n voltages successively supplied to the terminal $T_0$ will be denoted by $V_{Q1}, V_{Q2}, \ldots,$ and $V_{Qn}$.

Figure 19A:
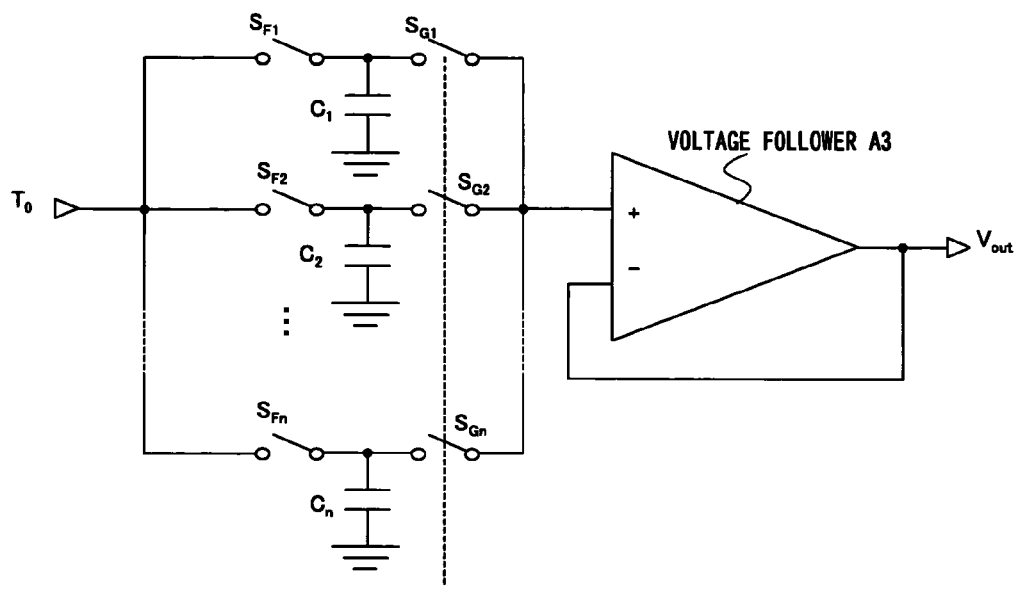
FIG. 19A is a diagram illustrating an example of the structure of an amplifying circuit according to a third embodiment of the present invention.
Figure 19B:
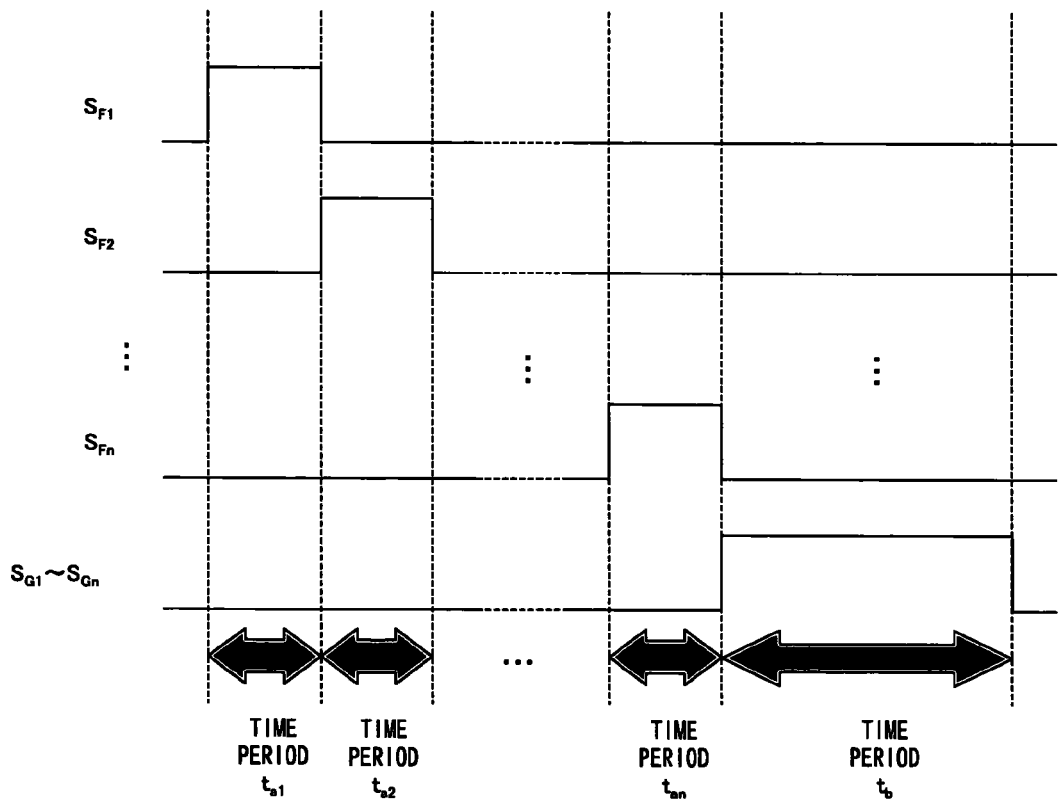
FIG. 19B is a timing chart illustrating ON/OFF control of switches in FIG. 19A.

FIG. 19A is a diagram illustrating an example of the configuration of the amplifying circuit 13 according to this embodiment, and FIG. 19B is a timing chart illustrating the operation of the switches of FIG. 19A. With reference to FIGS. 19A and 19B, assume that switches $S_{G1}$ to $S_{Gn}$ are turned OFF in time periods $t_{a1}$ to $t_{an}$, and assume the following with regard to switches $S_{F1}$ to $S_{Fn}$:

only switch $S_{F1}$ is turned on in time period $t_{a1}$;

only switch $S_{F2}$ is turned on in time period $t_{a2}$;

. . . .

only switch $S_{Fn}$ is turned on in time period $t_{an}$.

In such case, the n voltages $V_{Q1}, V_{Q2}, \ldots,$ and $V_{Qn}$ successively supplied to the input terminal $T_0$ are stored in capacitors $C_1$ to $C_n$ via switches $S_{F1}$ to $S_{Fn}$, respectively.

If switches $S_{F1}$ to $S_{Fn}$ are all turned OFF and switches $S_{G1}$ to $S_{Gn}$ are all turned ON in the next time period $t_b$, then charge is redistributed among the capacitors $C_1$ to $C_n$. By setting the capacitance ratio of the capacitors $C_1$ to $C_n$ to the ratio $2^{n-1}:2^{n-2}:\ldots:2^0$ beforehand, the non-inverting input voltage of voltage follower A3 becomes as follows:

$$(2^{n-1} \times V_{Q1} + 2^{n-2} \times V_{Q2} + \ldots + 2^0 \times V_{Qn})/(2^{n-1} + 2^{n-2} + \ldots + 2^0)$$

That is, the voltage is the result of taking the weighted mean of $V_{Q1}$ to $V_{Qn}$ at the ratio $2^{n-1}:2^{n-2}:\ldots:2^0$.

Accordingly, the output voltage of the voltage follower A3 also becomes a voltage that is the result of taking the weighted mean of the voltages $V_{Q1}$ to $V_{Qn}$ at the ratio $2^{n-1}:2^{n-2}:\ldots:2^0$.

Figure 20A:
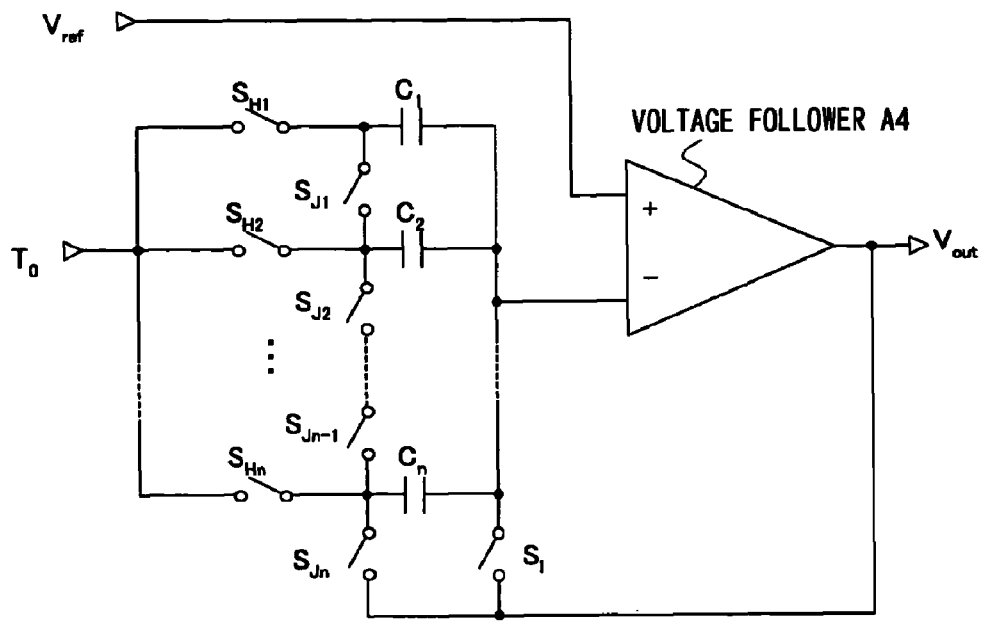
FIG. 20A is a diagram illustrating another example of the structure of an amplifying circuit according to the third embodiment of the present invention.
Figure 20B:
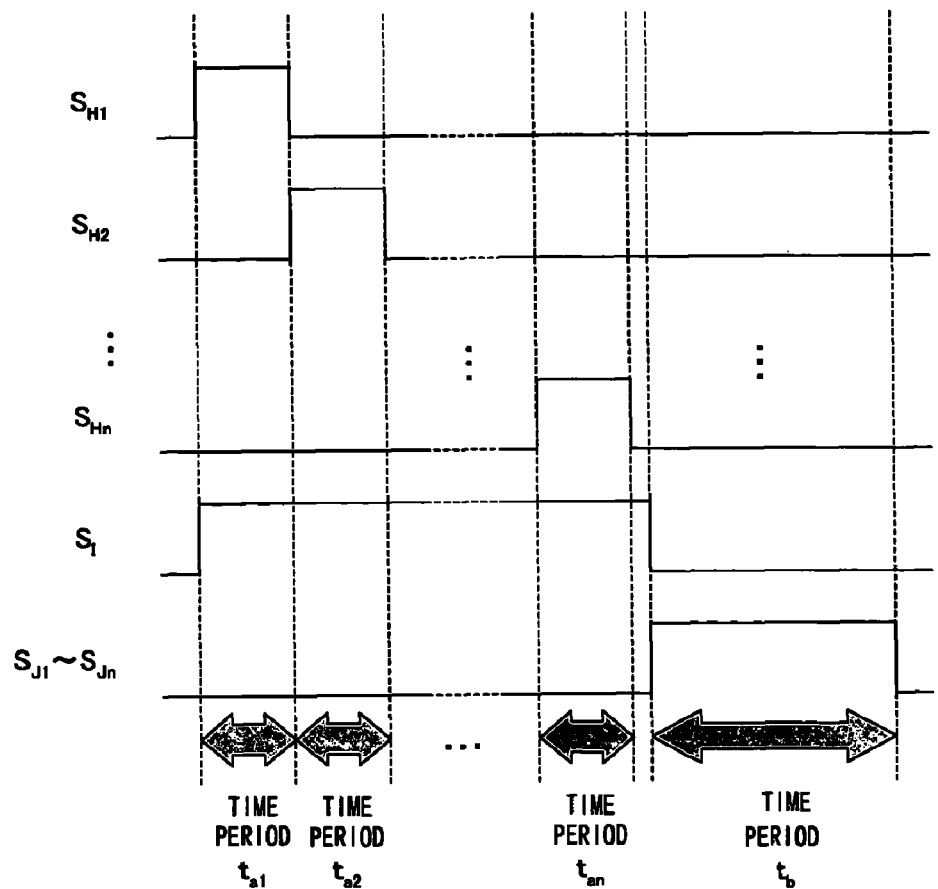
FIG. 20B is a timing chart illustrating ON/OFF control of switches in FIG. 20A.

FIG. 20A is a diagram illustrating another example of the configuration of the amplifying circuit 13 in this embodiment, and FIG. 20B is a timing chart for describing the operation of switches in FIG. 20A. In a manner similar to that of the arrangement shown in FIG. 5A, the example shown in FIG. 20A is such that offset in voltage follower A4 can be cancelled.

In accordance with FIGS. 20A and 20B, assume that switches $S_{J1}$ to $S_{Jn}$ are turned OFF and switch $S_1$ is turned ON in time periods $t_{a1}$ to $t_{an}$, and assume the following with regard to switches $S_{H1}$ to $S_{Hn}$:

only switch $S_{H1}$ is turned on in time period $t_{a1}$;

only switch $S_{H2}$ is turned on in time period $t_{a2}$;

. . . .

only switch $S_{Hn}$ is turned on in time period $t_{an}$.

In such case, the n voltages $V_{Q1}, V_{Q2}, \ldots, V_{Qn}$ successively supplied to input terminal $T_1$ are stored in capacitors $C_1$ to $C_n$ via switches $S_{H1}$ to $S_{Hn}$, respectively.

On the other hand, if we let dV represent offset of voltage follower A4, then the output of the voltage follower will be $V_{ref}$+dV and this is supplied to the other ends of the capacitors $C_1$ to $C_n$ via the switch $S_D$. Consequently, voltages $[V_{Q1}-(V_{ref}+dV)], \ldots, [V_{Qn}-(V_{ref}+dV)]$ are stored in the capacitors $C_1$ to $C_n$, respectively.

If switches $S_{H1}$ to $S_{Hn}$ and switch $S_1$ are turned OFF and switches $S_{J1}$ to $S_{Jn}$ are turned ON in the next time period $t_b$, then charge is redistributed among the capacitors $C_1$ to $C_n$. At the same time, the output of the voltage follower and the inverting input terminal (−) are connected via the capacitors $C_1$ to $C_n$. As a result, the offset dV is cancelled and the output of the voltage follower A4 becomes as follows:

$$[(C_1 \times V_{Q1} + C_2 \times V_{Q2} + \ldots + C_n \times V_{Qn})/(C_1 + C_2 + \ldots + C_n)]$$

By setting the capacitance ratio of the capacitors $C_1$ to $C_n$ to the ratio $2^{n-1}:2^{n-2}:\ldots:2^0$ beforehand, the output voltage of the voltage follower A4 becomes as follows:

$$(2^{n-1} \times V_{Q1} + 2^{n-2} \times V_{Q2} + \ldots + 2^0 \times V_{Qn})/(2^{n-1} + 2^{n-2} + \ldots + 2^0)$$

That is, the voltage is the result of taking the weighted mean of $V_{Q1}$ to $V_{Qn}$ at the ratio $2^{n-1}:2^{n-2}:\ldots:2^0$.

Figure 43A:
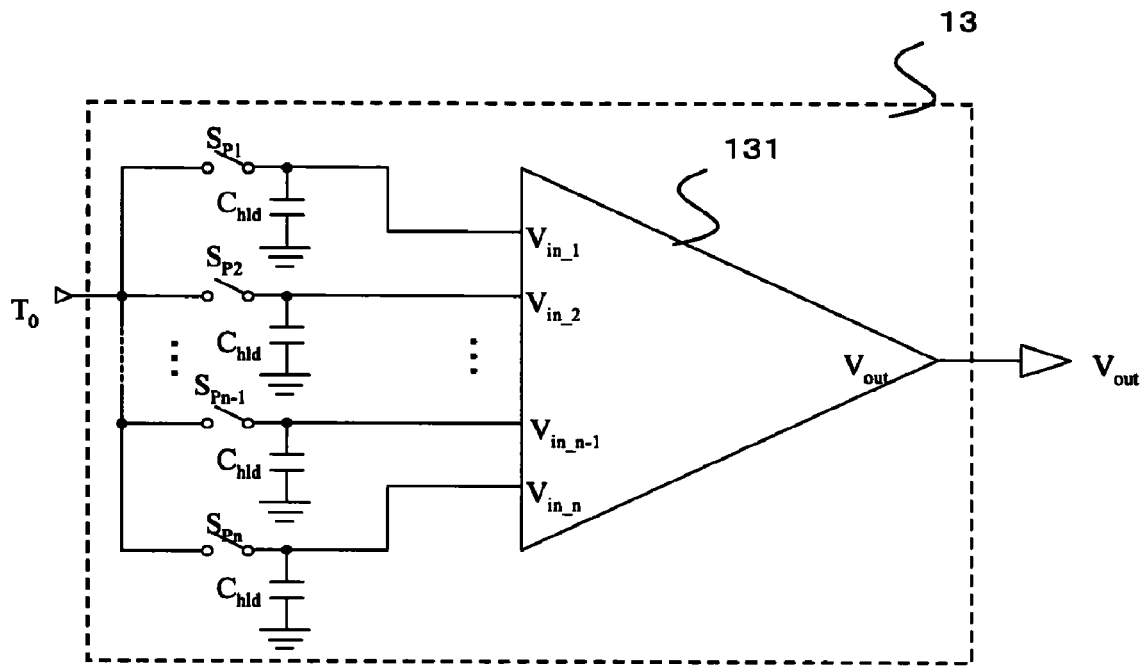
FIG. 43A is a diagram illustrating another example of the configuration of an amplifying circuit according to an embodiment of the present invention.
Figure 43B:
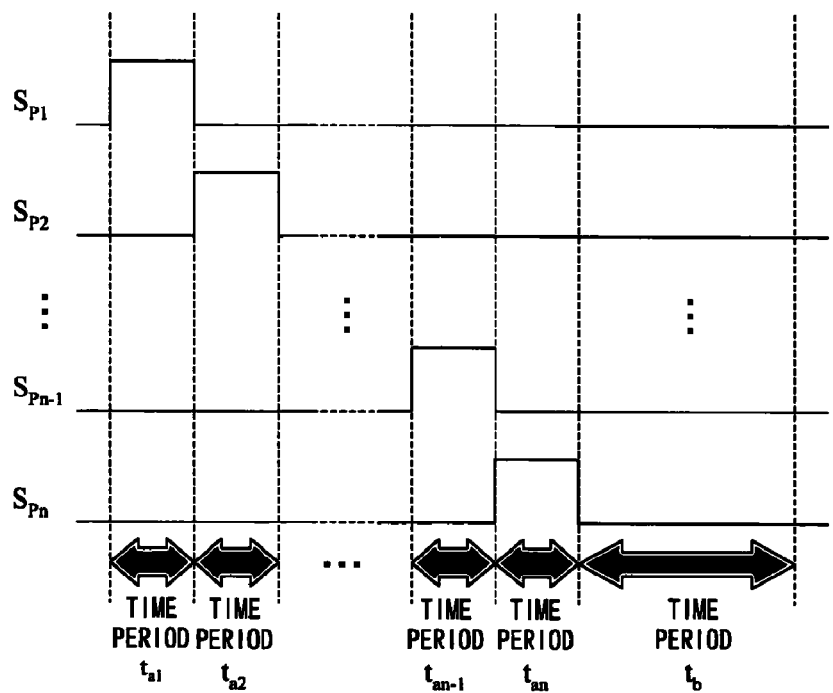
FIG. 43B is a timing chart illustrating ON/OFF control of switches in FIG. 43A.

FIG. 43A is a diagram illustrating a further example of the configuration of the amplifying circuit 13. As shown in FIG. 43A, the amplifying circuit 13 includes the differential amplifying circuit 131 having the plurality of differential pairs described above with reference to FIG. 40; a plurality (n) of switches $S_{P1}$ to $S_{Pn}$ having first ends connected in common with the terminal $T_0$ and second ends connected to respective ones of the plurality (n) of input terminals $V_{in\_1}$ to $V_{in\_n}$ of the differential amplifying circuit 131; and n voltage-holding capacitors $C_{hld}$ connected between the second ends of the n switches $S_{P1}$ to $S_{Pn}$ and ground. FIG. 43B is a timing chart illustrating the operation of the switches shown in FIG. 43A. With reference to FIGS. 43A and 43B, first assume that the following holds:

only switch $S_{P1}$ is turned on in time period $t_{a1}$;
only switch $S_{P2}$ is turned on in time period $t_{a2}$;
....
only switch $S_{Pn}$ is turned on in time period $t_{an}$.

In such case, the n voltages $V_{Q1}, V_{Q2}, \ldots, V_{Qn}$ successively supplied to input terminal $T_0$ are stored in the corresponding voltage-holding capacitors $C_{hld}$ via respective ones of the switches $S_{P1}$ to $S_{Pn}$, respectively.

If switches $S_{P1}$ to $S_{Pn}$ are all turned OFF in the next time period $t_b$, then a state is obtained in which the voltages $V_{Q1}$ to $V_{Qn}$ are supplied to the n input terminals $V_{in\_1}$ to $V_{in\_n}$ of the differential amplifying circuit 131 and the output voltage $V_{out}$ becomes as follows:

$$(2^{n-1} \times V_{Q1} + 2^{n-2} \times V_{Q2} + \ldots + 2^0 \times V_{Qn})/(2^{n-1} + 2^{n-2} + \ldots + 2^0)$$

That is, the voltage is the result of taking the weighted mean of $V_{Q1}$ to $V_{Qn}$ at the ratio $2^{n-1}:2^{n-2}:\ldots:2^0$.

Figure 44A:
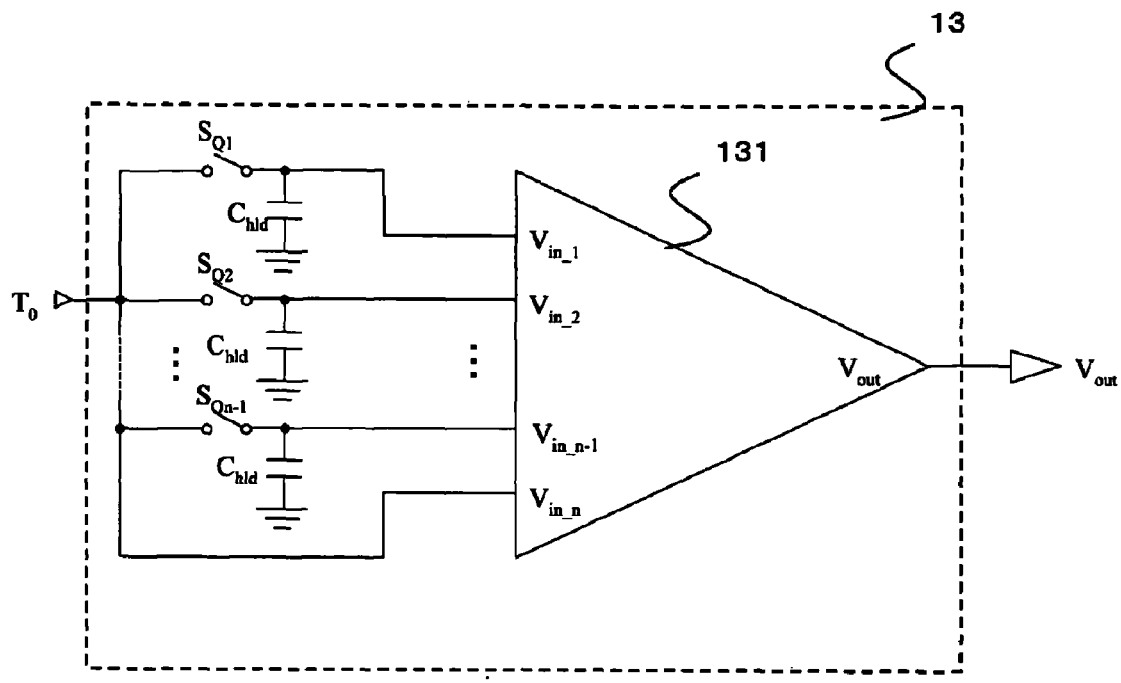
FIG. 44A is a diagram illustrating another example of the configuration of an amplifying circuit according to an embodiment of the present invention.
Figure 44B:
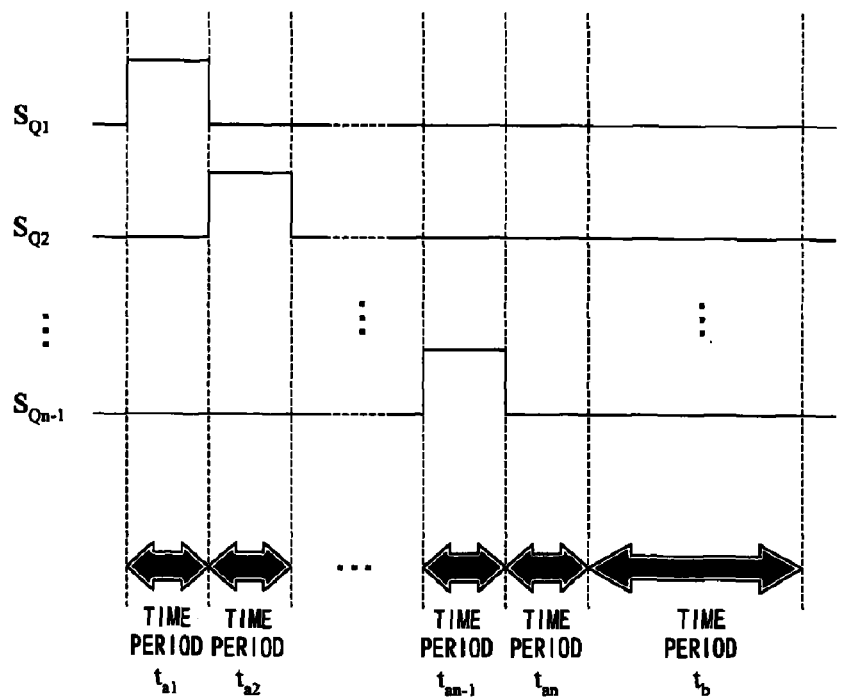
FIG. 44B is a timing chart illustrating ON/OFF control of switches in FIG. 44A.

In FIG. 44A, which is another example of the configuration of an amplifying circuit, the switch $S_{Pn}$ and the voltage-holding capacitor corresponding to the switch $S_{Pn}$ in FIG. 43A have been removed, and the nth input terminal $V_{in\_1}$ of the amplifying circuit 13 is connected directly to the terminal $T_0$. FIG. 44B is a timing chart illustrating the operation of the switches in FIG. 44A. With reference to FIGS. 44A and 44B, first assume that the following holds:

only switch $S_{Q1}$ is turned on in time period $t_{a1}$;
only switch $S_{Q2}$ is turned on in time period $t_{a2}$;
....
only switch $S_{Qn-1}$ is turned on in time period $t_{an-1}$.

In such case, the n voltages $V_{Q1}, V_{Q2}, \ldots, V_{Qn-1}$ successively supplied to input terminal $T_0$ are stored in the corresponding voltage-holding capacitors $C_{hld}$ via respective ones of the switches $S_{Q1}$ to $S_{Qn-1}$, respectively.

In the succeeding time periods $t_{an}$ and $t_b$, a state is obtained in which the voltages $V_{Q1}$ to $V_{Qn}$ are supplied to the n differential pairs of the differential amplifying circuit 131, and the output voltage $V_{out}$ becomes as follows:

$$(2^{n-1} \times V_{Q1} + 2^{n-2} \times V_{Q2} + \ldots + 2^0 \times V_{Qn})/(2^{n-1} + 2^{n-2} + \ldots + 2^0)$$

That is, the voltage is the result of taking the weighted mean of $V_{Q1}$ to $V_{Qn}$ at the ratio $2^{n-1}:2^{n-2}:\ldots:2^0$.

If the configuration of FIG. 44A is compared with that of FIG. 43A, it will be understood that the number of switches and number of voltage-holding capacitors can be reduced.

It should be noted that the amplifying circuit 13 is not limited to the examples of structure described above. Any structure will suffice so long as it is capable of outputting a voltage obtained by taking the weighted mean of $V_{Q1}$ to $V_{Qn}$, which are successively input from the terminal $T_0$, at the ratio $2^{n-1}:2^{n-2}:\ldots:2^0$.

Figure 21:
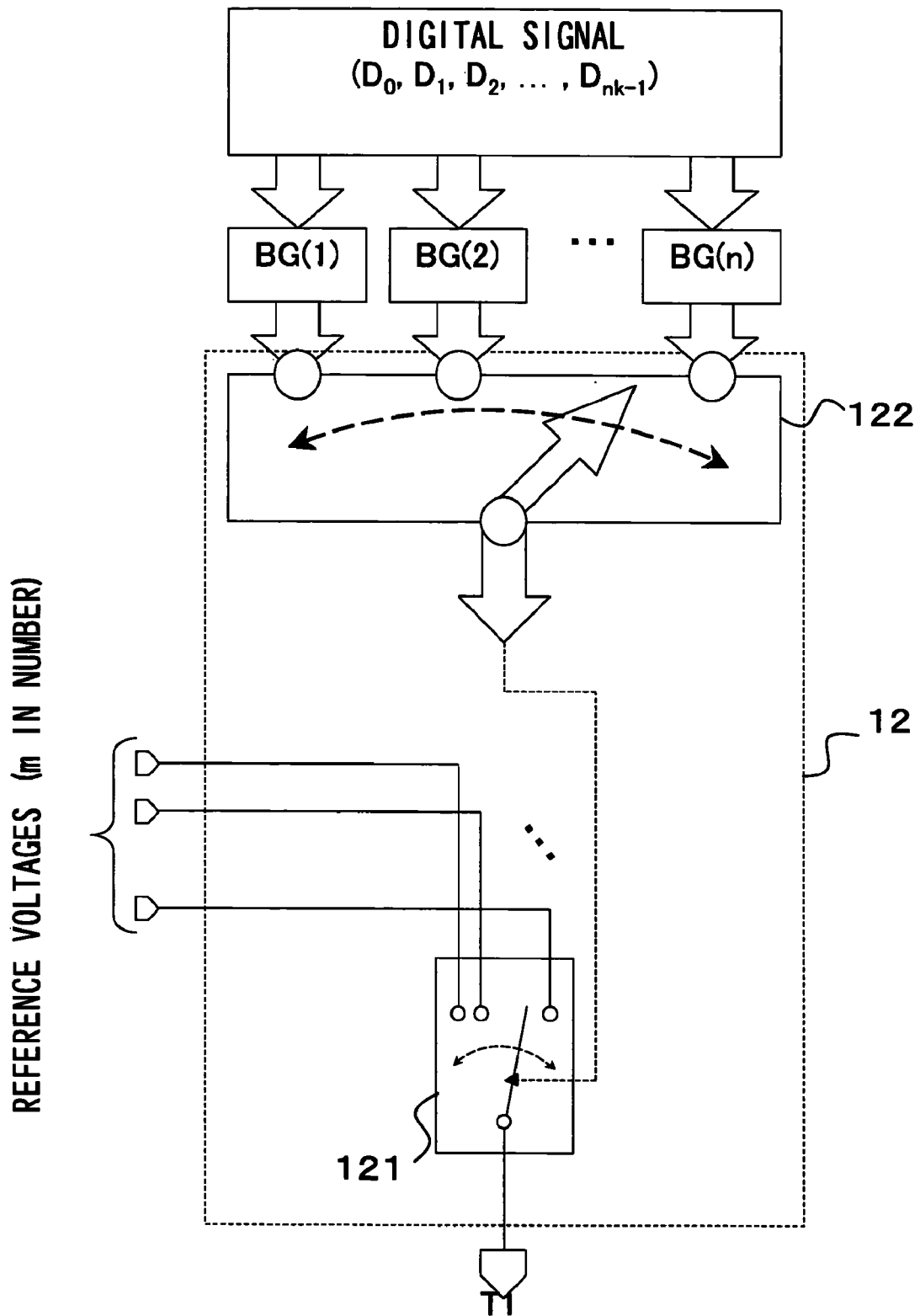
FIG. 21 is a diagram illustrating an example of the structure of a decoder according to the third embodiment.

An example of the configuration of the decoder 12 will be described next. FIG. 21 is a diagram illustrating a specific example of the decoder 12. As shown in FIG. 21, the decoder 12 receives an (n×k)-bit (where k is an integer and k>=2 holds) digital signal and the m ($=2^k$) reference voltages as inputs and includes one selected-voltage output terminal $T_1$; one bit-group selecting circuit 122 for successively selecting and outputting a total of n bit groups one group at a time from bit groups BG1 to BGn obtained by dividing the digital signal into n groups of k bits each; and a single sub-decoder 121 for receiving the m reference voltages as inputs and outputting one voltage from among the m reference voltages based upon the digital signal of the bit group selected by the bit-group selecting circuit 122. The single output of the sub-decoder 121 is connected to the single selected-voltage output terminal. The sub-decoder 121 selects n (n>=3) identical or different voltages from among the m reference voltages based upon the digital signal and successively supplies these voltages to the single selected-voltage output terminal $T_1$.

Figure 22:
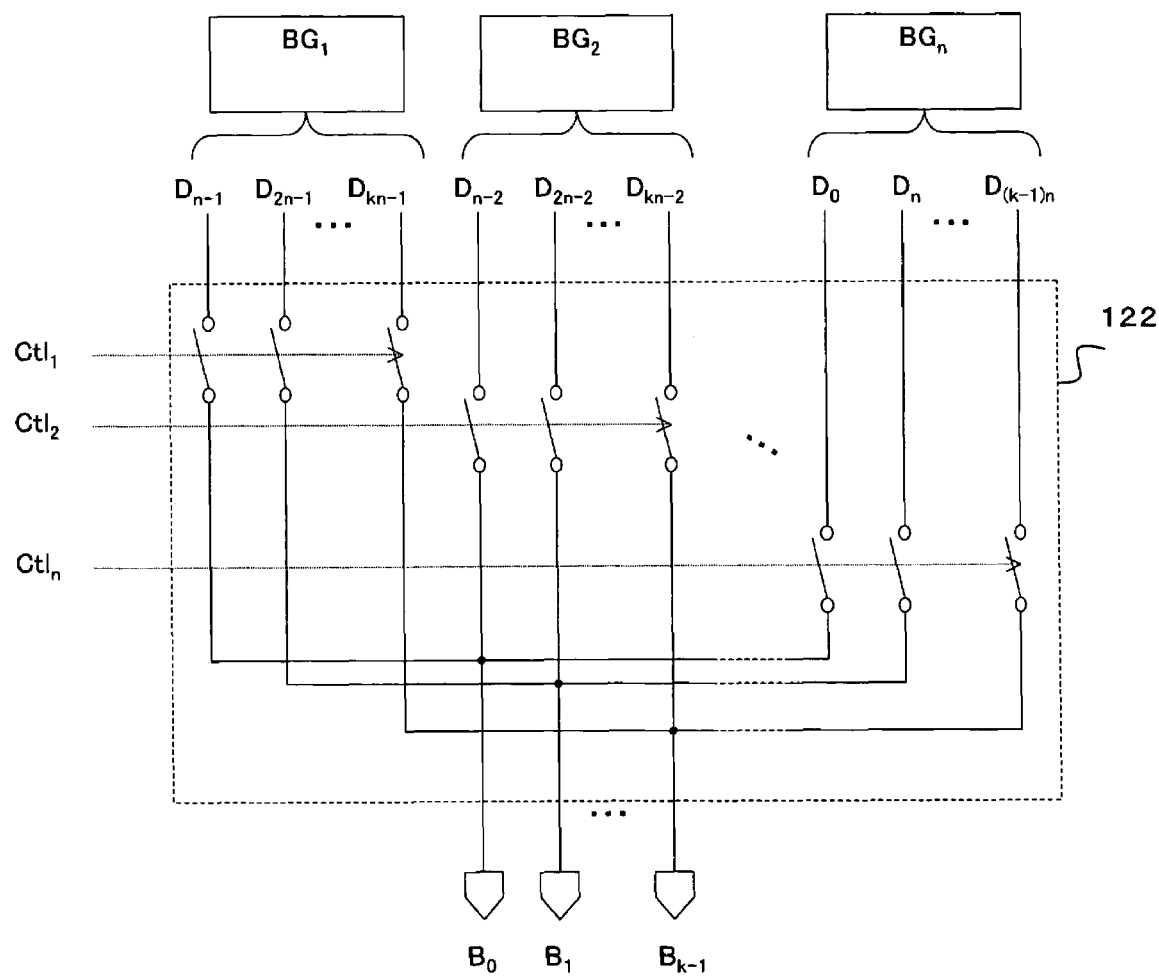
FIG. 22 is a diagram illustrating an example of the structure of bit-group selecting circuit according to the third embodiment.

One example of the configuration of the bit-group selecting circuit 122 in FIG. 21 will now be described. FIG. 22 is a diagram illustrating a specific example of the bit-group selecting circuit 122 according to this embodiment. As shown in FIG. 22, bit-group selecting signals $Ctl_1$ to $Ctl_n$ for selecting one group from bit group 1 ($BG_1$) to bit group n ($BG_n$) are input to the bit-group selecting circuit 122.

Figure 23:
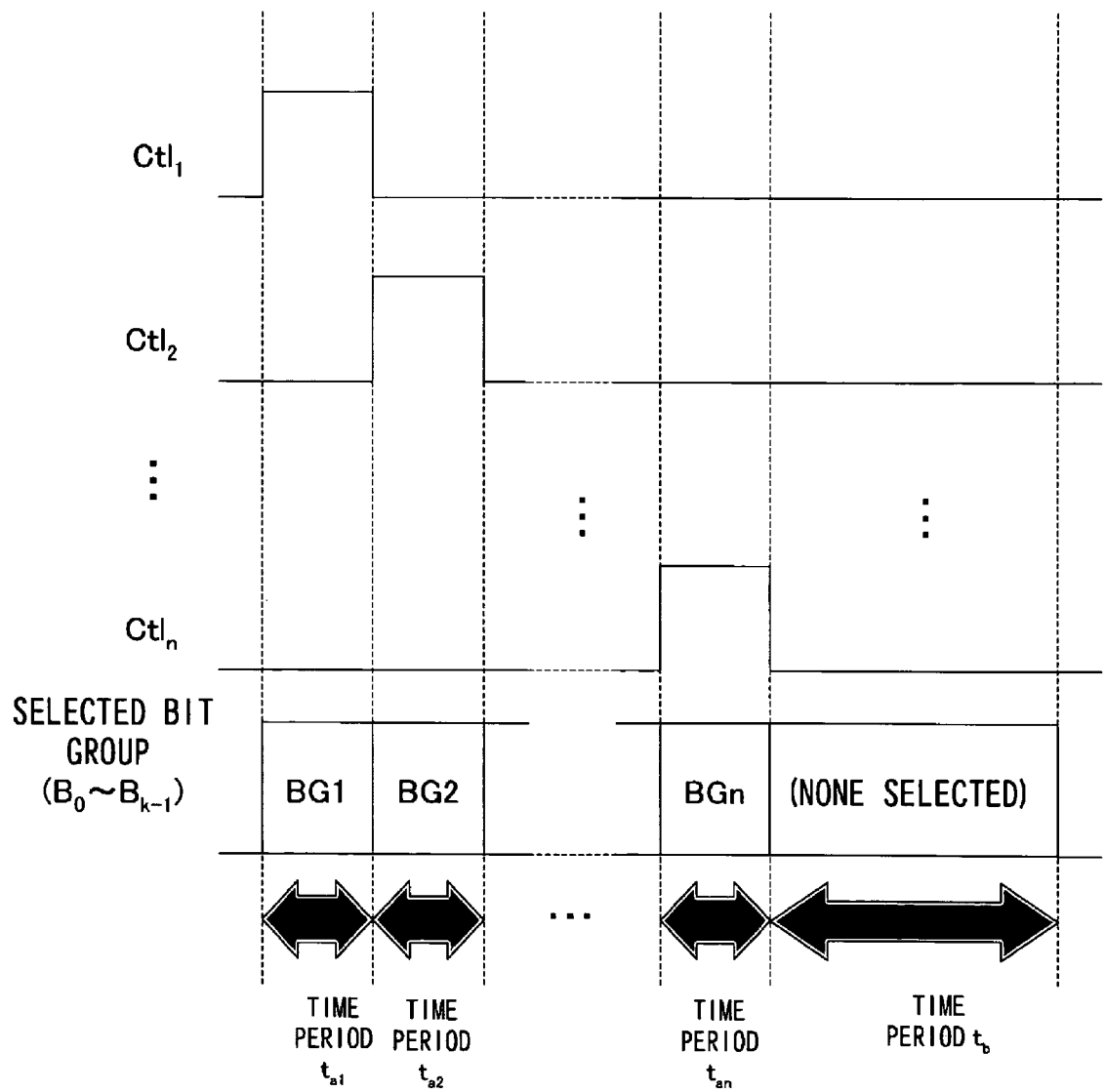
FIG. 23 is a timing chart of the bit-group selecting circuit according to the third embodiment.

FIG. 23 is a timing chart illustrating the timing operation of the bit-group selecting signals $Ctl_1$ to $Ctl_n$. Time periods $t_{a1}$ to $t_{an}$ in FIG. 23 are synchronized to switches $S_{F1}$ to $S_{Fn}$ and switches $S_{H1}$ to $S_{Hn}$ of the amplifier 13 described earlier in the specification.

In accordance with FIG. 23, bit groups are selected as follows:

bit group 1 ($BG_1$) is selected in time period $t_{a1}$;
bit group 2 ($BG_2$) is selected in time period $t_{a2}$;
...,
bit group n (BGn) is selected in time period $t_{an}$.

With regard to time period $t_b$, this is the output time period of the amplifying circuit 13 and, hence, no bit group is selected.

Various structures described earlier in the specification and in FIGS. 6 to 18 can be used with regard to the sub-decoder 121.

In accordance with this embodiment, reference voltages are selected from among the m reference voltages as follows:

one reference voltage conforming to the bit group 1 ($BG_1$) is selected in time period $t_{a1}$;

one reference voltage conforming to the bit group 2 ($BG_2$) is selected in time period $t_{a2}$;

..., and one reference voltage conforming to the bit group n ($BG_n$) is selected in time period $t_{an}$.

Thus, n reference voltages, inclusive of reference voltages that may be identical, are successively selected and output to the output terminal $T_1$, of decoder 12 in the period from $t_{a1}$ to $t_{an}$.

By operating the amplifier 13 in sync with the time periods $t_{a1}$ to $t_{an}$, a maximum of $m^n$ mutually different voltage levels can be output in accordance with the digital signal of k×n bits applied thereto.

Next, a case where the decoder 12 of FIG. 1 has r (2<=r<=n−1) output terminals (the amplifying circuit 13 has r input terminals) will be described as a fourth embodiment of the present invention. That is, the decoder 12 receives as inputs the m reference voltages that differ from one another, selects n voltages, inclusive of voltages that may be identical, from among the m reference voltages based upon a selecting signal, and successively outputs the selected voltages to r output terminals.

Further, the amplifying circuit 13 successively receives as inputs the n voltages selected at the r output terminals and outputs voltages obtained by taking the weighted mean of the entered n voltages at the ratio $2^{-1}:2^{n-2}:\ldots:2^0$. The r output terminals will be expressed by $T_0$ to $T_r$ below, and the n voltages successively supplied to the terminals $T_0$ to $T_r$ will be denoted by $V_{Q1}, V_{Q2}, \ldots$, and $V_{Qn}$, respectively.

Figure 24A:
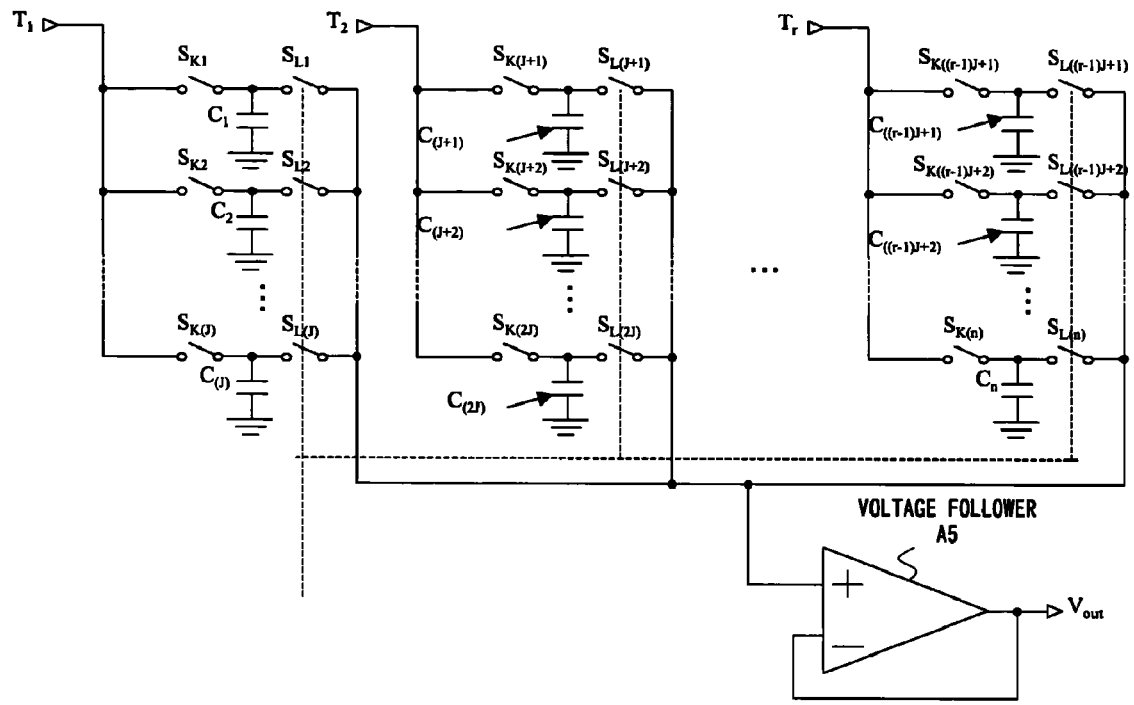
FIG. 24A is a diagram illustrating an example of the structure of an amplifying circuit according to a fourth embodiment of the present invention.
Figure 24B:
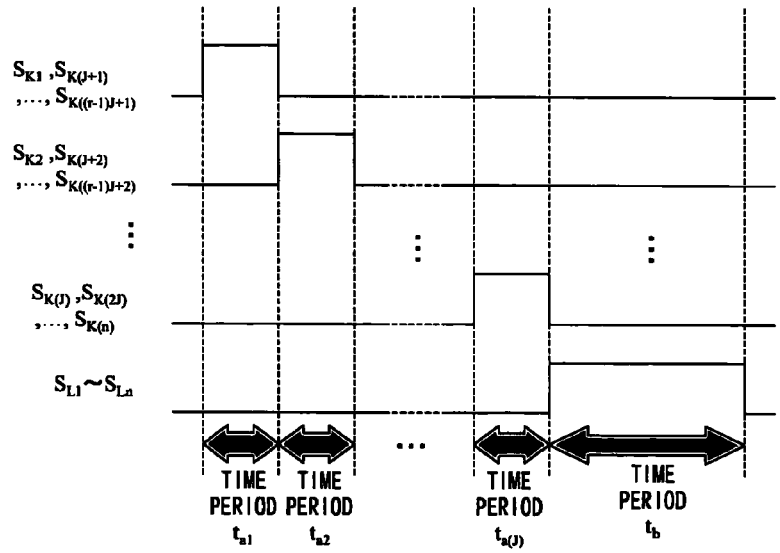
FIG. 24B is a timing chart illustrating ON/OFF control of switches in FIG. 24A.

FIG. 24A is a diagram illustrating an example of the configuration of the amplifying circuit 13 according to this embodiment, and FIG. 24B is a timing chart for describing ON/OFF control of switches in FIG. 24A. The definition J=N/r will hold in the description that follows.

In accordance with FIGS. 24A and 24B, switches $S_{L1}$ to $S_{Ln}$ are turned OFF in time periods $t_{a1}$ to $t_{a(J)}$.

If r switches $S_{K1}, S_{K(J+1)}, \ldots$, and $S_{K[(r-1)J+1]}$ among switches $S_{K1}$ to $S_{Kn}$ are turned ON in time period $t_{a1}$, then r voltages $V_{Q1}, V_{Q(J+1)}, \ldots$, and $V_{Q[(r-1)J+1]}$ supplied to input terminals $T_1$ to $T_r$ are stored up in capacitors $C_{K1}$, $C_{K(J+1)}, \ldots$, and $C_{K[(r-1)J+1]}$, respectively.

Next, in time period $t_{a2}$, if r switches $S_{K2}, S_{K(J+2)}, \ldots$, and $S_{K[(r-1)J+2]}$ are turned ON, then r voltages $V_{Q2}, V_{Q(J+2)}, \ldots$, and $V_{Q[(r-1)J+2]}$ supplied to input terminals $T_1$ to $T_r$ are stored up in capacitors $C_{K2}, C_{K(J+2)}, \ldots$, and $C_{K[(r-1)J+2]}$, respectively.

By repeating a similar operation up to time period $t_{a(J)}$, the n voltages $V_{Q1}, V_{Q2}, \ldots$, and $V_{Qn}$ selected in the decoder 12 are stored in the capacitors $C_1$ to $C_n$, respectively.

If switches $S_{K1}$ to $S_{Kn}$ are turned OFF and switches $S_{L1}$ to $S_{Ln}$ are turned ON in the next time period $t_b$, then charge is redistributed among the capacitors $C_1$ to $C_n$. By setting the capacitance ratio of the capacitors $C_1$ to $C_n$ to the ratio $2^{n-1}:2^{n-2}:\ldots:2^0$ beforehand, the non-inverting input voltage of voltage follower A5 becomes as follows:

$$(2^{n-1} \times V_{Q1} + 2^{n-2} \times V_{Q2} + \ldots + 2^0 \times V_{Qn})/(2^{n-1} + 2^{n-2} + \ldots + 2^0)$$

That is, the voltage is the result of taking the weighted mean of $V_{Q1}$ to $V_{Qn}$ at the ratio $2^{n-1}:2^{n-2}:\ldots:2^0$. Accordingly, the output voltage of the voltage follower A5 also becomes a voltage that is the result of taking the weighted mean of the voltages $V_{Q1}$ to $V_{Qn}$ at the ratio $2^{n-1}:2^{n-2}:\ldots:2^0$.

Figure 25A:
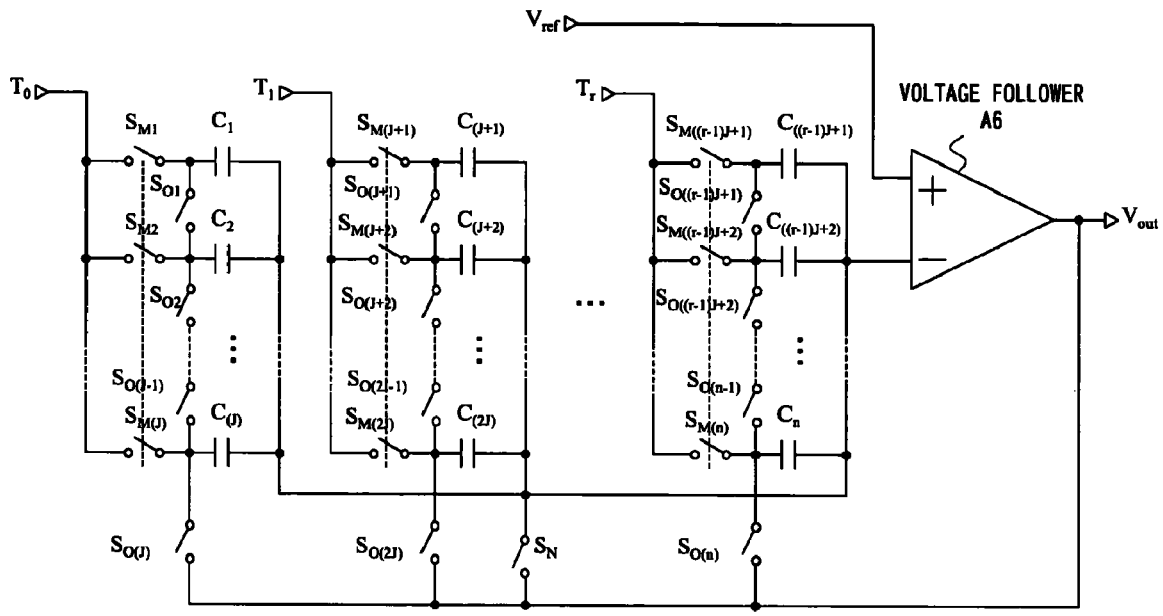
FIG. 25A is a diagram illustrating another example of the structure of the amplifying circuit according to the fourth embodiment of the present invention.
Figure 25B:
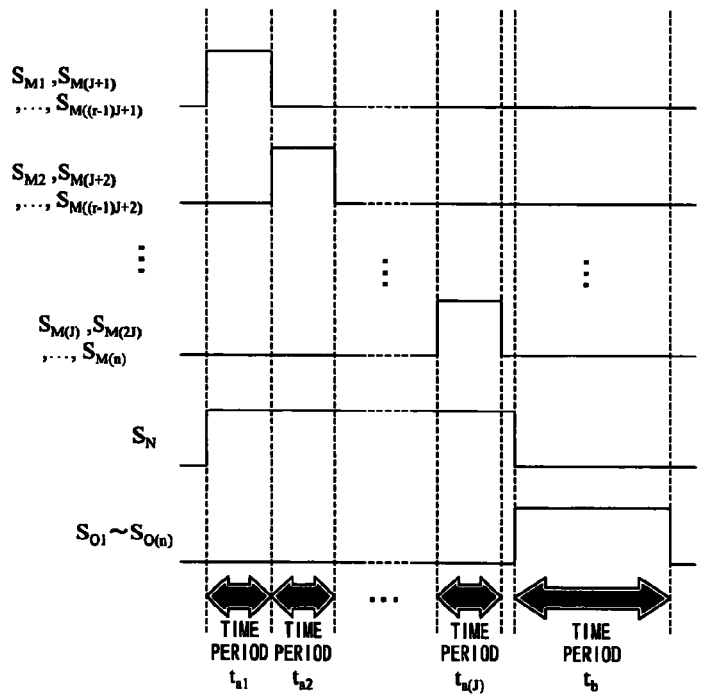
FIG. 25B is a timing chart illustrating ON/OFF control of switches in FIG. 25A.

FIG. 25A is a diagram illustrating another example of the configuration of the amplifying circuit 13 in this embodiment, and FIG. 25B is a timing chart illustrating ON/OFF control of switches in FIG. 25A. The example shown in FIG. 25 is capable of canceling offset in voltage follower A6 in a manner similar to that of the example illustrated in FIG. 3.

In accordance with FIGS. 25A and 25B, switches $S_{O1}$ to $S_{On}$ are turned OFF and switch $S_N$ is turned ON in time periods $t_{a1}$ to $t_{a(J)}$.

If r switches $S_{M1}, S_{M(J+1)}, \ldots$, and $S_{M[(r-1)J+1]}$ among switches $S_{M1}$ to $S_{Mn}$ are turned ON in time period $t_{a1}$, then r voltages $V_{Q1}, V_{Q(J+1)}, \ldots$, and $V_{Q[(r-1)J+1]}$ supplied to input terminals $T_1$ to $T_r$ are stored up in capacitors $C_{M1}$, $C_{M(J+1)}, \ldots$, and $C_{M[(r-1)J+1]}$, respectively.

Next, in time period $t_{a2}$, if r switches $S_{M2}, S_{M(J+2)}, \ldots$, and $S_{M[(r-1)J+2]}$ are turned ON, then r voltages $V_{Q2}, V_{Q(J+2)}, \ldots$, and $V_{Q[(r-1)J+2]}$ supplied to input terminals $T_1$ to $T_r$ are stored up in capacitors $C_{K2}, C_{K(J+2)}, \ldots$, and $C_{K[(r-1)J+2]}$, respectively.

By repeating a similar operation up to time period $t_{a(J)}$, the n voltages $V_{Q1}, V_{Q2}, \ldots$, and $V_{Qn}$ selected in the decoder 12 are supplied to first ends of the capacitors $C_1$ to $C_n$, respectively.

On the other hand, if we let dV represent offset of voltage follower A6, then the output of the voltage follower A6 will be $V_{ref\text{-}oc}+dV$ and this is supplied to the second ends of the capacitors $C_1$ to $C_n$ via the switch $S_D$. Consequently, voltages $[V_{Q1}-(V_{ref}+dV)], \ldots [V_{Qn}-(V_{ref}+dV)]$ are stored in the capacitors $C_1$ to $C_n$, respectively.

If switches $S_{M1}$ to $S_{Mn}$ and switch $S_D$ are turned OFF and switches $S_{O1}$ to $S_{On}$ are turned ON in the next time period $t_b$, then charge is redistributed among the capacitors $C_1$ to $C_n$. At the same time, the output terminal of the voltage follower A6 and the inverting input terminal (−) are connected via the capacitors $C_1$ to $C_n$. As a result, the offset dV is cancelled. Accordingly, the output of the voltage follower A6 becomes as follows:

$$[(C_1 \times V_{Q1} + C_2 \times V_{Q2} + \ldots + C_n \times V_{Qn})/(C_1 + C_2 + \ldots + C_n)]$$

By setting the capacitance ratio of the capacitors $C_1$ to $C_n$ to the ratio $2^{n-1}:2^{n-2}:\ldots:2^0$ beforehand, the output voltage of the voltage follower A6 becomes as follows:

$$(2^{n-1} \times V_{Q1} + 2^{n-2} \times V_{Q2} + \ldots + 2^0 \times V_{Qn})/(2^{n-1} + 2^{n-2} + \ldots + 2^0)$$

That is, the output voltage $V_{out}$ of the voltage follower A6 is the result of taking the weighted mean of $V_{Q1}$ to $V_{Qn}$ at the ratio $2^{n-1}:2^{n-2}:\ldots:2^0$.

Figure 45A:
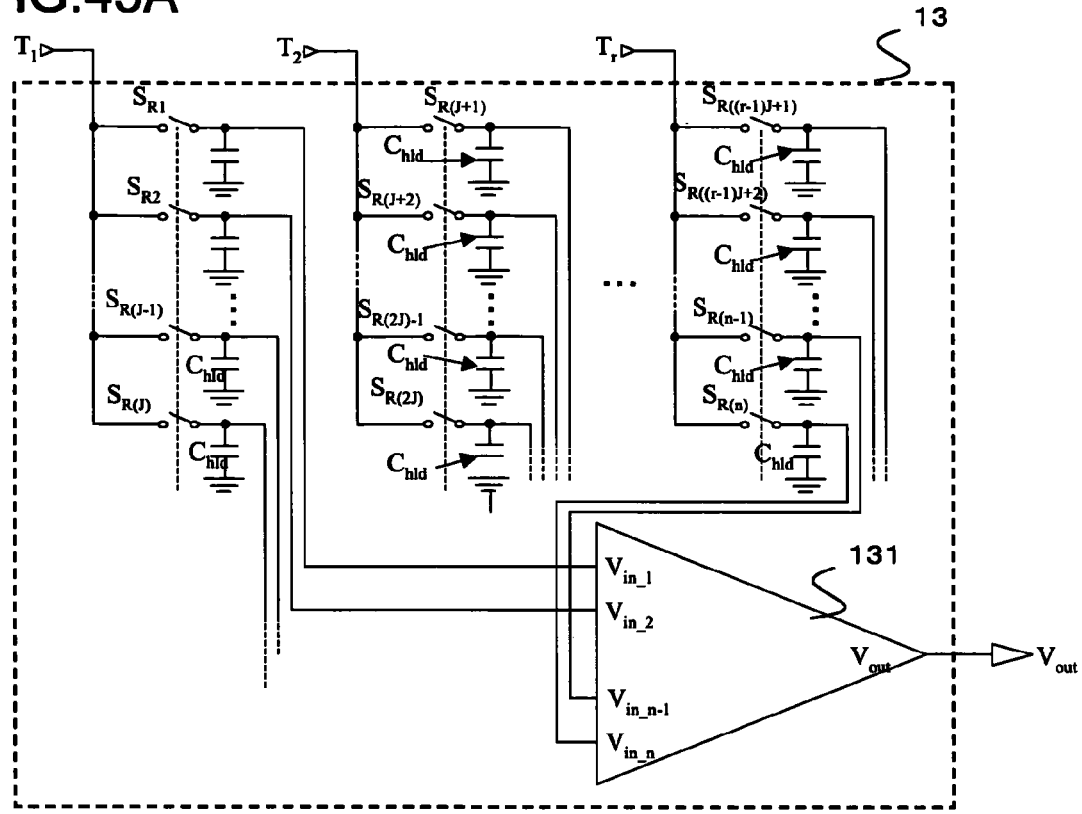
FIG. 45A is a diagram illustrating another example of the configuration of an amplifying circuit according to an embodiment of the present invention.
Figure 45B:
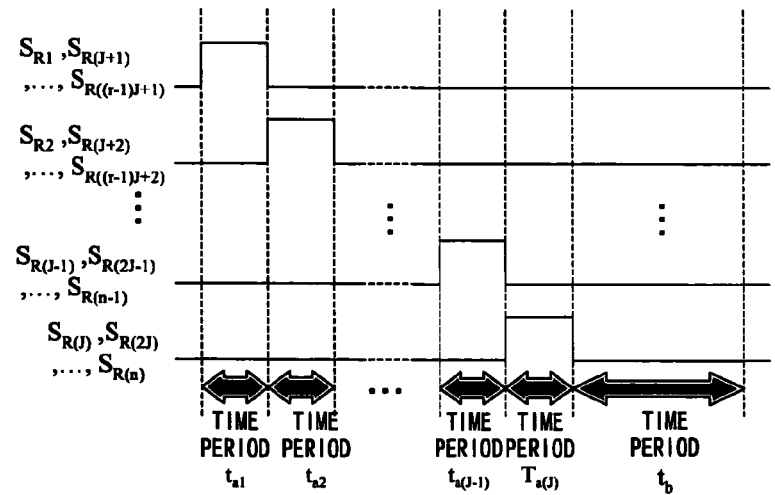
FIG. 45B is a timing chart illustrating ON/OFF control of switches in FIG. 45A.

FIG. 45A is a diagram illustrating another example of the configuration of the amplifying circuit 13. As shown in FIG. 45A, the amplifying circuit 13 includes the differential amplifying circuit 131 having the plurality of differential pairs described above with reference to FIG. 40; n switches $S_{R1}$ to $S_{Rn}$ and voltage-holding capacitors $C_{hld}$ corresponding to respective ones of the n switches $S_{R1}$ to $S_{Rn}$. More specifically, first ends of J switches (where J=n/r holds) $S_{R1}$ to $S_{R(J)}$ are connected in common with input terminal $T_1$, and first ends of J switches $S_{R(J+1)}$ to $S_{R(J2)}$ are connected in common with input terminal $T_2$. Similarly, first ends of J switches $S_{R[(r-1) \times J+1]}$ to $S_{Rn}$ are connected in common with input terminal $T_r$. The second end of each switch is connected to the corresponding input terminal of the amplifying circuit 13, and the voltage-holding capacitors $C_{hld}$ are connected between second ends of the switches and ground. FIG. 45B is a timing chart illustrating the operation of the switches shown in FIG. 45A. With reference to FIGS. 45A and 45B, if r switches $S_{R1}$, $S_{R(J+1)}, \ldots, S_{R[(r-1)J+1]}$ among switches $S_{R1}$ to $S_{Rn}$ are turned ON in time period $t_{a1}$, then r voltages $V_{Q1}, V_{Q(J+1)}, \ldots$, and $V_{Q[(r-1)J+1]}$ supplied to input terminals $T_1$ to $T_r$ are stored up in respective ones of the charge-holding capacitors $C_{hld}$.

Next, in time period $t_{a2}$, if r switches $S_{R2}, S_{R(J+2)}, \ldots,$ and $S_{R[(r-1)J+2]}$ are turned ON, then r voltages $V_{Q2}, V_{Q(J+2)}, \ldots,$ and $V_{Q[(r-1)J+2]}$ supplied to input terminals $T_1$ to $T_r$ are stored up in respective ones of the capacitors $C_{hld}$.

By repeating a similar operation up to time period $t_{a(J)}$, the n voltages $V_{Q1}, V_{Q2}, \ldots,$ and $V_{Qn}$ selected in the decoder 12 are stored in the charge-holding capacitors $C_{hld}$.

If switches $S_{R1}$ to $S_{Rn}$ are all turned OFF in the next time period $t_b$, then a state is obtained in which the voltages $V_{Q1}$ to $V_{Qn}$ are supplied to the n differential pairs of the differential amplifying circuit 131, and the output voltage $V_{out}$ is given by the following:

$$(2^{n-1} \times V_{Q1} + 2^{n-2} \times V_{Q2} + \ldots + 2^0 \times V_{Qn})/(2^{n-1} + 2^{n-2} + \ldots + 2^0)$$

That is, the voltage is the result of taking the weighted mean of $V_{Q1}$ to $V_{Qn}$ at the ratio $2^{n-1} : 2^{n-2} : \ldots : 2^0$.

Figure 46A:
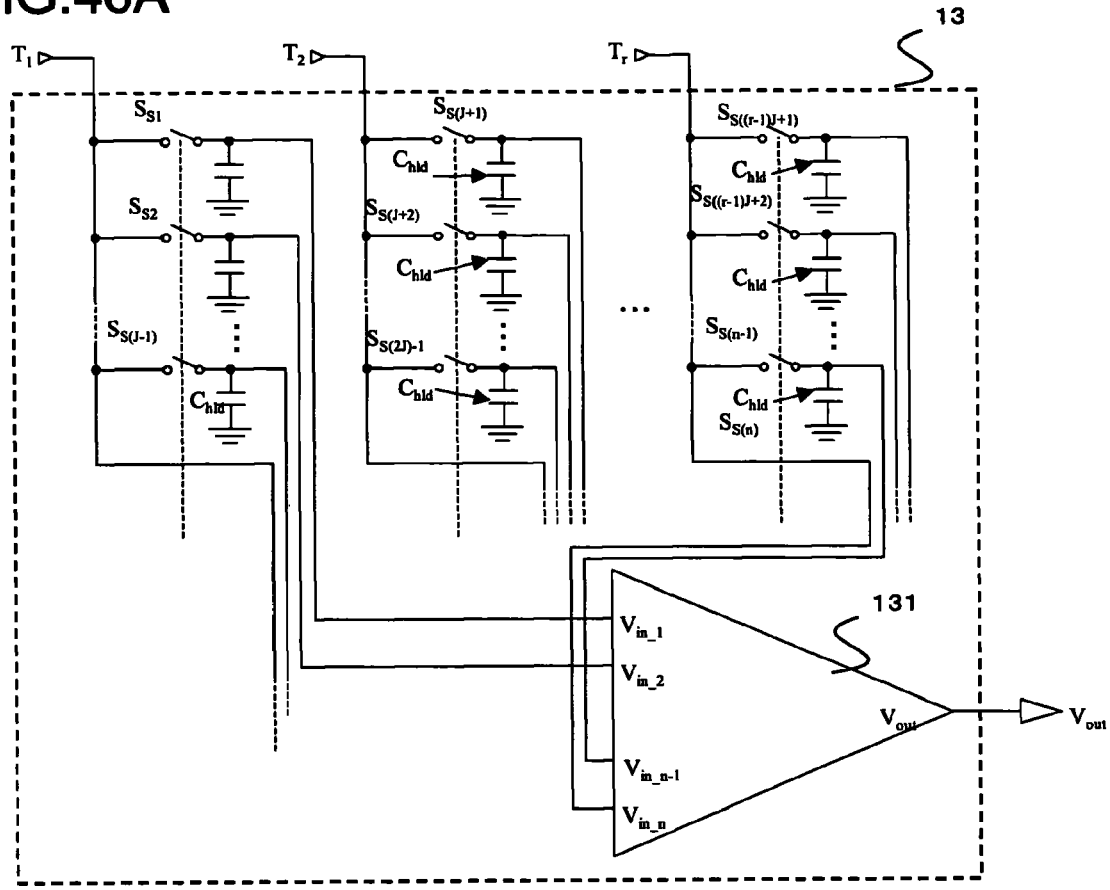
FIG. 46A is a diagram illustrating another example of the configuration of an amplifying circuit according to an embodiment of the present invention.
Figure 46B:
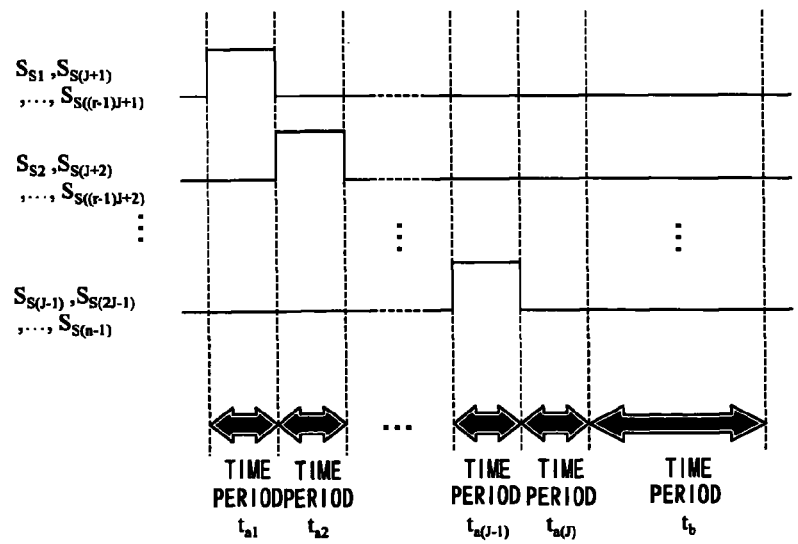
FIG. 46B is a timing chart illustrating ON/OFF control of switches in FIG. 46A.

The arrangement shown in FIG. 46A is obtained by eliminating the switches $S_{R(J)}, S_{R(2J)}, \ldots,$ and $SR_n$ and the voltage-holding capacitors between the switches $S_{R(J)}, S_{R(2J)}, \ldots,$ and $SR_n$ and the differential amplifying circuit 131 in FIG. 45A. First ends of J−1 (where J=n/r holds) switches $S_{S1}$ to $S_{S(J-1)}$ are connected in common with the input terminal $T_1$, switch $S_{R(J)}$ in FIG. 45A is eliminated and the input terminal $T_1$ is connected directly to the corresponding input terminal of the amplifying circuit 13. First ends of J−1 switches $S_{S(J+1)}$ to $S_{S(2J-1)}$ are connected in common with the input terminal $T_2$, switch $S_{R(2J)}$ in FIG. 45A is eliminated and the input terminal $T_2$ is connected directly to the corresponding input terminal of the amplifying circuit 13. Similarly, first ends of J−1 switches $S_{S[(r-1) \times j+1]}$ to $S_{S(n-1)}$ are connected in common with the input terminal $T_r$, switch $S_{R(n)}$ in FIG. 45A is eliminated and the input terminal $T_r$ is connected directly to the corresponding input terminal of the amplifying circuit 13. FIG. 46B is a timing chart illustrating the operation of the switches shown in FIG. 46A. With reference to FIGS. 46A and 46B, if r switches $S_{S1}, S_{S(J+1)}, \ldots,$ and $S_{S[(r-1)J+1]}$ among switches $S_{S1}$ to $S_{Sn}$ are turned ON in time period $t_{a1}$, then r voltages $V_{Q1}, V_{Q(J+1)}, \ldots,$ and $V_{Q[(r-1)J+1]}$ supplied to input terminals $T_1$ to $T_r$ are stored up in respective ones of the charge-holding capacitors $C_{hld}$.

Next, in time period $t_{a2}$, if r switches $S_{S2}, S_{S(J+2)}, \ldots,$ and $S_{S[(r-1)J+2]}$ are turned ON, then r voltages $V_{Q2}, V_{Q(J+2)}, \ldots,$ and $V_{Q[(r-1)J+2]}$ supplied to input terminals $T_1$ to $T_r$ are stored up in respective ones of the charge-holding capacitors $C_{hld}$.

By repeating a similar operation up to the time period $t_{a(J-1)}$, a state is obtained in which the voltages $V_{Q1}$ to $V_{Qn}$ are supplied to the n differential pairs of the differential amplifying circuit 131, and the output voltage $V_{out}$ becomes as follows in the succeeding time periods $t_{a(J)}$ and $t_b$:

$$(2^{n-1} \times V_{Q1} + 2^{n-2} \times V_{Q2} + \ldots + 2^0 \times V_{Qn})/(2^{n-1} + 2^{n-2} + \ldots + 2^0)$$

That is, the output voltage $V_{out}$ is the result of taking the weighted mean of $V_{Q1}$ to $V_{Qn}$ at the ratio $2^{n-1} : 2^{n-2} : \ldots : 2^0$.

The structure shown in FIG. 46A makes it possible to somewhat reduce (by r) the number of switches and number of voltage-holding capacitors in comparison with the structure shown in FIG. 45A.

It should be noted that the configuration of the amplifying circuit 13 is not limited to the example. Any structure will suffice so long as it is possible to output a voltage obtained by taking the weighted mean of the successively input voltages $V_{Q1}$ to $V_{Qn}$ at the ratio $2^{n-1} : 2^{n-2} : \ldots : 2^0$.

Figure 26:
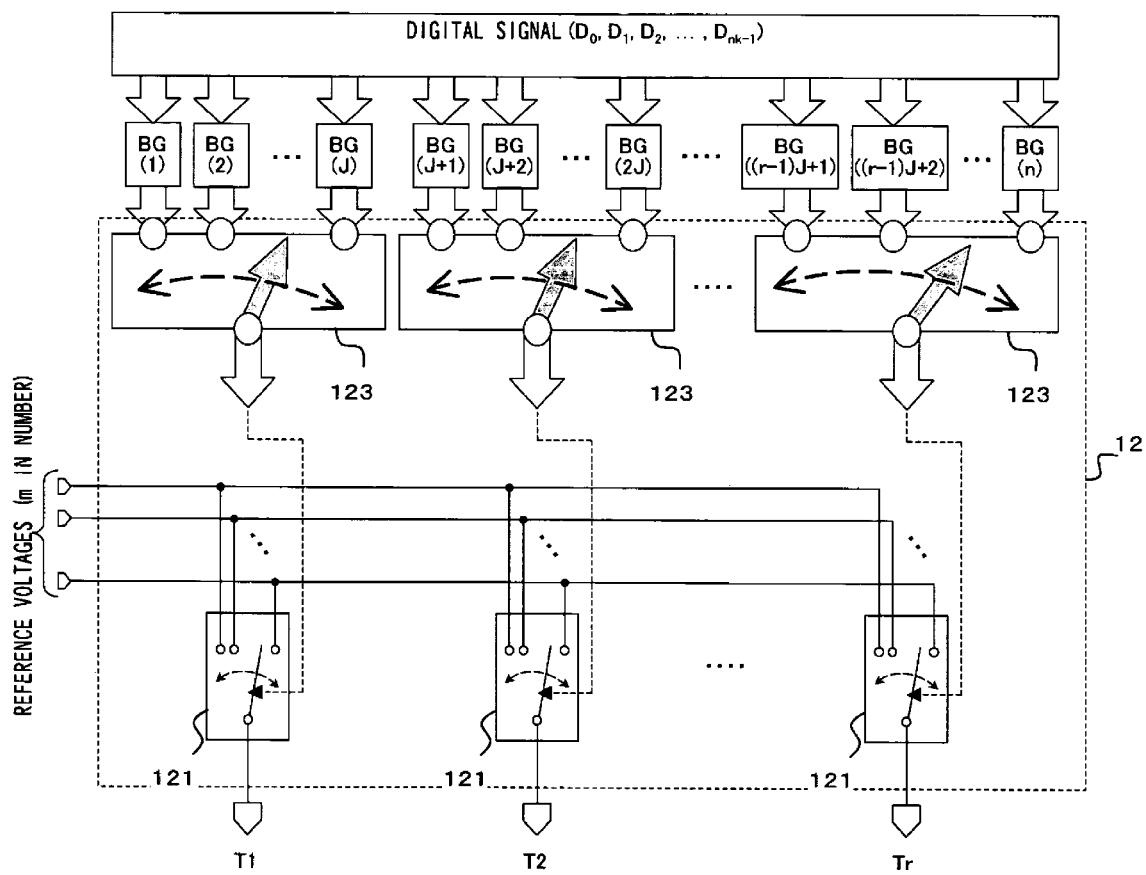
FIG. 26 is a diagram illustrating an example of the structure of a decoder according to the fourth embodiment.

FIG. 26 is a diagram illustrating a specific example of the configuration of decoder 12 according to this embodiment. As shown in FIG. 26, the decoder 12 receives an (n×k)-bit (where k is an integer and k>=2 holds) digital signal and the m (=$2^k$) reference voltages as inputs and includes r selected-voltage output terminals ($T_1$ to $T_r$); r bit-group selecting circuits 123 each for successively selecting and outputting a total of J bit groups one group at a time from J groups of bit groups among bit groups obtained by dividing the digital signal into n groups of k bits each; and r sub-decoders 121 each for receiving the m reference voltages as inputs and outputting one voltage from among the m reference voltages based upon the digital signal of the bit group selected by the respective one of the bit-group selecting circuits 123. The r outputs of the sub-decoders 121 are connected to respective ones of the r selected-voltage output terminals. The decoder 12 selects n identical or different voltages from among the m reference voltages based upon the digital signal and successively outputs these voltages to the r selected-voltage output terminals $T_1$ to $T_r$.

Figure 27:
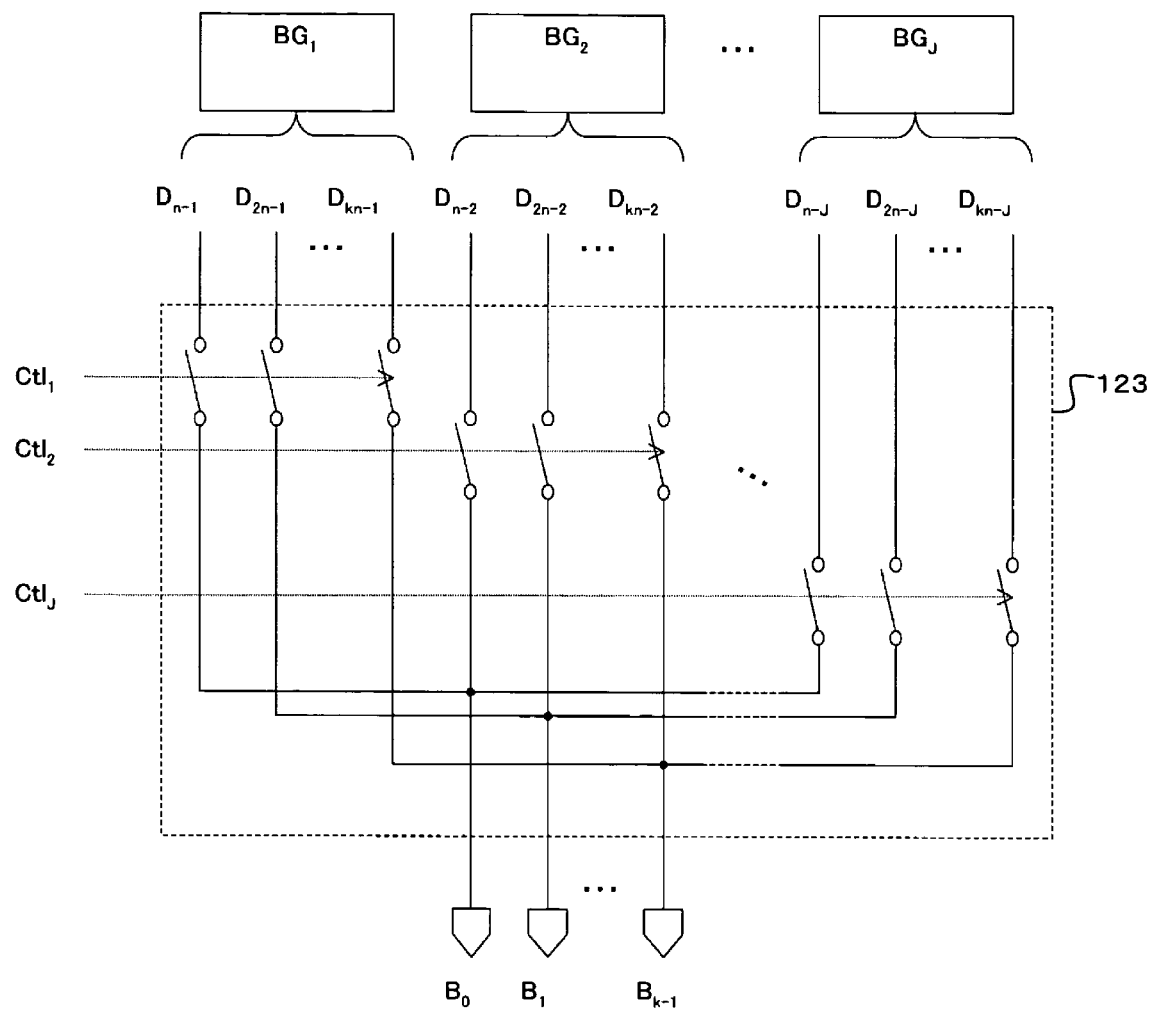
FIG. 27 is a diagram illustrating an example of the structure of bit-group selecting circuit according to the fourth embodiment.
Figure 28:
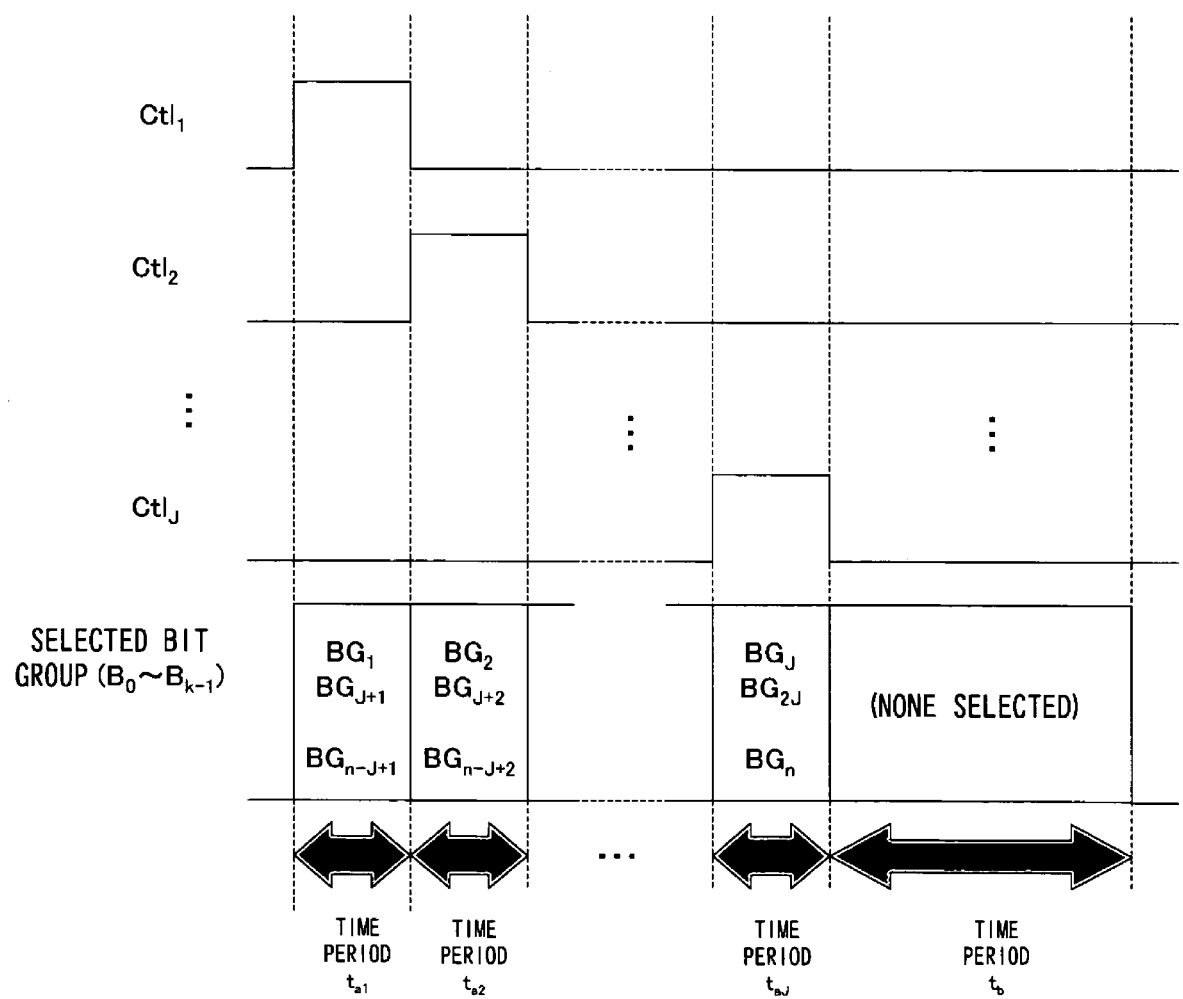
FIG. 28 is a timing chart of the bit-group selecting circuit according to the fourth embodiment.

The structure of the bit-group selecting circuits 123 of FIG. 26 will be described next. FIG. 27 is a diagram illustrating a specific example of the bit-group selecting circuit 123 according to this embodiment. As shown in FIG. 27, bit-group selecting signals $Ctl_1$ to $Ctl_j$ for selecting one group from J groups of bit groups ($BG_1$ to $BG_J$ in FIG. 27) are input to the bit-group selecting circuit 123. FIG. 28 is a timing chart illustrating the timing operation of the bit-group selecting signals $Ctl_1$ to $Ctl_j$. Time periods $t_{a1}$ to $t_{aJ}$ in FIG. 28 are synchronized to switches $S_{K1}$ to $S_{Kn}$ and switches $S_{M1}$ to $S_{Mn}$ of the amplifier 13 described earlier in the specification above.

In accordance with FIGS. 27 and 28, bit groups are selected as follows:

r bit groups $BG_1, BG_{J+1}, \ldots,$ and $BG_{N-J+1}$ are selected in time period $t_{a1}$;

r bit groups $BG_2, BG_{J+2}, \ldots,$ and $BG_{n-J+2}$ are selected in time period $t_{a2}$;

$\ldots,$ r bit groups $BG_J, BG_{2J}, \ldots,$ and $BG_n$ are selected in time period $t_{a1}$.

With regard to time period $t_b$, this is the output time period of the amplifying circuit 13 and, hence, no bit group is selected.

The structures described earlier in the specification and in FIGS. 6 to 18 can be used with regard to the sub-decoder 121.

In accordance with this embodiment, reference voltages are selected from among the m reference voltages as follows:

r reference voltages conforming to $BG_1, BG_{J+1}, \ldots,$ and $BG_{n-J+1}$ are selected in time period $t_{a1}$;

r reference voltages conforming to $BG_2, BG_{J+2}, \ldots,$ and $BG_{n-J+2}$ are selected in time period $t_{a2}$;

$\ldots,$ and r reference voltages conforming to $BG_J, BG_{J2}, \ldots,$ and $BG_n$ are selected in time period $t_{a1}$.

Thus, n reference voltages, inclusive of reference voltages that may be identical, are successively selected and output to the r outputs terminal $T_1$ to $T_r$ of decoder 12 in the period from $t_{a1}$ to $t_{aJ}$.

By operating the amplifier 13 in sync with the time periods $t_{a1}$ to $t_{aJ}$, a maximum of $m^n$ mutually different voltage levels can be output in accordance with the digital signal of k×n bits applied thereto.

Figure 29:
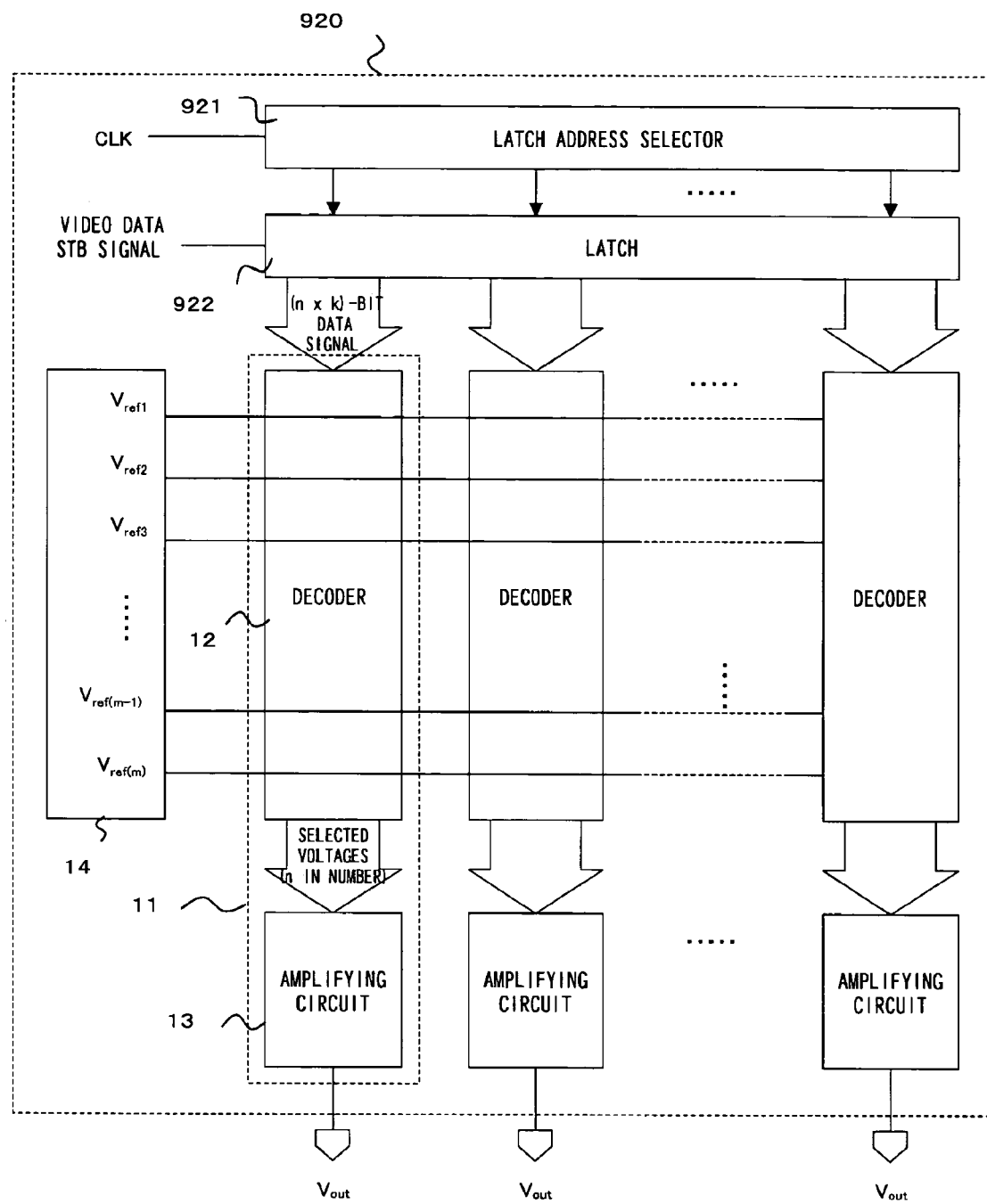
FIG. 29 is a diagram illustrating the structure of a data driver according to a fifth embodiment of the present invention.
Figure 38:
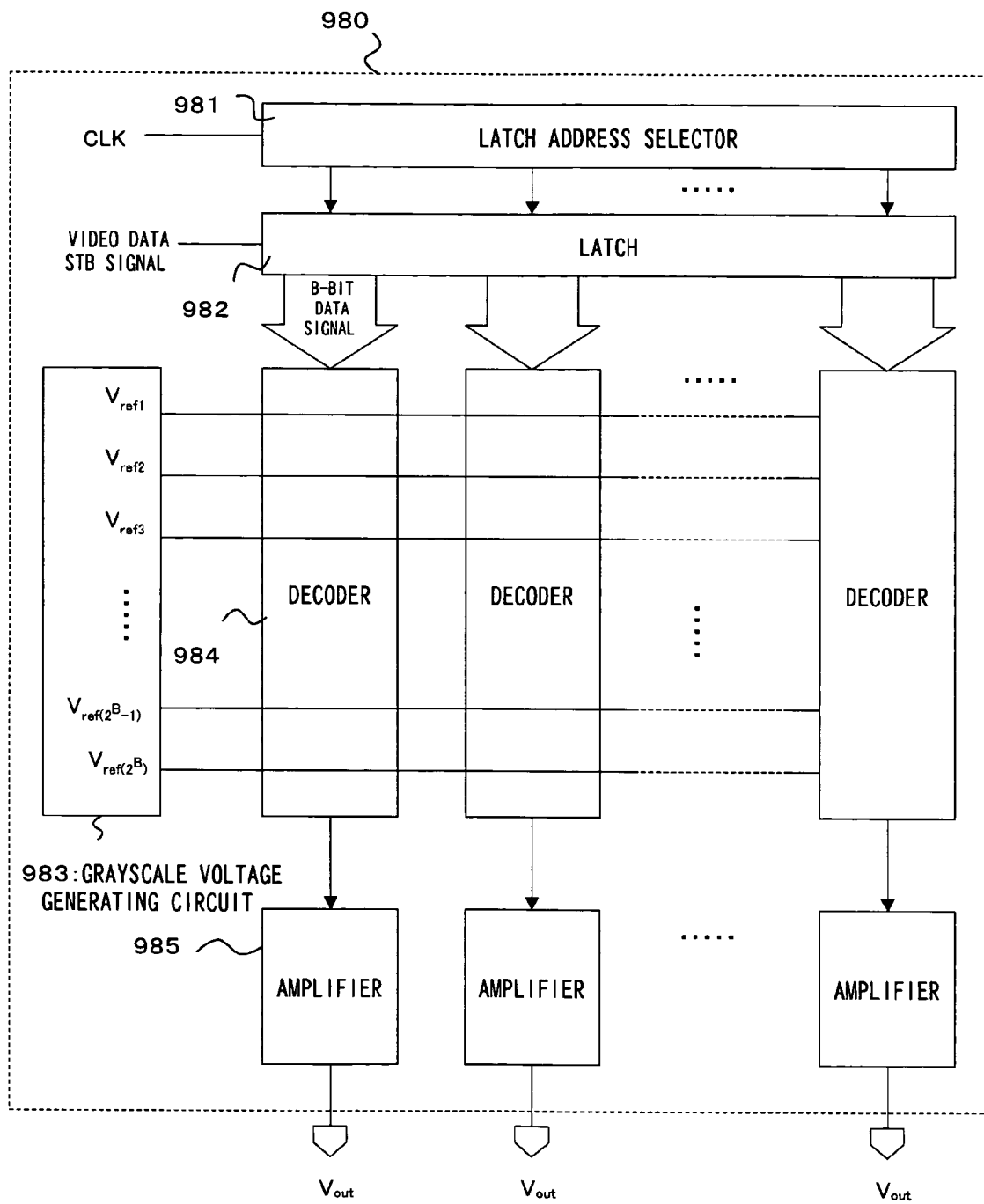
FIG. 38 is a diagram illustrating the configuration of a data driver according to the conventional art.

A fifth embodiment of the present invention will now be described. FIG. 29 illustrates an arrangement in which the present invention has been applied to the data driver of a display device such as a liquid crystal display device. As shown in FIG. 29, a digital-to-analog converter (DAC) 11 is constituted by any of first to fourth embodiments. Circuit blocks such as a latch address selector and latch are similar to those of FIG. 38. The reference voltage (grayscale voltage) generating circuit 14 generates and outputs m reference voltages with respect to $m''$ output levels and is shared by the plurality of DACs 11. If the m reference voltages are set according to Equation (1), then $m''$ output levels of the DACs will be linear.

It should be noted that each DAC 11 of FIG. 29 may be constituted by a plurality of blocks, wherein $m''$ output levels serve as one block. In this case, the reference voltage generating circuit 14 also would be so adapted that m reference voltages are provided in the equivalent number of blocks, and the circuit also would be constructed in accordance with the number of blocks.

Further, in FIG. 29, the decoders 12 and amplifying circuits 13 are such that the power-supply voltages thereof are decided by the voltage (grayscale voltage) generated by the reference voltage generating circuit 14. On the other hand, the power-supply voltage can be set separately for latch address selector 921 and latch 922, and for the purpose of reducing size and conserving power, this can be set to a power-supply voltage lower than the power-supply voltage of the reference (grayscale) voltage generating circuit, decoders and amplifying circuits.

In such case a level shifting circuit would be provided. If such an arrangement is applied to the present invention, the level shifting circuit would preferably be provided between the latch 922 and decoders 12.

Figure 30:
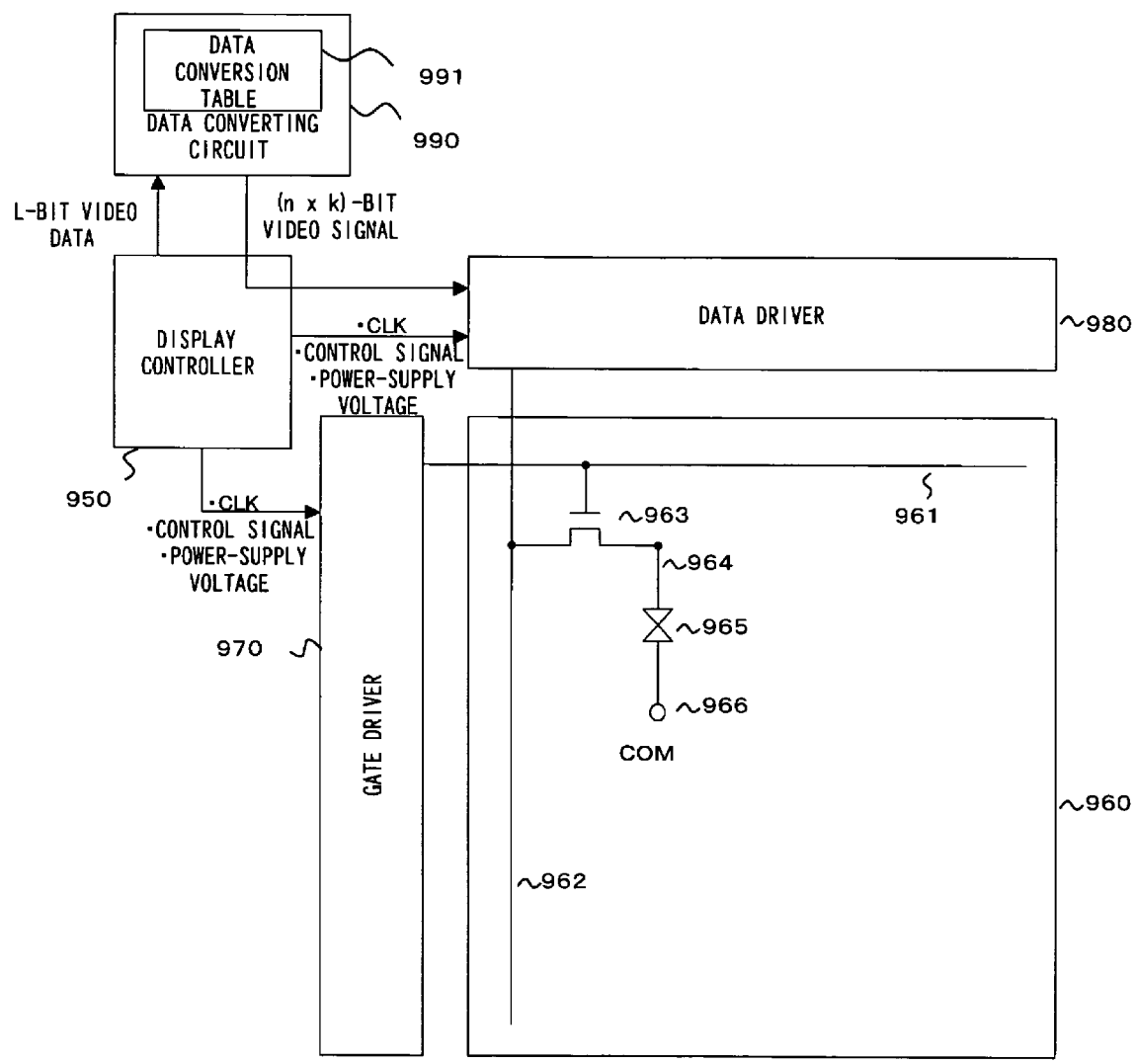
FIG. 30 is a diagram illustrating the structure of an active-matrix liquid crystal display device according to the fifth embodiment.

FIG. 30 illustrates a case where the present invention has been applied to a display device. The data driver 980 in FIG. 30 is the data driver comprising the arrangement of FIG. 29. Here a linear output is obtained in response to an input of data of n×k bits. In a case where a linear-output data driver is used, grayscale voltages that conform to the gamma characteristic of the display device [liquid crystal or organic electroluminescent (EL) element] can be output by assigning grayscale voltages that conform to the display-device gamma characteristic from among a multiplicity of linear output levels. The data driver therefore has a number of linear levels that is greater than the number of display tones. In FIG. 30, the device includes a data conversion table 991 for converting L-bit data that corresponds to display tones to (n×k)-bit data (L<n×k) that corresponds to linear levels, and a data converting circuit 990 for performing a data conversion based upon the data conversion table 991. The data conversion table 991 ideally is one made to conform to the gamma curve of a liquid crystal or to the characteristics of each of R, G, B of liquid crystal or organic EL device, by way of example. It will suffice if the data conversion table 991 and data converting circuit 990 are such that (n×k)-bit data is supplied to the data driver 980, and it is simple to provide these in linkage with the display controller 940, as illustrated in FIG. 30.

By applying the DAC according to this embodiment to any data driver of such a display device, inclusive of systems other than those mentioned, the cost of the display device can be reduced and a reduction in frame width is possible. For example, it goes without saying that a differential amplifier according to the present invention is applicable, in a manner similar to that of a liquid crystal display device, to a display device such as an active-matrix drive organic EL display that presents a display by outputting multiple-level voltage signals to data lines.

The DAC described in the foregoing embodiments comprises MOS transistors. In the drive circuit of a liquid crystal display device, use may be made of MOS transistors (TFTs) comprising polycrystalline silicon. Further, although examples in which the invention is applied to an integrated circuit have been illustrated in the foregoing embodiments, the invention naturally is applicable to discrete elements as well.

Though the present invention has been described in accordance with the foregoing embodiments, the invention is not limited to this embodiment and it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A digital-to-analog converter comprising:
   a reference voltage generating circuit that outputs m (where m is an integer greater than or equal to 4) reference voltages having voltage values which differ from one another;
   a decoder that receives a digital signal and the m reference voltages, and selects and outputs n (where n is an integer greater than or equal to 3) identical or different reference voltages from among the m reference voltages on the basis of the received digital signal; and
   an amplifying circuit that receives the selected n voltages and outputs to an output terminal, a voltage obtained by taking a weighted mean of the received n voltages at a ratio of $2^{n-1}:2^{n-2}: \ldots :2^0$;
   wherein a maximum of $m^m$ voltage levels that differ from one another are allowed to be output to the output terminal in accordance with the received digital signal.

2. The digital-to-analog converter according to claim 1, wherein the m (where m is equal to $2^K$, where K is an integer greater than or equal to 2) reference voltages are set to a $\{1+(2^n-1)\times\Sigma_{j=1}^{K}[\alpha_j\times2^{(j-1)n}]\}^{th}$ level (where $\alpha_1, \alpha_2, \ldots,$ and $\alpha_K$ are 0 or 1) from among equally spaced $m''$ voltage levels.

3. The digital-to-analog converter according to claim 1, wherein said decoder receives the digital signal, of n×k bits (where k is an integer greater than or equal to 2), as an input; and
   the n×k bits of the digital signal are represented by $D_0, D_1, \ldots,$ and $D_{nk-1}$;
   the digital signal is divided into n bit groups of k bits each;
   an ith (where i is an integer which is greater than or equal to 1 and less than or equal to n) bit group comprises a digital signal of k bits $[D_{i-1}, D_{i-1+n}, D_{i-130\ 2n}, \ldots, D_{i-1+(k-1)n}]$; and
   n voltages are selected, for every bit group, from the m reference voltages in accordance with values of the bits of the bit group.

4. The digital-to-analog converter according to claim 1, wherein said decoder receives an (n×k)-bit (where k is an integer greater than or equal to 2) digital signal and the m (where m is equal to $2^k$) reference voltages as inputs and includes:
   n selected-voltage output terminals; and
   n sub-decoders, each of which receives the m reference voltages as inputs and outputs one voltage from among the m reference voltages based upon one bit group of digital signals from among bit groups obtained by dividing the digital signal into n groups of k digital signals each;

outputs of the n sub-decoders being connected to respective ones of said n selected-voltage output terminals;

said decoder selecting, and outputting to said n selected-voltage output terminals, the n (where n is an integer greater than or equal to 3) identical or different voltages from among the m reference voltages based upon the (n×k)-bit digital signal; and said amplifying circuit that receives as inputs the n voltages selected at said n selected-voltage output terminals and outputs, from the output terminal, the voltage obtained by taking the weighted mean of the input n voltages at the ratio of $2^{n-1}:2^{n-2}:\ldots:2^0$.

5. The digital-to-analog converter according to claim 4, wherein said amplifying circuit includes:

a differential amplifying circuit having an output end and an inverting input terminal connected to the output terminal;

a first switch group comprising n switches each having a first end connected to a respective one of said n selected-voltage output terminals;

a second switch group comprising n switches connected between second ends of respective ones of the switches of said first switch group and a non-inverting input terminal of said differential amplifying circuit; and n capacitors connected between respective ones of nodes of said first and second switch groups and a power supply.

6. The digital-to-analog converter according to claim 4, wherein said amplifying circuit includes:

a differential amplifying circuit having a non-inverting input terminal to which a reference voltage is supplied and an output end connected to the output terminal;

a first switch group comprising first to nth switches each having a first end connected to a respective one of said n selected-voltage output terminals;

a second switch group comprising n−1 switches each connected between a second end of an xth switch (where x is an integer which is greater than or equal to 1 and which is less than or equal to n−1) of said first switch group and a second end of an (x+1)th switch of said first switch group;

a switch connected between a second end of an nth switch of said first switch group and the output end of said differential amplifying circuit;

a switch connected between the output end of said differential amplifying circuit and an inverting input terminal of said differential amplifying circuit; and n capacitors connected between second ends of respective ones of the first to nth switches of said first switch group and the inverting input terminal of said differential amplifying circuit.

7. The digital-to-analog converter according to claim 1, wherein said decoder receives an (n×k)-bit (where k is an integer greater than or equal to 2) digital signal and the m (where m is equal to $2^k$) reference voltages as inputs and includes:

and a single selected-voltage output terminal;

a bit-group selecting circuit; and a sub-decoder;

said bit-group selecting circuit successively selecting and outputting a total of n bit groups one group at a time from bit groups obtained by dividing the digital signal into n groups of k bits each;

said sub-decoder receiving the m reference voltages as inputs and outputting one voltage from among the m reference voltages based upon the digital signal of the bit group selected by said bit-group selecting circuit;

the single output of said sub-decoder being connected to the single selected-voltage output terminal;

said decoder selecting, on a time-division basis, the n (n>=3) identical or different voltages from among the m reference voltages based upon the digital signal and successively supplying these voltages to the single selected-voltage output terminal;

said amplifying circuit receiving as inputs the n voltages successively supplied to the single selected-voltage output terminal and outputting, from the output terminal, the voltage obtained by taking the weighted mean of the input n voltages at the ratio of $2^{n-1}:2^{n-2}:\ldots:2^0$.

8. The digital-to-analog converter according to claim 7, wherein said amplifying circuit includes:

a differential amplifying circuit having an output end and an inverting input terminal connected to the output terminal;

a first switch group comprising n switches each having a first end connected to the single selected-voltage output terminal;

a second switch group comprising n switches connected between second ends of respective ones of the n switches of said first switch group and a non-inverting input terminal of said differential amplifying circuit; and n capacitors connected between respective ones of nodes of said first and second switch groups and a power supply.

9. The digital-to-analog converter according to claim 7, wherein said amplifying circuit includes:

a differential amplifying circuit having a non-inverting input terminal to which a reference voltage is supplied and an output end connected to the output terminal;

a first switch group comprising first to nth switches each having a first end connected to the single selected-voltage output terminal;

a second switch group comprising n−1 switches each connected between a second end of an xth switch (where x is an integer which is greater than or equal to 1 and which is less than or equal to n−1) of said first switch group and a second end of an (x+1)th switch of said first switch group;

a switch connected between a second end of an nth switch of said first switch group and the output end of the differential amplifying circuit;

a switch connected between the output end of said differential amplifying circuit and an inverting input terminal of said differential amplifying circuit; and n capacitors connected between second ends of respective ones of the first to nth switches of said first switch group and the inverting input terminal of the differential amplifying circuit.

10. The digital-to-analog converter according to claim 1, wherein said decoder receives an (n×k)-bit (where k is an integer greater than or equal to 2 and n is an integer greater than or equal to 3) digital signal and the m (where m is equal to $2^k$) reference voltages as inputs and includes:

r (where r is an integer which is greater than 1 and less than n) selected-voltage output terminals;

r bit-group selecting circuits; and r sub-decoders;

said bit-group selecting circuits each successively selecting and outputting bit groups one group at a time from (n/r) bit groups among bit groups obtained by dividing the digital signal into n groups of k bits each;

said sub-decoders each receiving the m reference voltages as inputs and outputting one voltage from among the m reference voltages based upon the digital signal of the bit group selected by said bit-group selecting circuit;

r outputs of said sub-decoders being connected to respective ones of said r selected-voltage output terminals;

said decoder selecting, on a time-division basis, the n identical or different voltages from among the m reference voltages based upon the digital signal and successively supplying these voltages to said r selected-voltage output terminals;

said amplifying circuit receiving as inputs the n voltages successively supplied to said r selected-voltage output terminals and outputting, from the output terminal, the voltage obtained by taking the weighted mean of the input n voltages at the ratio of $2^{n-1}:2^{n-2}:\ldots:2^0$.

11. The digital-to-analog converter according to claim 10, wherein said amplifying circuit includes:
 a differential amplifying circuit having an output end and an inverting input terminal connected to the output terminal;
 a first switch group comprising a total of n switches in which first ends of n/r switches each are connected to a respective one of said r selected-voltage output terminals;
 a second switch group comprising a total of n switches connected between second ends of respective ones of said n switches of said first switch group and a non-inverting input terminal of said differential amplifying circuit; and
 n capacitors connected between respective ones of nodes of said first and second switch groups and a power supply.

12. The digital-to-analog converter according to claim 10, wherein said amplifying circuit includes:
 a differential amplifying circuit having a non-inverting input terminal to which a reference voltage is supplied and an output end connected to the output terminal;
 a first switch group comprising a total of n switches in which first ends of n/r switches each are connected to a respective one of said r selected-voltage output terminals;
 a second switch group comprising n−1 switches each connected between a second end of an xth switch (where x is an integer which is greater than or equal to 1 and which is less than or equal to n−1) of said first switch group and a second end of an (x+1)th switch of said first switch group;
 a switch connected between a second end of an nth switch of said first switch group and the output end of said differential amplifying circuit;
 a switch connected between the output end of said differential amplifying circuit and an inverting input terminal of said differential amplifying circuit; and
 n capacitors connected between second ends of respective ones of the first to nth switches of said first switch group and the inverting input terminal of said differential amplifying circuit.

13. The digital-to-analog converter according to claim 4, wherein said sub-decoder receives the m reference voltages and a bit group comprising k digital signals as inputs thereto;
 the k digital signals of the bit group are represented by B0, B1, ..., and B(k−1);
 complementary signals of the k digital signals of the bit group are represented by B0B, B1B, ..., and B(k−1)B;
 SigN(D,p,q) is a function that returns DB (the complementary signal of D) when the remainder of p−1 divided by $2^{(q+1)}$ is less than $2^q$, and returns D otherwise;
 w, y are integers where w is greater than or equal to 1 and less than or equal to m and y is greater than or equal to 0 and less than or equal to k−1;
 with regard to m paths connecting the m reference voltages and a single output terminal of said sub-decoder, a wth reference voltage and the single output terminal are connected via k switches controlled by respective ones of k control signals sigN[B(0),w,0], sigN[B(1),w,1], ..., sigN[B(y),w,y], ..., and sigN[B(k−1),w,k−1]; and
 one of the m reference voltages is selected and output by the k bit digital signals of the bit group.

14. The digital-to-analog converter according to claim 13, wherein said switch includes an NMOS transistor having a gate to which the digital signal is input, and a drain and source one of which forms a input end of said switch and the other of which forms an output end of said switch.

15. The digital-to-analog converter according to claim 4, wherein said sub-decoder receives the m reference voltages and a bit group comprising k digital signals as inputs thereto;
 the k digital signals of the bit group are represented by B0, B1, ..., and B(k−1);
 complementary signals of the digital signals of the bit group are represented by B0B, B1B, ..., and B(k−1)B;
 SigP(D,p,q) is a function that returns D when the remainder of p−1 divided by $2^{(q+1)}$ is less than $2^q$, and returns DB (where DB is the complementary signal of D) otherwise;
 w, y are integers where w is greater than or equal to 1 and less than or equal to m and y is greater than or equal to 0 and less than or equal to k−1;
 with regard to m paths connecting the m reference voltages and a single output terminal of said sub-decoder, a wth reference voltage and the single output terminal are connected via k switches controlled by respective ones of k control signals sigP[B(0),w,0], sigP[B(1),w,1], ..., sigP[B(y),w,y], ..., and sigP[B(k−1),w,k−1]; and
 one of the m reference voltages is selected and output by the k digital signal of the bit group.

16. The digital-to-analog converter according to claim 15, wherein said switch includes a PMOS transistor having a gate to which the digital signal is supplied, and a drain and source one of which forms an input end of said switch and the other of which forms an output end of said switch.

17. The digital-to-analog converter according to claim 4, wherein said sub-decoder receives the m reference voltages and a bit group comprising k digital signals as inputs thereto and includes:
 a single output terminal;
 a switch circuit that selects one of the m reference voltages;
 a switch control circuit that outputs a signal for controlling said switch circuit, which selects one of the m reference voltages, by the k digital signals of the bit group;
 said sub-decoder that selects and outputs one of the m reference voltages by the k-bit digital signal of the bit group.

18. The digital-to-analog converter according to claim 17, wherein said switch control circuit receives the k digital signal of the bit group as an input and includes $2^k$ logic circuits that differ from one another in terms of the logic of input signals applied thereto, each of said logic circuit receiving a digital signal or a complementary signal thereof per bit of the bit group and turning a switch ON only in a case where the input k digital signals are all "1"s or all "0"s.

19. The digital-to-analog converter according to claim 18, wherein the input k digital signals are divided into U sub-bit groups each of which includes two or more digital signals;
 U logic circuits are provided as the logic circuits of said switch control circuit and each receives a respective one of the sub-bit groups as an input and outputs a signal that turns a switch ON only in a case where the input signals of the sub-bit group are all "1"s or all "0"s;

each of the switches in the switch circuit that change over ON/OFF of the connection of the reference voltages to the output is constructed by a group of U switches serially arrayed; and said U switches are ON/OFF-controlled by respective ones of switch control signals that have been output by said U logic circuits.

20. The digital-to-analog converter according to claim 7, wherein said amplifying circuit includes:

a differential amplifying circuit for outputting from the output terminal a voltage obtained by taking the weighted mean of n voltages, which are supplied to respective ones of first to nth input terminals, at a ratio of $2^{1-1}:2^{n-2}:\ldots:2^0$;

first to nth switches having first ends connected in common with the single selected-voltage output terminal and having second ends connected to respective ones of the first to nth input terminals; and first to nth capacitors connected between second ends of respective ones of the first to nth switches and a low-potential power supply.

21. The digital-to-analog converter according to claim 7, wherein said amplifying circuit includes:

a differential amplifying circuit that outputs from the output terminal a voltage obtained by taking the weighted mean of n voltages, which are supplied to respective ones of first to nth input terminals, at a ratio of $2^{n-1}:2^{n-2}:\ldots:2^0$;

first to (n–1)th switches having first ends connected in common with the single selected-voltage output terminal and having second ends connected to respective ones of the first to (n–1)th input terminals; and first to (n–1)th capacitors connected between second ends of respective ones of the first to (n–1)th switches and a low-potential power supply;

the nth terminal of said differential amplifying circuit being connected to said selected-voltage output terminal.

22. The digital-to-analog converter according to claim 10, wherein said amplifying circuit includes:

a differential amplifying circuit that outputs from the output terminal a voltage obtained by taking the weighted mean of n voltages, which are supplied to respective ones of first to nth input terminals, at a ratio of $2^{n-1}:2^{n-2}:\ldots:2^0$;

with regard to each selected-voltage output terminal of said r selected-voltage output terminals, J (where J=n/r holds) switches having first ends connected in common with said selected-voltage output terminal and having second ends connected to corresponding input terminals of said differential amplifying circuit; and capacitors connected between second ends of respective ones of said switches and a low-potential power supply.

23. The digital-to-analog converter according to claim 10, wherein said amplifying circuit includes:

a differential amplifying circuit that outputs from the output terminal a voltage obtained by taking the weighted mean of n voltages, which are supplied to respective ones of first to nth input terminals, at a ratio of $2^{n-1}:2^{n-2}:\ldots:2^0$;

with regard to each selected-voltage output terminal of said r selected-voltage output terminals, J–1 (where J=n/r holds) switches having first ends connected in common with said selected-voltage output terminal and having second ends connected to corresponding input terminals of said differential amplifying circuit; and capacitors connected between second ends of respective ones of said J–1 switches, whose first ends are connected to said selected-voltage output terminal, and a low-potential power supply;

with regard to each selected-voltage output terminal of said r selected-voltage output terminals, no Jth switch is provided and said selected-voltage output terminal is connected directly to a corresponding input terminal of said differential amplifying circuit.

24. The digital-to-analog converter according to claim 20, wherein said amplifying circuit comprises a differential amplifying circuit that includes:

first to nth input terminals;

an output terminal;

first to nth differential pairs;

first to nth current sources which supply said first to nth differential pairs with current, respectively; and a load circuit connected in common with output pairs of said first to nth differential pairs;

in an ith differential pair (where i is an integer which is greater than or equal to 1 and is less than or equal to n), one input pair is connected to an ith input terminal and the other input pair is connected to said output terminal;

one output pairs of said first to nth differential pairs are connected together in common, and the other output pairs of said first to nth differential pairs are connected together in common;

said differential amplifying circuit further including an amplifier stage having an input end that is connected to a node at which the one output pairs of said first to nth differential pairs are connected together in common, and an output end connected to said output terminal;

said load circuit being connected to a node at which the one output pairs of said first to nth differential pairs are connected together in common, and to a node at which the other output pairs of said first to nth differential pairs are connected together in common.

25. The digital-to-analog converter according to claim 24, wherein a ratio of the sizes of transistors of said first to nth differential pairs is set to $2^{n-1}:2^{n-2}:\ldots:2^0$;

a ratio of values of currents that flow into said first to nth current sources is set to $2^{n-1}:2^{n-2}:\ldots:2^0$; and said output terminal of said differential amplifying circuit outputs a voltage obtained by taking the weighted mean of n voltages, which are supplied to said first to nth input terminals of said differential amplifying circuit, at the ratio $2^{n-1}:2^{n-2}:\ldots:2^0$.

26. The digital-to-analog converter according to claim 24, wherein each of said first to nth differential pairs comprises a plurality of transistors all of the same size, and a ratio of numbers of transistor pairs constituting said first to nth differential pairs is set to $2^{n-1}:2^{n-2}:\ldots:2^0$;

a differential pair that, which includes a plurality of transistor pairs, among said first to nth differential pairs includes a plurality of transistors connected in parallel between respective ones of output pairs of said differential pair and a current source corresponding to said differential pair;

a ratio of values of currents that flow into said first to nth current sources is set to $2^{n-1}:2^{n-2}:\ldots:2^0$; and said output terminal of said differential amplifying circuit outputs a voltage obtained by taking the weighted mean of n voltages, which are supplied to said first to nth input terminals of said differential amplifying circuit, at the ratio $2^{n-1}:2^{n-2}:\ldots:2^2$.

27. The digital-to-analog converter according to claim 19, wherein with regard to a plurality of logic circuits for which input sub-bit groups, inclusive of logic, are identical within the same sub-decoder, the logic circuits are eliminated with the exception of at least one; and switches connected to the outputs of said eliminated logic circuits are connected to the output of a logic circuit that is not eliminated.

28. The digital-to-analog converter according to claim 17, wherein at least one logic circuit included in said switch control circuit is a NAND gate, which receives a plurality of digital signals of an input bit group or sub-bit group, and which outputs the switch control signal; and at least one of said switches included in said switch circuit is a PMOS switch having a gate to which the switch control signal is connected, and a source and drain one of which is connected to a terminal to which the reference voltage is supplied or to a switch connected in series with said switch, and the other of which is connected to one terminal among said n output terminals or to a switch connected in series with said switch; or a CMOS switch comprising:

a PMOS transistor having a gate to which the switch control signal is connected, and having a source and drain one of which is connected to a terminal to which the reference voltage is supplied or to a switch connected in series with said switch, and the other of which is connected to one terminal among said n output terminals or to a switch connected in series with said switch, and an NMOS transistor having a gate to which a complementary signal of the switch control signal is connected, and having one of a source and drain one of which is connected to a terminal to which the reference voltage is supplied or to a switch connected in series with said switch, and the other of which is connected to one terminal among said n output terminals or to a switch connected in series with said switch.

29. The digital-to-analog converter according to claim 17, wherein at least one logic circuit included in said switch control circuit is a NOR gate, which receives a plurality of digital signals of an input bit group or sub-bit group, and which outputs the switch control signal; and at least one of said switches included in said switch circuit is a PMOS switch having a gate to which the switch control signal is connected, and a source and drain one of which is connected to a terminal to which the reference voltage is supplied or to a switch connected in series with said switch, and the other of which is connected to one terminal among said n output terminals or to a switch connected in series with said switch; or a CMOS switch comprising:

a PMOS transistor having a gate to which the switch control signal is connected, and a source and drain one of which is connected to a terminal to which the reference voltage is supplied or to a switch connected in series with said switch, and the other of which is connected to one terminal among said n output terminals or to a switch connected in series with said switch, and an NMOS transistor having a gate to which a complementary signal of the switch control signal is connected, and a source and drain one of which is connected to a terminal to which the reference voltage is supplied or to a switch connected in series with said switch, and the other of which is connected to one terminal among said n output terminals or to a switch connected in series with said switch.

30. A data driver for a display device, said data driver comprising:

a grayscale voltage generating circuit that generates a plurality of voltage levels;

a decoder circuit that outputs at least two voltages, which have been selected from said plurality of voltage levels, based upon video data;

an amplifying circuit, which receives as inputs the voltages output from said decoder circuit, and outputs to an output terminal a voltage corresponding to the video data; and the digital-to-analog converter set forth in claim 1;

said decoder comprising said decoder of said digital-to-analog converter and receiving the plurality of voltage levels from said grayscale voltage generating circuit as the plurality of reference voltages and receiving the video data as the selecting signal; and said amplifying circuit, which outputs the voltage corresponding to the video data from the output terminal, comprising the amplifying circuit of said digital-to-analog converter.

31. A display device comprising:

a plurality of data lines extending in parallel with one another along a first direction;

a plurality of scan lines extending in parallel with one another in a direction perpendicular to the first direction;

a plurality of pixel electrodes arranged in matrix form at intersections of said plurality of data lines and said plurality of scan lines;

a plurality of transistors corresponding to respective ones of said plurality of pixel electrodes, each transistor having a drain and a source one of which is connected to the corresponding pixel electrode and the other of which is connected to a corresponding data line, and a gate connected to a corresponding scan line;

a gate driver for supplying scan signals to respective ones of said plurality of scan lines; and a data driver for supplying grayscale signals, which correspond to input data, to respective ones of said plurality of data lines;

said data driver comprising the data driver for said display device set forth in claim 30.

32. The display device according to claim 31, further comprising:

a data conversion table for making Z-bit video data correspond to m-bit (where Z is less than m) video data for each of colors R, G and B; and a data converting circuit, to which the Z-bit video data is input, for converting the Z-bit video data to the m-bit video data by referring to said data conversion table, and outputting the m-bit video data to said data driver.

33. A digital-to-analog converter comprising:

a decoder, which receives m (where m is an integer greater than or equal to 4) reference voltages having voltage values that differ from one another and an input digital signal, and selects and outputs n (where n is an integer greater than or equal to 3) identical or different voltages from among the input m reference voltages based upon the digital signal; and an amplifying circuit, which receives the selected n reference voltages, and outputs a voltage, obtained as a result of taking the weighted mean of the input n voltages at a prescribed weighting, from an output terminal.

34. The digital-to-analog converter according to claim 33, wherein said amplifying circuit outputs from the output terminal a voltage obtained by taking the weighted mean of the input n voltages at a weighing proportional to n powers of 2 that differ from one another.

35. The digital-to-analog converter according to claim 34, wherein m of the m reference voltages that are supplied to said converter is made $2^K$ (where K is an integer greater than or equal to 2); and the reference voltages are set to a $\{1+(2^n-1)\times\Sigma_{j=1}^{K}[\alpha_j\times 2^{(j-1)n}]\}$th level (where $\alpha_1, \alpha_2, \ldots,$ and $\alpha_K$ are 0 or 1) from among equally spaced first to $(m^n)$th voltage levels.

36. The digital-to-analog converter according to claim 33, wherein said decoder outputs n of the selected n voltages in parallel or outputs the selected n voltages one or a plurality at a time sequentially.

* * * * *